US008560128B2

(12) United States Patent
Ruff et al.

(10) Patent No.: US 8,560,128 B2
(45) Date of Patent: Oct. 15, 2013

(54) ADJUSTING PROXIMITY THRESHOLDS FOR ACTIVATING A DEVICE USER INTERFACE

(71) Applicant: Nest Labs, Inc., Palo Alto, CA (US)

(72) Inventors: Joseph Adam Ruff, San Jose, CA (US); Jonathan P. Solnit, San Jose, CA (US); Edwin H. Satterthwaite, Palo Alto, CA (US)

(73) Assignee: Nest Labs, Inc., Palo Alto, CA (US)

( * ) Notice: Subject to any disclaimer, the term of this patent is extended or adjusted under 35 U.S.C. 154(b) by 0 days.

(21) Appl. No.: 13/632,112

(22) Filed: Sep. 30, 2012

(65) Prior Publication Data

US 2013/0103207 A1    Apr. 25, 2013
US 2013/0226354 A9    Aug. 29, 2013

Related U.S. Application Data

(63) Continuation-in-part of application No. 13/267,877, filed on Oct. 6, 2011.

(60) Provisional application No. 61/627,996, filed on Oct. 21, 2011, provisional application No. 61/415,771, filed on Nov. 19, 2010, provisional application No. 61/429,093, filed on Dec. 31, 2010.

(51) Int. Cl.
*G05D 23/00* (2006.01)
(52) U.S. Cl.
USPC .................... 700/278; 340/539.23; 340/686.6
(58) Field of Classification Search
USPC ........... 700/276, 277, 278; 340/539.23, 686.6
See application file for complete search history.

(56) References Cited

U.S. PATENT DOCUMENTS 4,316,577 A    2/1982    Adams et al.
4,751,961 A    6/1988    Levine et al.
(Continued)

FOREIGN PATENT DOCUMENTS

DE    19609390 A1    9/1997
EP    0434926 A2    7/1991
(Continued)

OTHER PUBLICATIONS

Author Unknown, "Ambient Energy Joule," Ambient Devices, Date Unknown, 2 pages. Accessed at: http://ambientdevices.com/products/energyjoule.html.

(Continued)

*Primary Examiner* — Ryan Jarrett
(74) *Attorney, Agent, or Firm* — Kilpatrick Townsend & Stockton LLP

(57) ABSTRACT

A thermostat includes a user interface that is configured to operate in at least two different modes including a first mode and a second mode. The user interface may require more power when operating in the first mode than in the second mode. The thermostat also includes a plurality of sensors, including at least one sensor configured to detect a presence of a user within a proximity of the thermostat. The thermostat additionally includes a first processing function that is configured to determine a proximity profile and to cause the user interface to be in the first mode one or more sensors provides responses that match the proximity profile. The proximity profile may be computed using a history of responses from the sensors that are likely to coincide with times where users intend to view the user interface.

20 Claims, 31 Drawing Sheets

(56) References Cited

U.S. PATENT DOCUMENTS

| | | |
|---|---|---|
| 4,768,706 A | 9/1988 | Parfitt |
| 5,005,365 A | 4/1991 | Lynch |
| 5,224,648 A | 7/1993 | Simon et al. |
| 5,294,047 A | 3/1994 | Schwer et al. |
| 5,395,042 A | 3/1995 | Riley et al. |
| 5,482,209 A | 1/1996 | Cochran et al. |
| 5,485,954 A | 1/1996 | Guy et al. |
| 5,555,927 A | 9/1996 | Shah |
| 5,603,451 A | 2/1997 | Helander et al. |
| 5,627,531 A | 5/1997 | Posso et al. |
| 5,673,850 A | 10/1997 | Uptegraph |
| 5,808,602 A | 9/1998 | Sellers |
| 5,931,378 A | 8/1999 | Schramm |
| 6,032,867 A | 3/2000 | Dushane et al. |
| 6,164,374 A | 12/2000 | Rhodes et al. |
| 6,206,295 B1 | 3/2001 | LaCoste |
| 6,213,404 B1 | 4/2001 | Dushane et al. |
| 6,286,764 B1 | 9/2001 | Garvey et al. |
| 6,298,285 B1 | 10/2001 | Addink et al. |
| 6,453,687 B2 | 9/2002 | Sharood et al. |
| 6,502,758 B2 | 1/2003 | Cottrell |
| 6,519,509 B1 | 2/2003 | Nierlich et al. |
| D471,825 S | 3/2003 | Peabody |
| 6,619,055 B1 | 9/2003 | Addy |
| 6,644,557 B1 | 11/2003 | Jacobs |
| 6,798,341 B1 | 9/2004 | Eckel et al. |
| 6,851,621 B1 | 2/2005 | Wacker et al. |
| D503,631 S | 4/2005 | Peabody |
| 6,891,838 B1 | 5/2005 | Petite et al. |
| 6,909,921 B1 | 6/2005 | Bilger |
| 6,951,306 B2 | 10/2005 | DeLuca |
| 7,000,849 B2 | 2/2006 | Ashworth et al. |
| 7,055,759 B2 | 6/2006 | Wacker et al. |
| 7,083,109 B2 | 8/2006 | Pouchak |
| 7,114,554 B2 | 10/2006 | Bergman et al. |
| 7,135,965 B2 | 11/2006 | Chapman, Jr. et al. |
| 7,141,748 B2 | 11/2006 | Tanaka et al. |
| 7,159,790 B2 | 1/2007 | Schwendinger et al. |
| 7,258,280 B2 | 8/2007 | Wolfson |
| 7,264,175 B2 | 9/2007 | Schwendinger et al. |
| 7,287,709 B2 | 10/2007 | Proffitt et al. |
| 7,299,996 B2 | 11/2007 | Garrett et al. |
| 7,333,880 B2 | 2/2008 | Brewster et al. |
| D566,587 S | 4/2008 | Rosen |
| 7,434,742 B2 | 10/2008 | Mueller et al. |
| 7,451,937 B2 | 11/2008 | Flood et al. |
| 7,455,240 B2 | 11/2008 | Chapman, Jr. et al. |
| 7,460,690 B2 | 12/2008 | Cohen et al. |
| 7,469,550 B2 | 12/2008 | Chapman, Jr. et al. |
| 7,509,753 B2 | 3/2009 | Nicosia et al. |
| 7,555,364 B2 | 6/2009 | Poth et al. |
| 7,558,648 B2 | 7/2009 | Hoglund et al. |
| 7,571,865 B2 | 8/2009 | Nicodem et al. |
| 7,600,694 B2 | 10/2009 | Helt et al. |
| D603,277 S | 11/2009 | Clausen |
| 7,624,931 B2 | 12/2009 | Chapman, Jr. et al. |
| 7,634,504 B2 | 12/2009 | Amundson |
| 7,641,126 B2 | 1/2010 | Schultz et al. |
| 7,693,582 B2 | 4/2010 | Bergman et al. |
| 7,703,694 B2 | 4/2010 | Mueller et al. |
| D614,976 S | 5/2010 | Skafdrup et al. |
| 7,837,958 B2 | 11/2010 | Crapser et al. |
| 7,845,576 B2 | 12/2010 | Siddaramanna et al. |
| 7,904,209 B2 | 3/2011 | Podgorny et al. |
| 7,904,830 B2 | 3/2011 | Hoglund et al. |
| D651,529 S | 1/2012 | Mongell et al. |
| 8,280,536 B1 | 10/2012 | Fadell et al. |
| 2002/0005435 A1 | 1/2002 | Cottrell |
| 2003/0231001 A1 | 12/2003 | Bruning |
| 2004/0034484 A1 | 2/2004 | Solomita, Jr. et al. |
| 2004/0256472 A1 | 12/2004 | DeLuca |
| 2005/0043907 A1 | 2/2005 | Eckel et al. |
| 2005/0119793 A1 | 6/2005 | Amundson et al. |
| 2005/0125083 A1 | 6/2005 | Kiko |
| 2005/0194456 A1 | 9/2005 | Tessier et al. |
| 2005/0204997 A1 | 9/2005 | Fournier |
| 2005/0246408 A1 | 11/2005 | Chung |
| 2005/0270151 A1 | 12/2005 | Winick |
| 2006/0208099 A1 | 9/2006 | Chapman, Jr. et al. |
| 2007/0038787 A1 | 2/2007 | Harris et al. |
| 2007/0045430 A1 | 3/2007 | Chapman, Jr. et al. |
| 2007/0045433 A1 | 3/2007 | Chapman, Jr. et al. |
| 2007/0045444 A1 | 3/2007 | Gray et al. |
| 2007/0050732 A1 | 3/2007 | Chapman, Jr. et al. |
| 2007/0114295 A1 | 5/2007 | Jenkins |
| 2007/0158442 A1 | 7/2007 | Chapman, Jr. et al. |
| 2007/0173978 A1 | 7/2007 | Fein et al. |
| 2007/0225867 A1 | 9/2007 | Moorer et al. |
| 2007/0227721 A1 | 10/2007 | Springer et al. |
| 2007/0228183 A1 | 10/2007 | Kennedy et al. |
| 2007/0241203 A1 | 10/2007 | Wagner et al. |
| 2007/0257120 A1 | 11/2007 | Chapman, Jr. et al. |
| 2008/0015740 A1 | 1/2008 | Osann, Jr. |
| 2008/0054082 A1 | 3/2008 | Evans et al. |
| 2008/0099568 A1 | 5/2008 | Nicodem et al. |
| 2008/0245480 A1 | 10/2008 | Knight et al. |
| 2008/0290183 A1 | 11/2008 | Laberge et al. |
| 2009/0001180 A1 | 1/2009 | Siddaramanna et al. |
| 2009/0140056 A1 | 6/2009 | Leen |
| 2009/0140061 A1 | 6/2009 | Schultz et al. |
| 2009/0143916 A1 | 6/2009 | Boll et al. |
| 2009/0194601 A1 | 8/2009 | Flohr |
| 2009/0283603 A1 | 11/2009 | Peterson et al. |
| 2010/0084482 A1 | 4/2010 | Kennedy et al. |
| 2010/0156608 A1 | 6/2010 | Bae et al. |
| 2010/0167783 A1* | 7/2010 | Alameh et al. ............. 455/556.1 |
| 2010/0168924 A1 | 7/2010 | Tessier et al. |
| 2010/0198425 A1 | 8/2010 | Donovan |
| 2010/0301834 A1 | 12/2010 | Chemel et al. |
| 2010/0318227 A1 | 12/2010 | Steinberg et al. |
| 2011/0001812 A1 | 1/2011 | Kang et al. |
| 2011/0015798 A1 | 1/2011 | Golden et al. |
| 2011/0015802 A1 | 1/2011 | Imes |
| 2012/0179300 A1* | 7/2012 | Warren et al. ................. 700/278 |

FOREIGN PATENT DOCUMENTS

| | | |
|---|---|---|
| EP | 0720077 A2 | 7/1996 |
| EP | 0802471 A2 | 10/1997 |
| EP | 1065079 A2 | 1/2001 |
| EP | 1731984 A1 | 12/2006 |
| EP | 2157492 A2 | 2/2010 |
| GB | 2212317 A | 7/1989 |
| JP | 59-106311 A | 6/1984 |
| JP | 09-298780 A | 11/1997 |
| JP | 2002-87050 A | 3/2002 |
| JP | 2003-54290 A | 2/2003 |
| NL | 1024986 C2 | 6/2005 |
| WO | 2011/128416 A2 | 10/2001 |
| WO | 02/48851 A2 | 6/2002 |
| WO | 2008/054938 A2 | 5/2008 |
| WO | 2009/073496 A2 | 6/2009 |

OTHER PUBLICATIONS

Author Unknown, "CT2700 An Electronic Round Programmable Thermostat," User's Guide, Honeywell, Inc., 1997, 8 pages.

Author Unknown, "The Clever Thermostat, ICY 3815 Timer Thermostat," User Manual and Installation Guide, I.C.Y.B.V., 2009, 36 pages.

Author Unknown, "The Clever Thermostat," ICY BV, 2012, 1 page. Accessed at: http://www.icy.nl/en/consumer/products/clever-thermostat.

Author Unknown, "ICY 3815 Timer Thermostaat," Package Box, ICY BV, 2009, 2 pages.

Author Unknown, "CT8775A, C The Digital Round Non-Programmable Thermostats," Owner's Guide, Honeywell, Inc., 2003, 20 pages.

Author Unknown, "Honeywell's Latest Innovation . . . The Digital Round Thermostat, T8775 Digital Round Thermostat," Honeywell, Inc., 2003, 2 pages.

(56) References Cited

OTHER PUBLICATIONS

Author Unknown, "Honeywell T8775A,C The Digital Round Non-Programmable Thermostats," Owner's Guide, Honeywell International, Inc., 2004, 16 pages.
Author Unknown, "Introducing the new Smart Si thermostat," Ecobee, Date Unknown, 4 pages.
Author Unknown, "Salus S-Series Digital Thermostat, Model No. ST620," Salus Controls Plc, 2010, 24 pages.
Author Unknown, "T8700C An Electronic Round Programmable Thermostat," Owner's Guide, Honeywell, Inc., 1997, 12 pages.
Arens, E., et al. "Demand Response Electrical Appliance Manager," University of California Berkeley, Date Unknown, 1 page.
Arens, E., et al., "Demand Response Enabled Thermostat," University of California Berkeley, Date Unknown, 1 page.
Arens, E., et al., "Demand Response Enabling Technology Development," Phase I Report, University of California Berkeley, Apr. 4, 2006, 108 pages.
Arens, E., et al., "New Thermostat Demand Response Enabling Technology," University of California Berkeley, Jun. 10 2004, 1 page.
Auslander, D., et al., "UC Berkeley DR Research Energy Management Group," California Energy Commission, Jun. 11, 2007, 35 pages.
Bourke, T., "Server Load Balancing," O'Reilly & Associates, Inc., 2001, 182 pages.
Chen, X., et al., "Demand Response-Enabled Residential Thermostat Controls," University of California Berkeley, 2008, 13 pages.
Green, L., "PM's Thermostat Guide Thermo Heat Tech Cool," Popular Mechanics, Oct. 1985, 4 pages.
Meier, A., et al., "Thermostat Interface and Usability: A Survey," Ernest Orlando Lawrence Berkeley National Laboratory, Sep. 2010, 73 pages.
Peffer, T., et al., "A Tale of Two Houses: The Human Dimension of Demand Response Enabling Technology from a Case Study of an Adaptive Wireless Thermostat," University of California Berkeley, 2008, 12 pages.
Peffer, T., et al., "Smart Comfort At Home: Design of a residential thermostat to achieve thermal comfort, and save money and peak energy," University of California Berkeley, Mar. 2007, 1 page.
Sanford, G., "iPod (Click Wheel) (2004)," Apple History, 2012, 2 pages. Accessed at: http://apple-history.com/ipod . . . .
U.S. Appl. No. 60/512,886, "Rotary Knob for a Motor Vehicle," Filed Oct. 20, 2003, 52 pages.
White, E., et al., "A Conceptual Model for Simulation Load Balancing," Proc. 1998 Spring Simulation Interoperability Workshop, 1998, 7 pages.
Wright, P., et al., "DR ETD—Summary of New Thermostat, TempNode, & New Meter," University of California Berkeley, Undated, 49 pages.
International Search Report and Written Opinion mailed Dec. 11, 2012 in Application No. PCT/US12/58210, 15 pages.

* cited by examiner

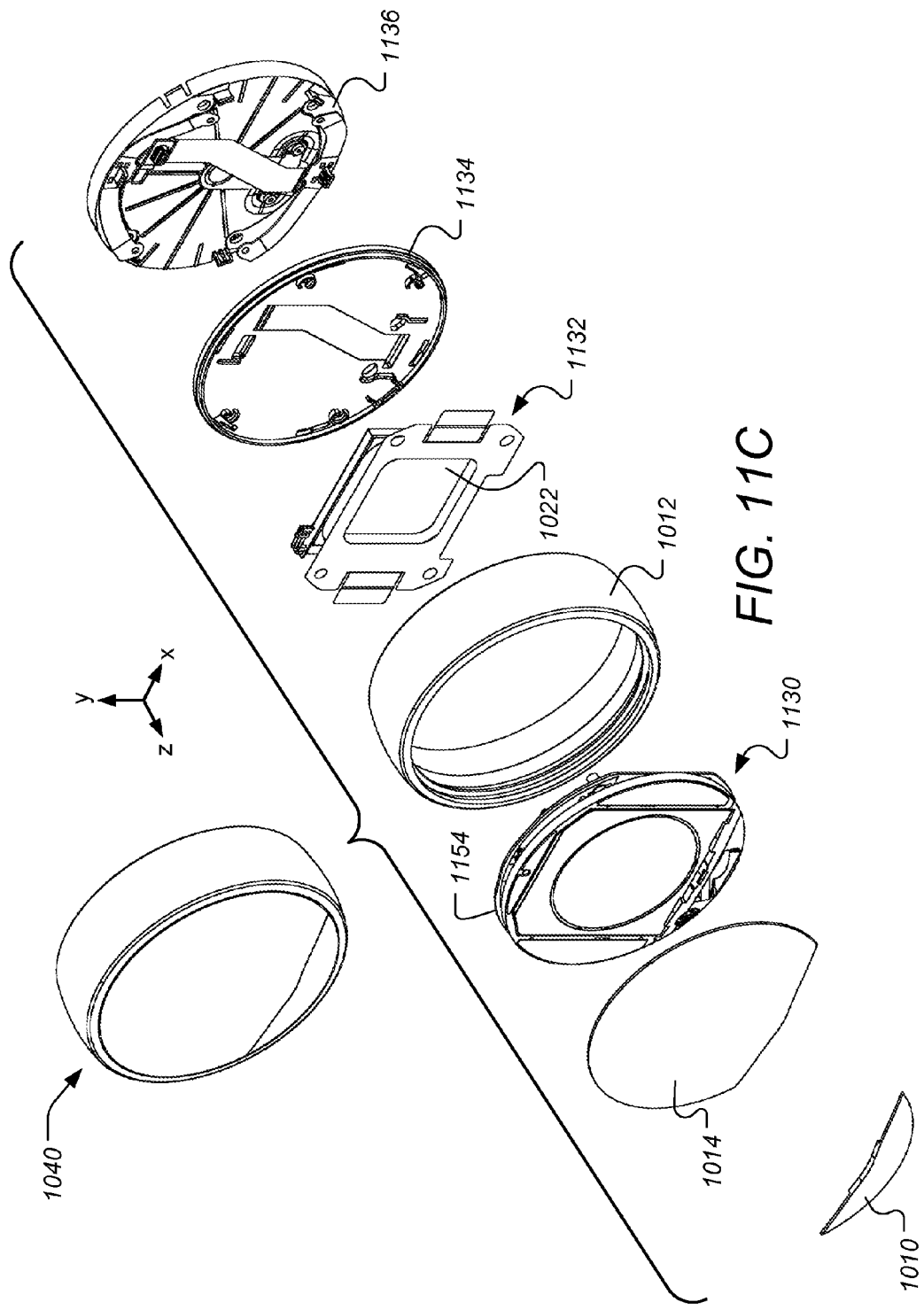

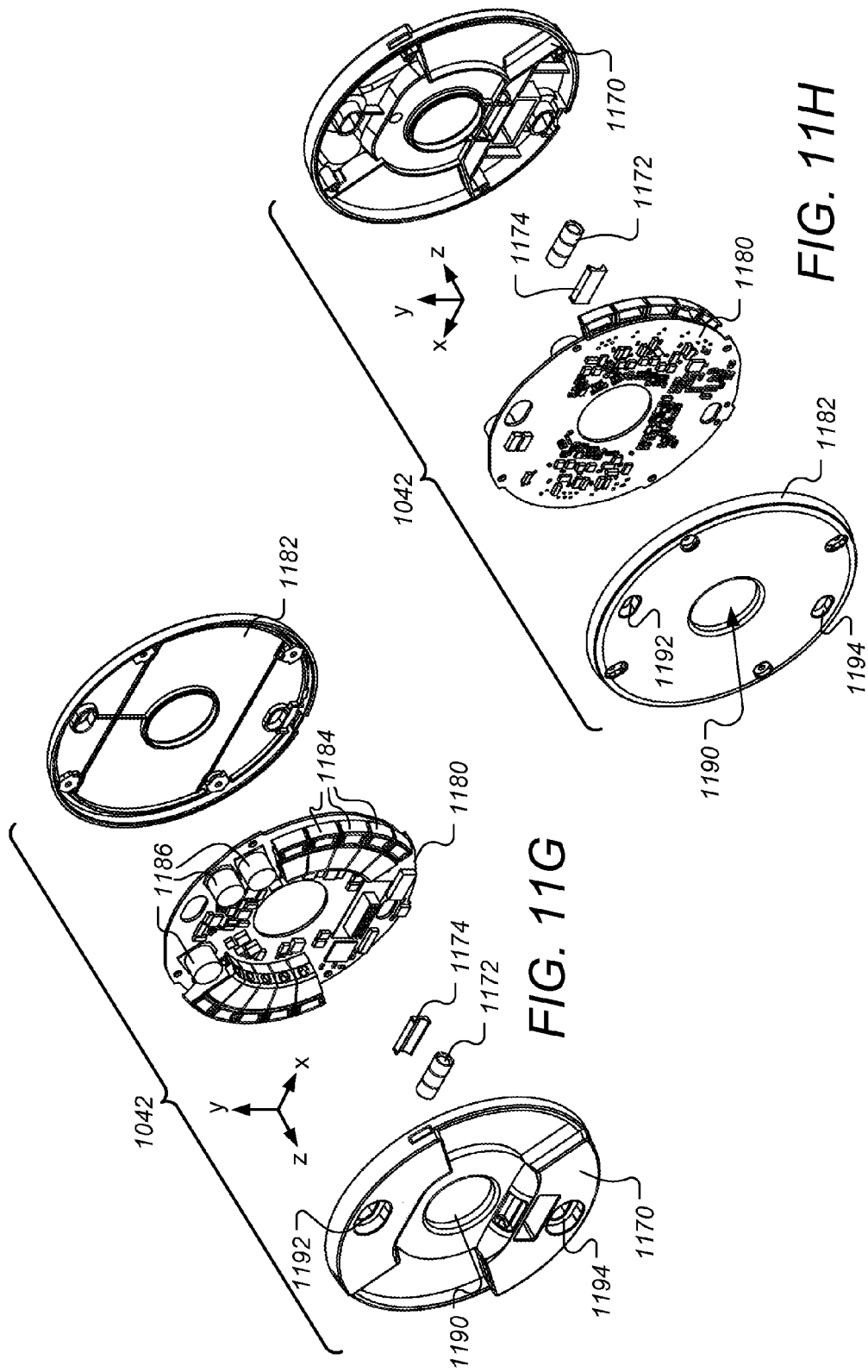

ADJUSTING PROXIMITY THRESHOLDS FOR ACTIVATING A DEVICE USER INTERFACE

CROSS-REFERENCES TO RELATED APPLICATIONS

This application claims the benefit of U.S. Provisional Application No. 61/627,996 filed Oct. 21, 2011, which is incorporated herein by reference in its entirety for all purposes. This application is also a continuation-in-part of U.S. patent application Ser. No. 13/267,877, filed on Oct. 6, 2011, entitled "Strategic Reduction in Power Usage in Multi-Sensing, Wirelessly Communicating Learning Thermostat," which claims the benefit of U.S. Prov. Ser. No. 61/415,771 filed Nov. 19, 2010; and of U.S. Prov. Ser. No. 61/429,093 filed Dec. 31, 2010, each of which is incorporated by reference herein in their entirety for all purposes.

TECHNICAL FIELD

This patent specification relates to systems and methods for the monitoring and control of energy-consuming systems or other resource-consuming systems. More particularly, this patent specification relates to control units that govern the operation of energy-consuming systems, household devices, or other resource-consuming systems, including methods for activating electronic displays for thermostats that govern the operation of heating, ventilation, and air conditioning (HVAC) systems.

BACKGROUND OF THE INVENTION

Substantial effort and attention continue toward the development of newer and more sustainable energy supplies. The conservation of energy by increased energy efficiency remains crucial to the world's energy future. According to an October 2010 report from the U.S. Department of Energy, heating and cooling account for 56% of the energy use in a typical U.S. home, making it the largest energy expense for most homes. Along with improvements in the physical plant associated with home heating and cooling (e.g., improved insulation, higher efficiency furnaces), substantial increases in energy efficiency can be achieved by better control and regulation of home heating and cooling equipment.

As discussed in the technical publication No. 50-8433, entitled "Power Stealing Thermostats" from Honeywell (1997), early thermostats used a bimetallic strip to sense temperature and respond to temperature changes in the room. The movement of the bimetallic strip was used to directly open and close an electrical circuit. Power was delivered to an electromechanical actuator, usually relay or contactor in the HVAC equipment whenever the contact was closed to provide heating and/or cooling to the controlled space. Since these thermostats did not require electrical power to operate, the wiring connections were very simple. Only one wire connected to the transformer and another wire connected to the load. Typically, a 24 VAC power supply transformer, the thermostat, and 24 VAC HVAC equipment relay were all connected in a loop with each device having only two required external connections.

When electronics began to be used in thermostats, the fact that the thermostat was not directly wired to both sides of the transformer for its power source created a problem. This meant that the thermostat had to be hardwired directly from the system transformer. Direct hardwiring a common "C" wire from the transformer to the electronic thermostat may be very difficult and costly.

Because many households do not have a direct wire from the system transformer (such as a "C" wire), some thermostats have been designed to derive power from the transformer through the equipment load. The methods for powering an electronic thermostat from the transformer with a single direct wire connection to the transformer are called "power stealing" or "power sharing" methods. The thermostat "steals," "shares," or "harvests" its power during the "OFF" periods of the heating or cooling system by allowing a small amount of current to flow through it into the load coil below the load coil's response threshold (even at maximum transformer output voltage). During the "ON" periods of the heating or cooling system the thermostat draws power by allowing a small voltage drop across itself. Ideally, the voltage drop will not cause the load coil to dropout below its response threshold (even at minimum transformer output voltage). Examples of thermostats with power stealing capability include the Honeywell T8600, Honeywell T8400C, and the Emerson Model 1F97-0671. However, these systems do not have power storage means and therefore must always rely on power stealing.

Additionally, microprocessor controlled "intelligent" thermostats may have more advanced environmental control capabilities that can save energy while also keeping occupants comfortable. To do this, these thermostats require more information from the occupants as well as the environments where the thermostats are located. These thermostats may also be capable of connection to computer networks, including both local area networks (or other "private" networks) and wide area networks such as the Internet (or other "public" networks), in order to obtain current and forecasted outside weather data, cooperate in so-called demand-response programs (e.g., automatic conformance with power alerts that may be issued by utility companies during periods of extreme weather), enable users to have remote access and/or control thereof through their network-connected device (e.g., smartphone, tablet computer, PC-based web browser), and other advanced functionalities that may require network connectivity.

Issues arise in relation to providing microprocessor-controlled thermostats using high-powered user interfaces, one or more such issues being at least partially resolved by one or more of the embodiments described herein below. On the one hand, it is desirable to provide a thermostat having advanced functionalities such as those associated with relatively powerful microprocessors and reliable wireless communications chips, while also providing a thermostat that has an attractive, visually pleasing electronic display that users will find appealing to view and interact with. On the other hand, it is desirable to provide a thermostat that is compatible and adaptable for installation in a wide variety of homes, including a substantial percentage of homes that are not equipped with the "C" wire discussed above. It is still further desirable to provide such a thermostat that accommodates easy do-it-yourself installation such that the expense and inconvenience of arranging for an HVAC technician to visit the premises to install the thermostat can be avoided for a large number of users. It is still further desirable to provide a thermostat having such processing power, wireless communications capabilities, visually pleasing display qualities, and other advanced functionalities, while also being a thermostat that, in addition to not requiring a "C" wire, likewise does not need to be plugged into a household line current or a so-called "power brick," which can be inconvenient for the particular location of the thermostat as well as unsightly. Therefore, improvements are needed in the art.

SUMMARY

In one embodiment, a thermostat is provided. The thermostat may include a housing. The thermostat may also include a user interface including an electronic display having an active display mode and an inactive display mode, the active display mode generally requiring substantially more electrical power than the inactive display mode. The thermostat may additionally include a processing system disposed within the housing and coupled to the user interface. The processing system may be configured to be in operative communication with one or more temperature sensors for determining an ambient air temperature. The processing system may also be in operative communication with one or more input devices, including the user interface for determining a setpoint temperature. The processing system may be in still further operative communication with a heating, ventilation, and air conditioning (HVAC) system to control the HVAC system based at least in part on a comparison of the measured ambient temperature and the setpoint temperature value. The thermostat may further include at least one sensor configured to detect a physical closeness of a user to the user interface of the thermostat. The at least one sensor may be in operative communication with the processing system, and the processing system may be configured to cause the user interface to be in the active display mode when a closeness threshold has been exceeded. The processing system can be further configured to automatically adjust the closeness threshold based at least in part on a historical plurality of physical closeness events as detected by the at least one sensor.

In another embodiment, a method for optimizing the operation of a user interface of a thermostat is presented. The method may include determining automatically, by a processing system, a closeness threshold based at least in part on a historical plurality of physical closeness events as detected by at least one sensor. The at least one sensor may be configured to detect a physical closeness of a user to a user interface of the thermostat, and the at least one sensor may be in operative communication with the processing system. The method may also include detecting a physical closeness of a user to a user interface of the thermostat using the at least one sensor. The method may additionally include determining, by the processing system, that the closeness threshold has been exceeded. The processing system may be configured to be in operative communication with one or more temperature sensors for determining an ambient air temperature, and configured to be in operative communication with one or more input devices, including the user interface, for determining a setpoint temperature, and in still further operative communication with a heating, ventilation, and air conditioning (HVAC) system to control the HVAC system based at least in part on a comparison of the measured ambient temperature and the setpoint temperature value. The method may further include causing, by the processing system, the user interface to be in an active display mode when the closeness threshold has been exceeded. The user interface may include an electronic display having the active display mode and an inactive display mode, where the active display mode generally requires substantially more electrical power than said inactive display mode.

In yet another embodiment, another thermostat is presented. The thermostat may include a user interface that is configured to operate in at least two different modes including a first mode and a second mode, where the user interface requires more power when operating in the first mode than in the second mode. The thermostat may also include a plurality of sensors, including at least one sensor configured to detect a presence of a user within a proximity of the thermostat. The thermostat may additionally include a first processing function that is configured to determine a proximity profile and to cause the user interface to transition from the second mode to the first mode when one or more of the plurality of sensors provides one or more responses to the first processing function that matches the proximity profile. The proximity profile may be computed using at least a history of responses from the plurality of sensors that are likely to coincide with times where one or more users intend to view the user interface.

A further understanding of the nature and advantages of the present invention may be realized by reference to the remaining portions of the specification and the drawings. Also note that other embodiments may be described in the following disclosure and claims.

BRIEF DESCRIPTION OF THE DRAWINGS

FIGS. 11C-11D illustrate exploded front and rear perspective views, respectively, of the head unit with respect to its primary components, according to some embodiments.

FIGS. 11G-11H illustrate exploded front and rear perspective views, respectively, of the back plate unit with respect to its primary components, according to some embodiments.

DETAILED DESCRIPTION OF THE INVENTION

Figure 1:
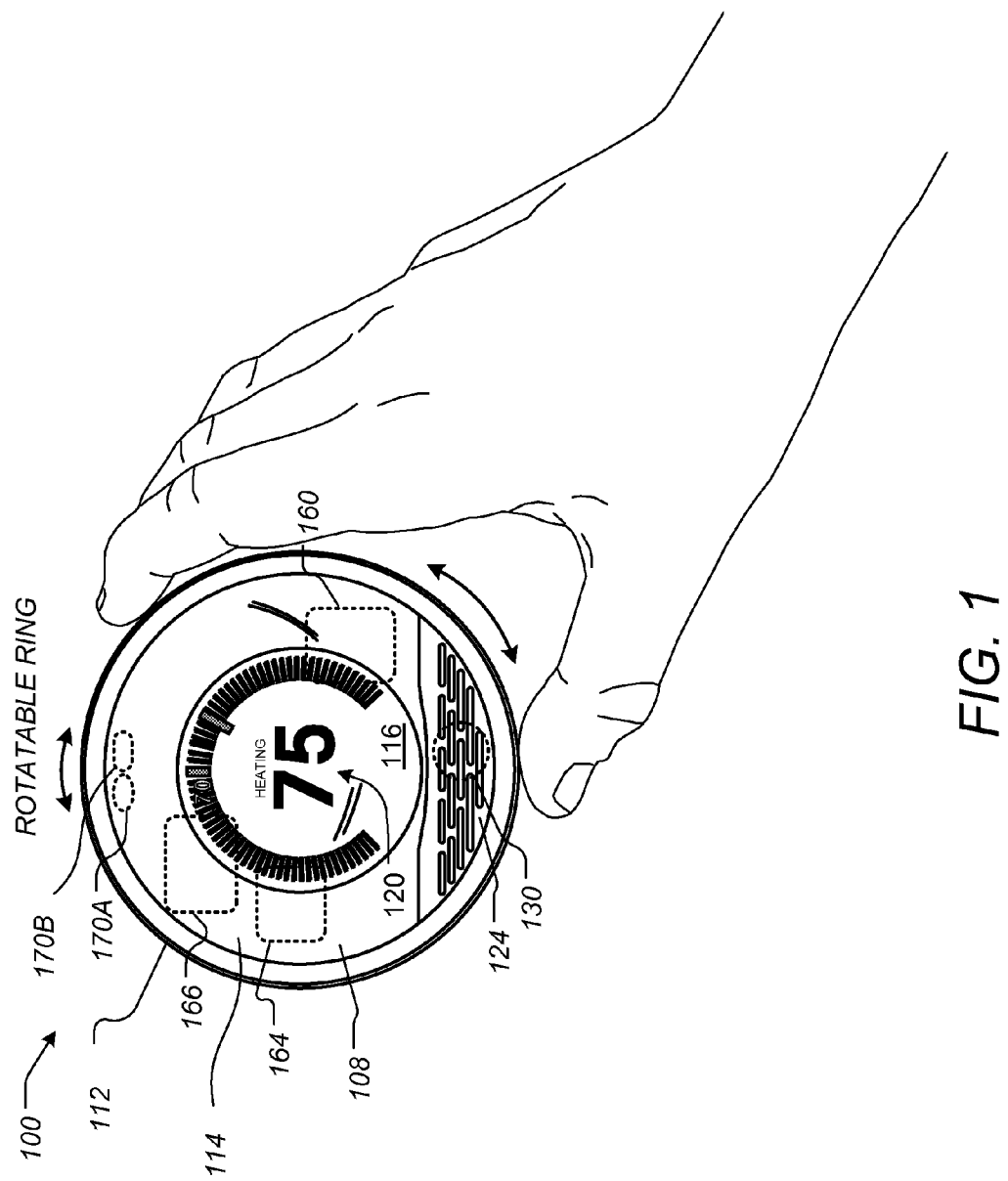
FIG. 1 illustrates a perspective view of a thermostat, according to one embodiment.

The subject matter of this patent specification relates to the subject matter of the following commonly assigned applications, each of which is incorporated by reference herein: International Application No. PCT/US12/00007 filed Jan. 3, 2012; and U.S. Ser. No. 13/467,025 filed May 8, 2012. The above-referenced patent applications are collectively referenced herein as "the commonly-assigned incorporated applications."

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

It is to be appreciated that while one or more embodiments are described further herein in the context of typical HVAC system used in a residential home, such as single-family residential home, the scope of the present teachings is not so limited. More generally, thermostats according to one or more of the preferred embodiments are applicable for a wide variety of enclosures having one or more HVAC systems including, without limitation, duplexes, townhomes, multi-unit apartment buildings, hotels, retail stores, office buildings, and industrial buildings. Further, it is to be appreciated that while the terms user, customer, installer, homeowner, occupant, guest, tenant, landlord, repair person, and/or the like may be used to refer to the person or persons who are interacting with the thermostat or other device or user interface in the context of one or more scenarios described herein, these references are by no means to be considered as limiting the scope of the present teachings with respect to the person or persons who are performing such actions.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

Exemplary Thermostat Embodiments

Provided according to one or more embodiments are systems, methods, and computer program products for controlling one or more HVAC systems based on one or more versatile sensing and control units (VSCU units), each VSCU unit being configured and adapted to provide sophisticated, customized, energy-saving HVAC control functionality while at the same time being visually appealing, non-intimidating, and easy to use. The term "thermostat" is used herein below to represent a particular type of VSCU unit (Versatile Sensing and Control) that is particularly applicable for HVAC control in an enclosure. Although "thermostat" and "VSCU unit" may be seen as generally interchangeable for the contexts of HVAC control of an enclosure, it is within the scope of the present teachings for each of the embodiments herein to be applied to VSCU units having control functionality over measurable characteristics other than temperature (e.g., pressure, flow rate, height, position, velocity, acceleration, capacity, power, loudness, brightness) for any of a variety of different control systems involving the governance of one or more measurable characteristics of one or more physical systems, and/or the governance of other energy or resource consuming systems such as water usage systems, air usage systems, systems involving the usage of other natural resources, and systems involving the usage of various other forms of energy.

FIGS. 1-12 and the descriptions in relation thereto provide exemplary embodiments of thermostat hardware and/or software that can be used to implement the specific embodiments of the appended claims. This thermostat hardware and/or software is not meant to be limiting, and is presented to provide an enabling disclosure. FIG. 1 illustrates a perspective view of a thermostat 100, according to one embodiment. In this specific embodiment, the thermostat 100 can be controlled by at least two types of user input, the first being a rotation of the outer ring 112, and the second being an inward push on an outer cap 108 until an audible and/or tactile "click" occurs. As used herein, these two types of user inputs, may be referred to as "manipulating" the thermostat. In other embodiments, manipulating the thermostat may also include pressing keys on a keypad, voice recognition commands, and/or any other type of input that can be used to change or adjust settings on the thermostat 100.

For this embodiment, the outer cap 108 can comprise an assembly that includes the outer ring 112, a cover 114, an electronic display 116, and a metallic portion 124. Each of these elements, or the combination of these elements, may be referred to as a "housing" for the thermostat 100. Simultaneously, each of these elements, or the combination of these elements, may also form a user interface. The user interface may specifically include the electronic display 116. In FIG. 1, the user interface 116 may be said to operate in an active display mode. The active display mode may include providing a backlight for the electronic display 116. In other embodiments, the active display mode may increase the intensity and/or light output of the electronic display 116 such that a user can easily see displayed settings of the thermostat 100, such as a current temperature, a setpoint temperature, an HVAC function, and/or the like. The active display mode may be contrasted with an inactive display mode (not shown). The inactive display mode can disable a backlight, reduce the amount of information displayed, lessen the intensity of the display, and/or altogether turn off the electronic display 116, depending on the embodiment.

Depending on the settings of the thermostat 100, the active display mode and the inactive display mode of the electronic display 116 may also or instead be characterized by the relative power usage of each mode. In one embodiment, the active display mode may generally require substantially more electrical power than the inactive display mode. In some embodiments, different operating modes of the electronic display 116 may instead be characterized completely by their power usage. In these embodiments, the different operating modes of the electronic display 116 may be referred to as a first mode and a second mode, where the user interface requires more power when operating in the first mode than when operating in the second mode.

According to some embodiments the electronic display 116 may comprise a dot-matrix layout (individually addressable) such that arbitrary shapes can be generated, rather than being a segmented layout. According to some embodiments, a combination of dot-matrix layout and segmented layout is employed. According to some embodiments, electronic display 116 may be a backlit color liquid crystal display (LCD). An example of information displayed on the electronic display 116 is illustrated in FIG. 1, and includes central numerals 120 that are representative of a current setpoint temperature. According to some embodiments, metallic portion 124 can have a number of slot-like openings so as to facilitate the use of a sensors 130, such as a passive infrared motion sensor (PIR), mounted beneath the slot-like openings.

According to some embodiments, the thermostat 100 can include additional components, such as a processing system 160, display driver 164, and a wireless communications system 166. The processing system 160 can adapted or configured to cause the display driver 164 to cause the electronic display 116 to display information to the user. The processing system 160 can also be configured to receive user input via the rotatable ring 112. These additional components, including the processing system 160, can be enclosed within the housing, as displayed in FIG. 1. These additional components are described in further detail herein below.

The processing system 160, according to some embodiments, is capable of carrying out the governance of the thermostat's operation. For example, processing system 160 can be further programmed and/or configured to maintain and update a thermodynamic model for the enclosure in which the HVAC system is installed. According to some embodiments, the wireless communications system 166 can be used to communicate with devices such as personal computers, remote servers, handheld devices, smart phones, and/or other thermostats or HVAC system components. These communications can be peer-to-peer communications, communications through one or more servers located on a private network, or and/or communications through a cloud-based service.

Motion sensing as well as other techniques can be use used in the detection and/or prediction of occupancy, as is described further in the commonly assigned U.S. Ser. No. 12/881,430, incorporated by reference herein. According to some embodiments, occupancy information can be a used in generating an effective and efficient scheduled program. For example, an active proximity sensor 170A can be provided to detect an approaching user by infrared light reflection, and an ambient light sensor 170B can be provided to sense visible light. The proximity sensor 170A can be used in conjunction with a plurality of other sensors to detect proximity in the range of about one meter so that the thermostat 100 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place or about to take place. The various types of sensors that may be used, as well as the operation of the "wake up" function are described in much greater detail throughout the remainder of this disclosure.

Figure 2:
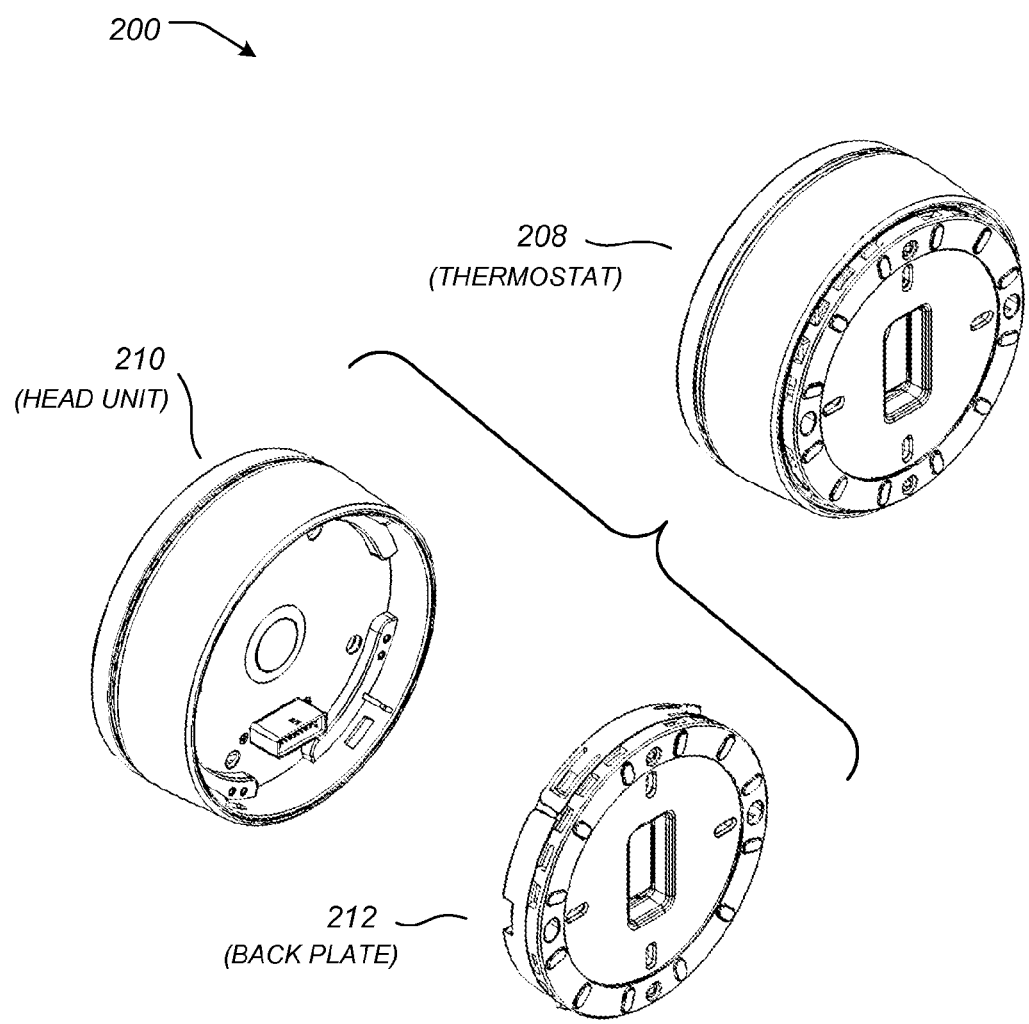
FIG. 2 illustrates an exploded perspective view of a thermostat having a head unit and the backplate, according to one embodiment.

In some embodiments, the thermostat can be physically and/or functionally divided into at least two different units. Throughout this disclosure, these two units can be referred to as a head unit and a backplate. FIG. 2 illustrates an exploded perspective view 200 of a thermostat 208 having a head unit 210 and a backplate 212, according to one embodiment. Physically, this arrangement may be advantageous during an installation process. In this embodiment, the backplate 212 can first be attached to a wall, and the HVAC wires can be attached to a plurality of HVAC connectors on the backplate 212. Next, the head unit 210 can be connected to the backplate 212 in order to complete the installation of the thermostat 208.

Figure 3A:
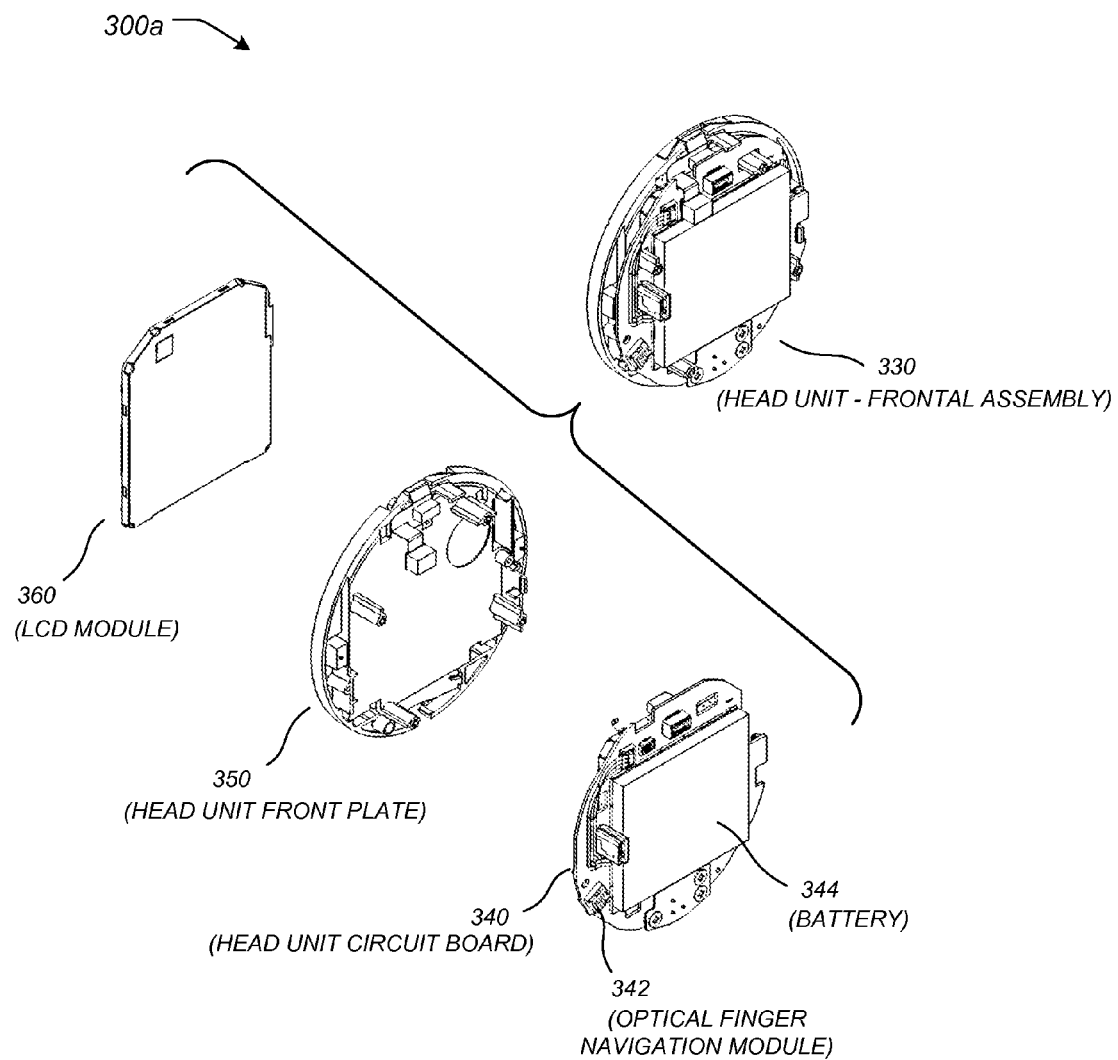
FIG. 3A illustrates an exploded perspective view of a head unit with respect to its primary components, according to one embodiment.

FIG. 3A illustrates an exploded perspective view 300a of a head unit 330 with respect to its primary components, according to one embodiment. Here, the head unit 330 may include an electronic display 360. According to this embodiment, the electronic display 360 may comprise an LCD module. Furthermore, the head unit 330 may include a mounting assembly 350 used to secure the primary components in a completely assembled head unit 330. The head unit 330 may further include a circuit board 340 that can be used to integrate various electronic components described further below. In this particular embodiment, the circuit board 340 of the head unit 330 can include a manipulation sensor 342 to detect user manipulations of the thermostat. In embodiments using a rotatable ring, the manipulation sensor 342 may comprise an optical finger navigation module as illustrated in FIG. 3A. A rechargeable battery 344 may also be included in the assembly of the head unit 330. In one preferred embodiment, rechargeable battery 344 can be a Lithium-Ion battery, which may have a nominal voltage of 3.7 volts and a nominal capacity of 560 mAh.

Figure 3B:
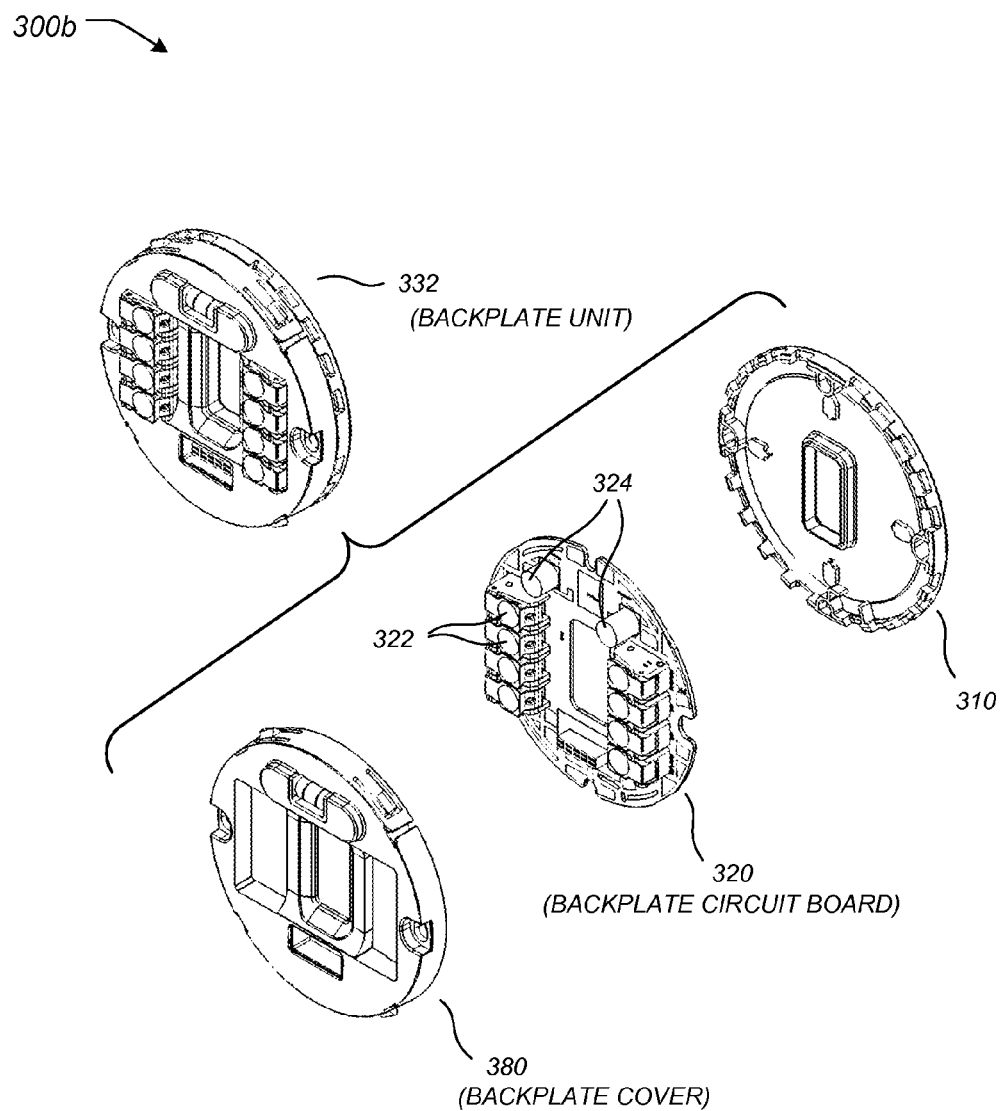
FIG. 3B illustrates an exploded perspective view of a backplate with respect to its primary components, according to one embodiment.

FIG. 3B illustrates an exploded perspective view 300b of a backplate 332 with respect to its primary components, according to one embodiment. The backplate 332 may include a frame 310 that can be used to mount, protect, or house a backplate circuit board 320. The backplate circuit board 320 may be used to mount electronic components, including one or more processing functions, and/or one or more HVAC wire connectors 322. The one or more HVAC wire connectors 322 may include integrated wire insertion sensing circuitry configured to determine whether or not a wire is mechanically and/or electrically connected to each of the one or more HVAC wire connectors 322. In this particular embodiment, two relatively large capacitors 324 are a part of power stealing circuitry that can be mounted to the backplate circuit board 320. The power stealing circuitry is discussed further herein below.

Figure 4A:
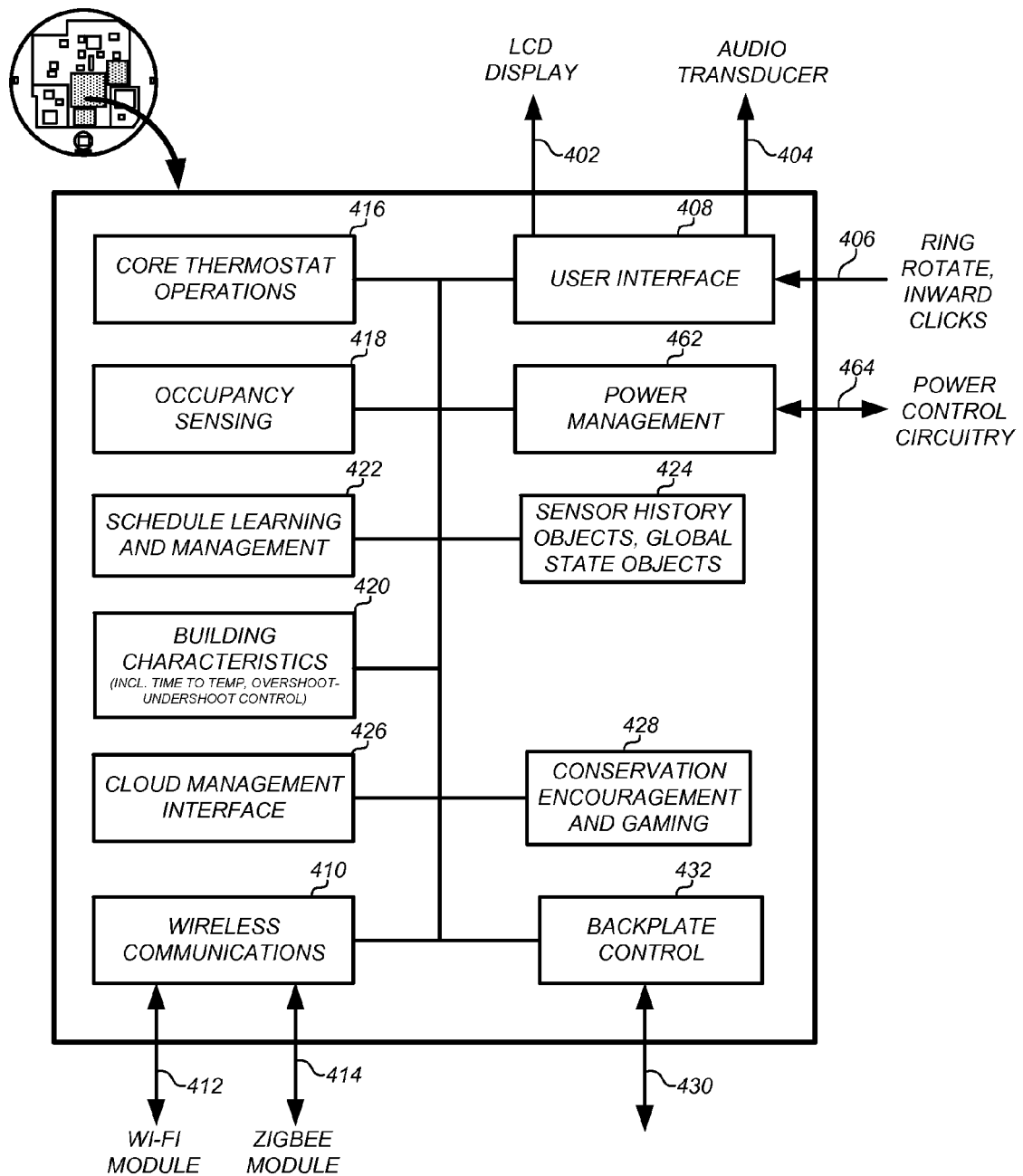
FIG. 4A illustrates a simplified functional block diagram for a head unit, according to one embodiment.

In addition to physical divisions within the thermostat that simplify installation process, the thermostat may also be divided functionally between the head unit and the backplate. FIG. 4A illustrates a simplified functional block diagram 400a for a head unit, according to one embodiment. The functions embodied by block diagram 400a are largely self-explanatory, and may be implemented using one or more processing functions. As used herein, the term "processing function" may refer to any combination of hardware and/or software. For example, a processing function may include a microprocessor, a microcontroller, distributed processors, a lookup table, digital logic, logical/arithmetic functions implemented in analog circuitry, and/or the like. A processing function may also be referred to as a processing system, a processing circuit, or simply a circuit.

In this embodiment, a processing function on the head unit may be implemented by an ARM processor. The head unit processing function may interface with the electronic display 402, an audio system 404, and a manipulation sensor 406 as a part of a user interface 408. The head unit processing function may also facilitate wireless communications 410 by interfacing with various wireless modules, such as a Wi-Fi module 412 and/or a ZigBee module 414. Furthermore, the head unit processing function may be configured to control the core thermostat operations 416, such as operating the HVAC system. The head unit processing function may further be configured to determine or sense occupancy 418 of a physical location, and to determine building characteristics 420 that can be used to determine time-to-temperature characteristics. Using the occupancy sensing 418, the processing function on the head unit may also be configured to learn and manage operational schedules 422, such as diurnal heat and cooling schedules. A power management module 462 may be used to interface with a corresponding power management module on the back plate, the rechargeable battery, and a power control circuit 464 on the back plate.

Additionally, the head unit processing function may include and/or be communicatively coupled to one or more memories. The one or more memories may include one or more sets of instructions that cause the processing function to operate as described above. The one or more memories may also include a sensor history and global state objects 424. The one or more memories may be integrated with the processing function, such as a flash memory or RAM memory available on many commercial microprocessors. The head unit processing function may also be configured to interface with a cloud management system 426, and may also operate to conserve energy wherever appropriate 428. An interface 432 to a backplate processing function 430 may also be included, and may be implemented using a hardware connector.

Figure 4B:
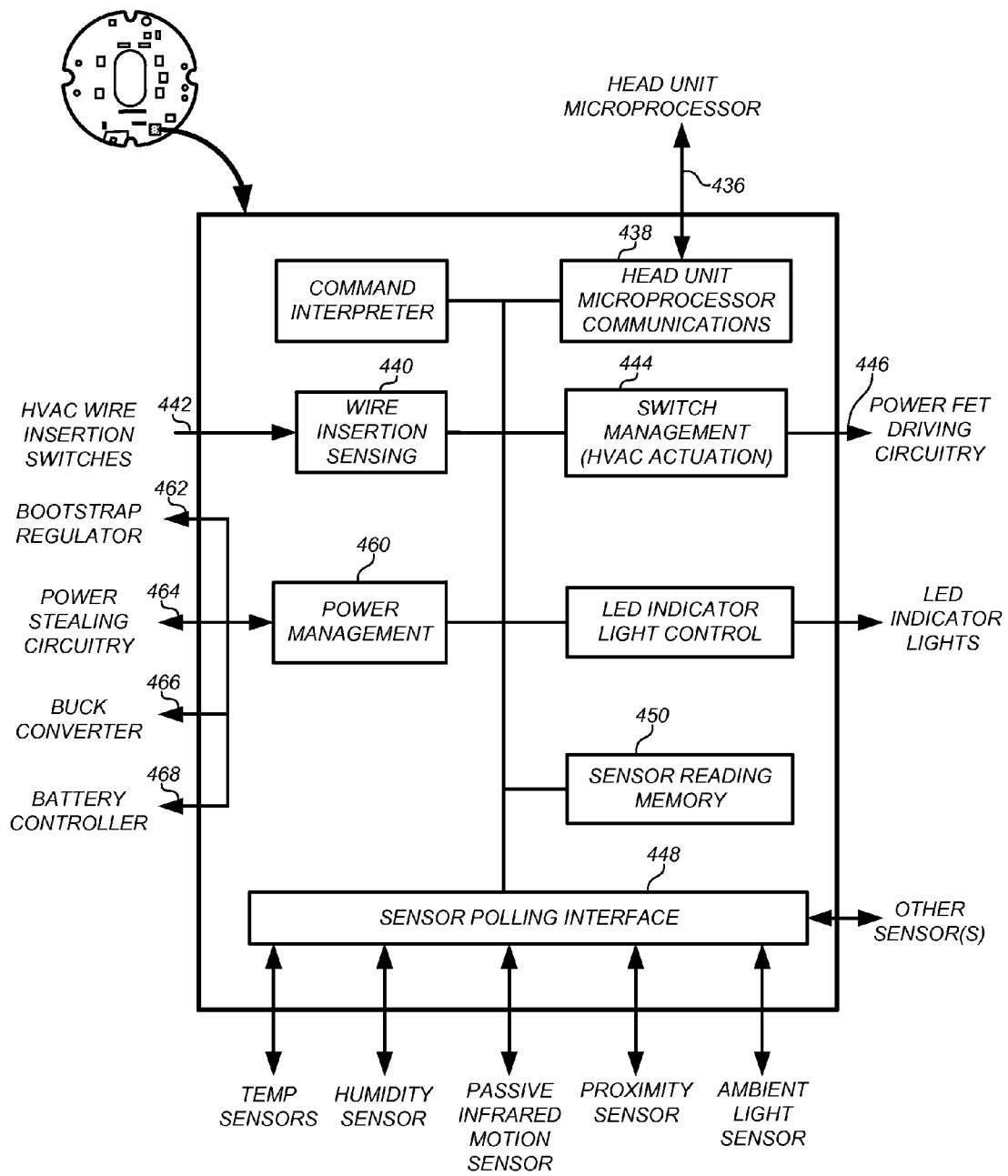
FIG. 4B illustrates a simplified functional block diagram for a backplate, according to one embodiment.

FIG. 4B illustrates a simplified functional block diagram for a backplate, according to one embodiment. Using an interface 436 that is matched to the interface 432 shown in FIG. 4A, the backplate processing function can communicate with the head unit processing function 438. The backplate processing function can include wire insertion sensing 440 that is coupled to external circuitry 442 configured to provide signals based on different wire connection states. The backplate processing function may be configured to manage the HVAC switch actuation 444 by driving power FET circuitry 446 to control the HVAC system.

The backplate processing function may also include a sensor polling interface 448 to interface with a plurality of sensors. In this particular embodiment, the plurality of sensors may include a temperature sensor, a humidity sensor, a PIR sensor, a proximity sensor, an ambient light sensor, and or other sensors not specifically listed. This list is not meant to be exhaustive. Other types of sensors may be used depending on the particular embodiment and application, such as sound sensors, flame sensors, smoke detectors, and/or the like. The sensor polling interface 448 may be communicatively coupled to a sensor reading memory 450. The sensor reading memory 450 can store sensor readings and may be located internally or externally to a microcontroller or microprocessor.

Finally, the backplate processing function can include a power management unit 460 that is used to control various digital and/or analog components integrated with the backplate and used to manage the power system of the thermostat. Although one having skill in the art will recognize many different implementations of a power management system, the power management system of this particular embodiment can include a bootstrap regulator 462, a power stealing circuit 464, a buck converter 466, and/or a battery controller 468.

Figure 5:
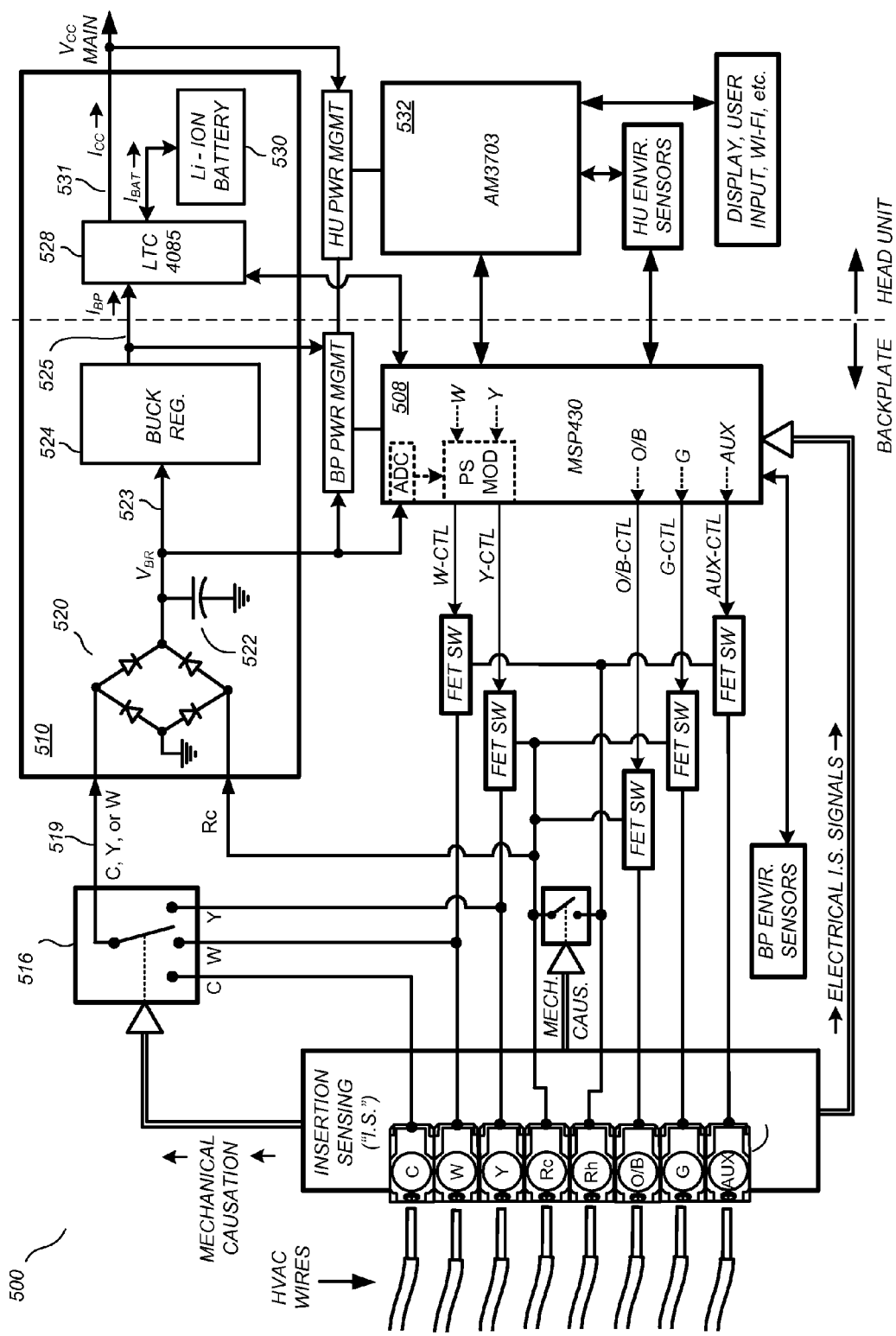
FIG. 5 illustrates a simplified circuit diagram of a system for managing the power consumed by a thermostat, according to one embodiment.

FIG. 5 illustrates a simplified circuit diagram 500 of a system for managing the power consumed by a thermostat, according to one embodiment. The powering circuitry 510 comprises a full-wave bridge rectifier 520, a storage and waveform-smoothing bridge output capacitor 522 (which can be, for example, on the order of 30 microfarads), a buck regulator circuit 524, a power-and-battery (PAB) regulation circuit 528, and a rechargeable lithium-ion battery 530. In conjunction with other control circuitry including backplate power management circuitry 527, head unit power management circuitry 529, and the microcontroller 508, the powering circuitry 510 can be configured and adapted to have the characteristics and functionality described herein below. Description of further details of the powering circuitry 510 and associated components can be found elsewhere in the instant disclosure and/or in the commonly assigned U.S. Ser. No. 13/034,678, and U.S. Ser. No. 13/267,871, both of which are incorporated by reference herein.

By virtue of the configuration illustrated in FIG. 5, when there is a "C" wire presented upon installation, the powering circuitry 510 operates as a relatively high-powered, rechargeable-battery-assisted AC-to-DC converting power supply. When there is not a "C" wire presented, the powering circuitry 510 operates as a power-stealing, rechargeable-battery-assisted AC-to-DC converting power supply. The powering circuitry 510 generally serves to provide the voltage Vcc MAIN that is used by the various electrical components of the thermostat, which in one embodiment can be about 4.0 volts. For the case in which the "C" wire is present, there is no need to worry about accidentally tripping (as there is in inactive power stealing) or untripping (for active power stealing) an HVAC call relay, and therefore relatively large amounts of power can be assumed to be available. Generally, the power supplied by the "C" wire will be greater than the instantaneous power required at any time by the remaining circuits in the thermostat.

However, a "C" wire will typically only be present in about 20% of homes. Therefore, the powering circuitry 510 may also be configured to "steal" power from one of the other HVAC wires in the absence of a "C" wire. As used herein, "inactive power stealing" refers to the power stealing that is performed during periods in which there is no active call in place based on the lead from which power is being stolen. Thus, for cases where it is the "Y" lead from which power is stolen, "inactive power stealing" refers to the power stealing that is performed when there is no active cooling call in place. As used herein, "active power stealing" refers to the power stealing that is performed during periods in which there is an active call in place based on the lead from which power is being stolen. Thus, for cases where it is the "Y" lead from which power is stolen, "active power stealing" refers to the power stealing that is performed when there is an active cooling call in place. During inactive or active power stealing, power can be stolen from a selected one of the available call relay wires. While a complete description of the power stealing circuitry 510 can be found in the commonly assigned applications that have been previously incorporated herein by reference, the following brief explanation is sufficient for purposes of this disclosure.

Some components in the thermostat, such as the head unit processing function, the user interface, and/or the electronic display may consume more instantaneous power than can be provided by power stealing alone. When these more power-hungry components are actively operating, the power supplied by power stealing can be supplemented with the rechargeable battery 530. In other words, when the thermostat is engaged in operations, such as when the electronic display is in an active display mode, power may be supplied by both power stealing and the rechargeable battery 530. In order to preserve the power stored in the rechargeable battery 530, and to give the rechargeable battery 530 an opportunity to recharge, some embodiments optimize the amount of time that the head unit processing function and the electronic display are operating in an active mode. In other words, it may be advantageous in some embodiments to keep the head unit processing function in a sleep mode or low power mode and to keep the electronic display in an inactive display mode as long as possible without affecting the user experience.

When the head unit processing function and the electronic display are in an inactive or sleep mode, the power consumed by the thermostat is generally less than the power provided by power stealing. Therefore, the power that is not consumed by the thermostat can be used to recharge the rechargeable battery 530. In this embodiment, the backplate processing function 508 (MSP430, or an STM32L 32-bit ultra-low power ARM-based microprocessor available from ST Microelectronics.) can be configured to monitor the environmental sensors in a low-power mode, and then wake the head unit processing function 532 (such as an AM3703 Sitara ARM microprocessor available from Texas Instruments) when needed to control the HVAC system, etc. Similarly, the backplate processing function 508 can be used to monitor sensors used to detect the closeness of a user, and wake the head unit processing system 532 and/or the electronic display when it is determined that a user intends to interface with the thermostat.

It will be understood by one having skill in the art that the various thermostat embodiments depicted and described in relation to FIGS. 1-5 are merely exemplary and not meant to be limiting. Many other hardware and/or software configurations may be used to implement a thermostat and the various functions described herein below. For example further detail of head unit and backplate circuitry and architecture is provided in U.S. patent application Ser. No. 13/624,882 filed Sep. 21, 2012, which is incorporated herein by reference. The described embodiments should be seen as an exemplary platform in which the following embodiments can be implemented to provide an enabling disclosure. Of course, the following methods, systems, and/or software program products could also be implemented using different types of thermostats, different hardware, and/or different software.

Figure 6:
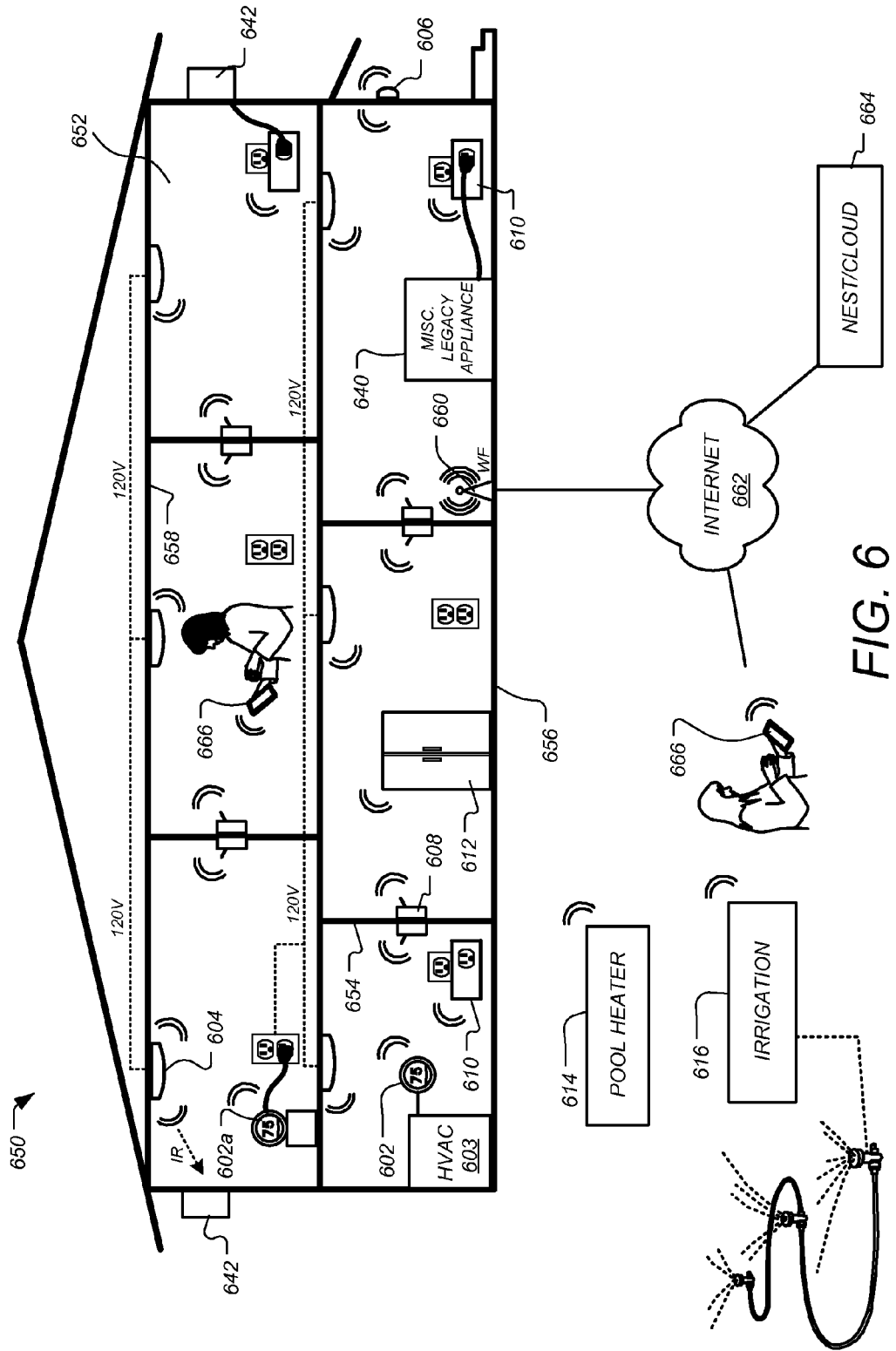
FIG. 6 illustrates an example of a smart home environment within which one or more of the devices, methods, systems, services, and/or computer program products described further herein can be applicable.

FIG. 6 illustrates an example of a smart home environment within which one or more of the devices, methods, systems, services, and/or computer program products described further herein can be applicable. The depicted smart home environment includes a structure 650, which can include, e.g., a house, office building, garage, or mobile home. It will be appreciated that devices can also be integrated into a smart home environment that does not include an entire structure 650, such as an apartment, condominium, or office space. Further, the smart home environment can control and/or be coupled to devices outside of the actual structure 650. Indeed, several devices in the smart home environment need not physically be within the structure 650 at all. For example, a device controlling a pool heater or irrigation system can be located outside of the structure 650.

The depicted structure 650 includes a plurality of rooms 652, separated at least partly from each other via walls 654. The walls 654 can include interior walls or exterior walls. Each room can further include a floor 656 and a ceiling 658. Devices can be mounted on, integrated with and/or supported by a wall 654, floor or ceiling.

The smart home depicted in FIG. 6 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 6.

An intelligent, multi-sensing, network-connected thermostat 602 can detect ambient climate characteristics (e.g., temperature and/or humidity) and control a heating, ventilation and air-conditioning (HVAC) system 603. The embodiments shown and/or described herein with respect to the thermostat 100 can equally and alternatively be used in connection with thermostat 602 as shown and described herein. In this respect, as used herein references to thermostat 100 and to thermostat 602 can be substituted for one another, according to some embodiments. Furthermore, various components and/or assemblies described with respect to either thermostat 100 or thermostat 602 can be used in connection with the other described thermostat, according to some embodiments.

One or more intelligent, network-connected, multi-sensing hazard detection units 604 can detect the presence of a hazardous substance and/or a hazardous condition in the home environment (e.g., smoke, fire, or carbon monoxide). One or more intelligent, multi-sensing, network-connected entryway interface devices 606, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 608 can detect ambient lighting conditions, detect room-occupancy states and control a power and/or dim state of one or more lights. In some instances, light switches 608 can further or alternatively control a power state or speed of a fan, such as a ceiling fan. Each of a plurality of intelligent, multi-sensing, network-connected wall plug interfaces 610 can detect occupancy of a room or enclosure and control supply of power to one or more wall plugs (e.g., such that power is not supplied to the plug if nobody is at home). The smart home may further include a plurality of intelligent, multi-sensing, network-connected appliances 612, such as refrigerators, stoves and/or ovens, televisions, washers, dryers, lights (inside and/or outside the structure 650), stereos, intercom systems, garage-door openers, floor fans, ceiling fans, whole-house fans, wall air conditioners, pool heaters 614, irrigation systems 616, security systems (including security system components such as cameras, motion detectors and window/door sensors), and so forth. While descriptions of FIG. 6 can identify specific sensors and functionalities associated with specific devices, it will be appreciated that any of a variety of sensors and functionalities (such as those described throughout the specification) can be integrated into the device.

In addition to containing processing and sensing capabilities, each of the devices 602, 604, 606, 608, 610, 612, 614 and 616 can be capable of data communications and information sharing with any other of the devices 602, 604, 606, 608, 610, 612, 614 and 616, as well as to any cloud server or any other device that is network-connected anywhere in the world. The devices can send and receive communications via any of a variety of custom or standard wireless protocols (Wi-Fi, ZigBee, 6LoWPAN, etc.) and/or any of a variety of custom or standard wired protocols (CAT6 Ethernet, HomePlug, etc.). The wall plug interfaces 610 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 660. A device can further communicate with remote devices via a connection to a network, such as the Internet 662. Through the Internet 662, the device can communicate with a central server or a cloud-computing system 664. The central server or cloud-computing system 664 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 664 to devices (e.g., when available, when purchased, or at routine intervals).

By virtue of network connectivity, one or more of the smart-home devices of FIG. 6 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 640, such as old conventional washer/dryers, refrigerators, and the like which can be controlled, albeit coarsely (ON/OFF), by virtue of the wall plug interfaces 610. The smart home can further include a variety of partially communicating legacy appliances 642, such as IR-controlled wall air conditioners or other IR-controlled devices, which can be controlled by IR signals provided by the hazard detection units 604 or the light switches 608.

Figure 7:
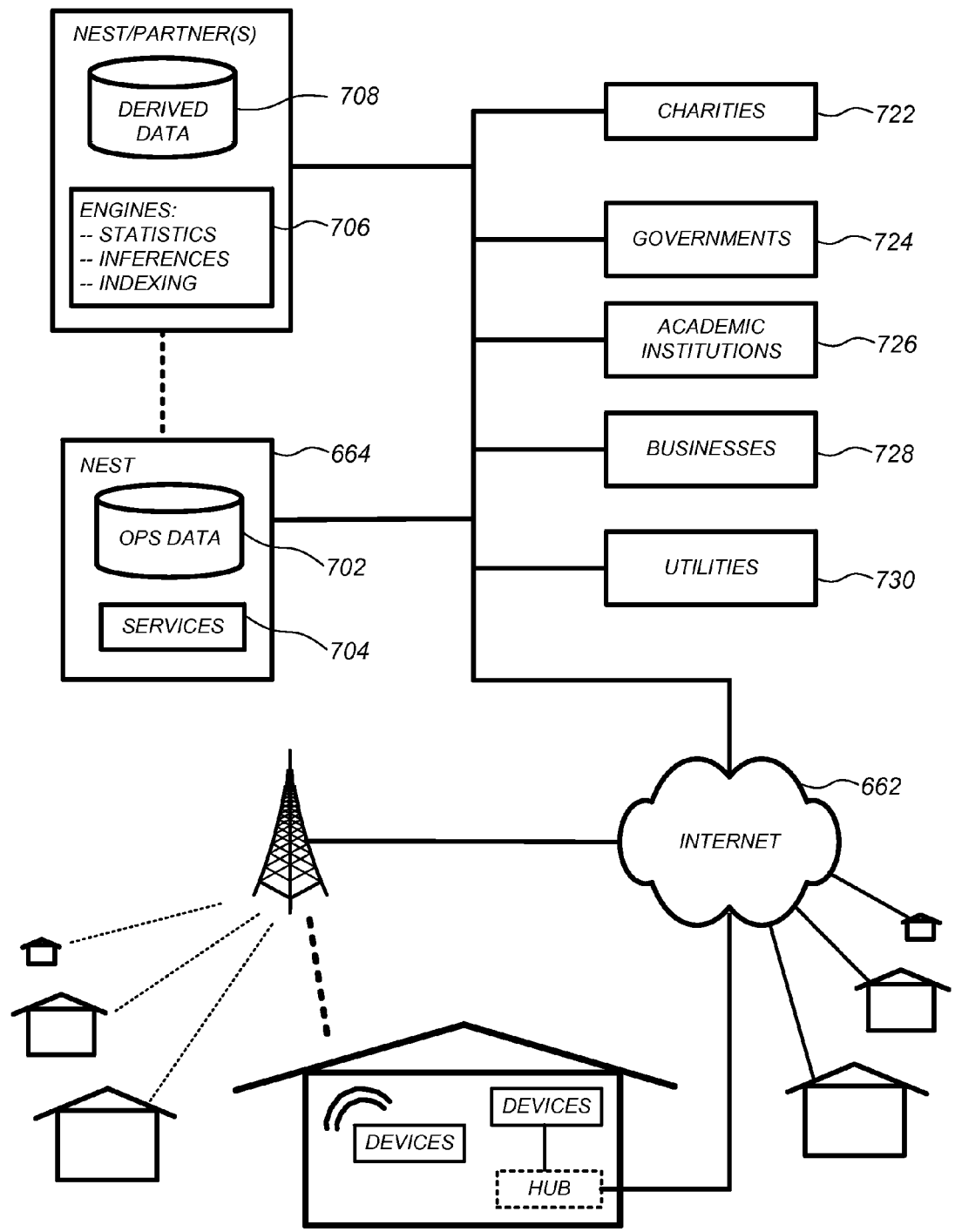
FIG. 7 illustrates a network-level view of an extensible devices and services platform with which the smart home of FIG. 6 can be integrated, according to some embodiments.

FIG. 7 illustrates a network-level view of an extensible devices and services platform with which the smart home of FIG. 6 can be integrated, according to some embodiments. Each of the intelligent, network-connected devices from FIG. 6 can communicate with one or more remote central servers or cloud computing systems 664. The communication can be enabled by establishing connection to the Internet 662 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 664 can collect operation data 702 from the smart home devices. For example, the devices can routinely transmit operation data or can transmit operation data in specific instances (e.g., when requesting customer support). The central server or cloud-computing architecture 664 can further provide one or more services 704. The services 704 can include, e.g., software update, customer support, sensor data collection/logging, remote access, remote or distributed control, or use suggestions (e.g., based on collected operation data 704 to improve performance, reduce utility cost, etc.). Data associated with the services 704 can be stored at the central server or cloud-computing system 664 and the central server or cloud-computing system 664 can retrieve and transmit the data at an appropriate time (e.g., at regular intervals, upon receiving request from a user, etc.).

One salient feature of the described extensible devices and services platform, as illustrated in FIG. 7, is a processing engines 706, which can be concentrated at a single server or distributed among several different computing entities without limitation. Processing engines 706 can include engines configured to receive data from a set of devices (e.g., via the Internet or a hubbed network), to index the data, to analyze the data and/or to generate statistics based on the analysis or as part of the analysis. The analyzed data can be stored as derived data 708. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 662. In this manner, processing engines 706 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 706 can generate statistics about device usage across a population of devices and send the statistics to device users, service providers or other entities (e.g., that have requested or may have provided monetary compensation for the statistics). As specific illustrations, statistics can be transmitted to charities 777, governmental entities 724 (e.g., the Food and Drug Administration or the Environmental Protection Agency), academic institutions 726 (e.g., university researchers), businesses 728 (e.g., providing device warranties or service to related equipment), or utility companies 730. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 8:
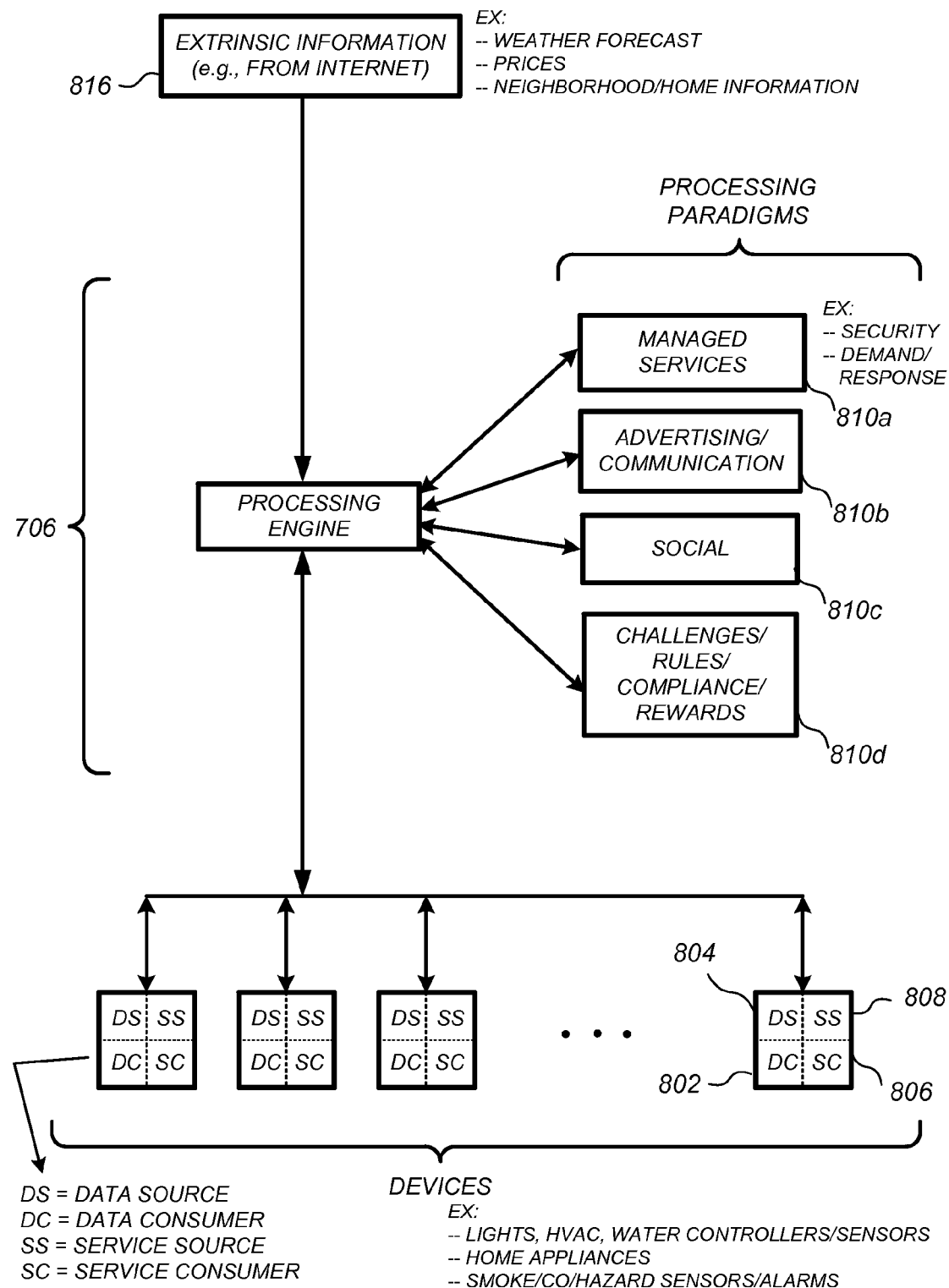
FIG. 8 illustrates an abstracted functional view of the extensible devices and services platform of FIG. 7, according to some embodiments.

FIG. 8 illustrates an abstracted functional view of the extensible devices and services platform of FIG. 7, with particular reference to the processing engine 706 as well as the devices of the smart home. Even though the devices situated in the smart home will have an endless variety of different individual capabilities and limitations, they can all be thought of as sharing common characteristics in that each of them is a data consumer 802 (DC), a data source 804 (DS), a services consumer 806 (SC), and a services source 808 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 8 shows processing engine 706 as including a number of paradigms 810. Processing engine 706 can include a managed services paradigm 810a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 706 can further include an advertising/communication paradigm 810b that estimates characteristics (e.g., demographic information), desires and/or products of interest of a user based on device usage. Services, promotions, products or upgrades can then be offered or automatically provided to the user. Processing engine 706 can further include a social paradigm 810c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 706 can include a challenges/rules/compliance/rewards paradigm 810d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 816 from extrinsic sources to improve the functioning of one or more processing paradigms. Extrinsic information 816 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 706 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 9:
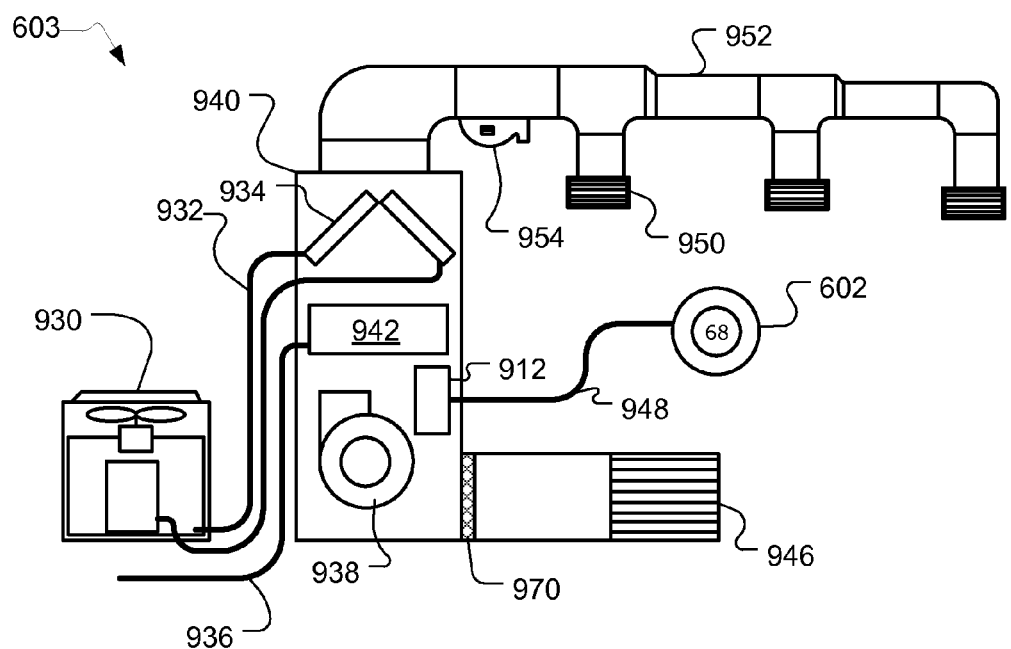
FIG. 9 is a schematic diagram of an HVAC system, according to some embodiments.

FIG. 9 is a schematic diagram of an HVAC system, according to some embodiments. HVAC system 603 provides heating, cooling, ventilation, and/or air handling for an enclosure, such as structure 650 depicted in FIG. 6. System 603 depicts a forced air type heating and cooling system, although according to other embodiments, other types of HVAC systems could be used such as radiant heat based systems, heat-pump based systems, and others.

For carrying out the heating function, heating coils or elements 942 within air handler 940 provide a source of heat using electricity or gas via line 936. Cool air is drawn from the enclosure via return air duct 946 through filter 970, using fan 938 and is heated through heating coils or elements 942. The heated air flows back into the enclosure at one or more locations via supply air duct system 952 and supply air registers such as register 950. In cooling, an outside compressor 930 passes a gas such as Freon through a set of heat exchanger coils and then through an expansion valve. The gas then goes through line 932 to the cooling coils or evaporator coils 934 in the air handler 940 where it expands, cools and cools the air being circulated via fan 938. A humidifier 954 may optionally be included in various embodiments that returns moisture to the air before it passes through duct system 952. Although not shown in FIG. 9, alternate embodiments of HVAC system 603 may have other functionality such as venting air to and from the outside, one or more dampers to control airflow within the duct system 952 and an emergency heating unit. Overall operation of HVAC system 603 is selectively actuated by control electronics 912 communicating with thermostat 602 over control wires 948.

Figure 10A:
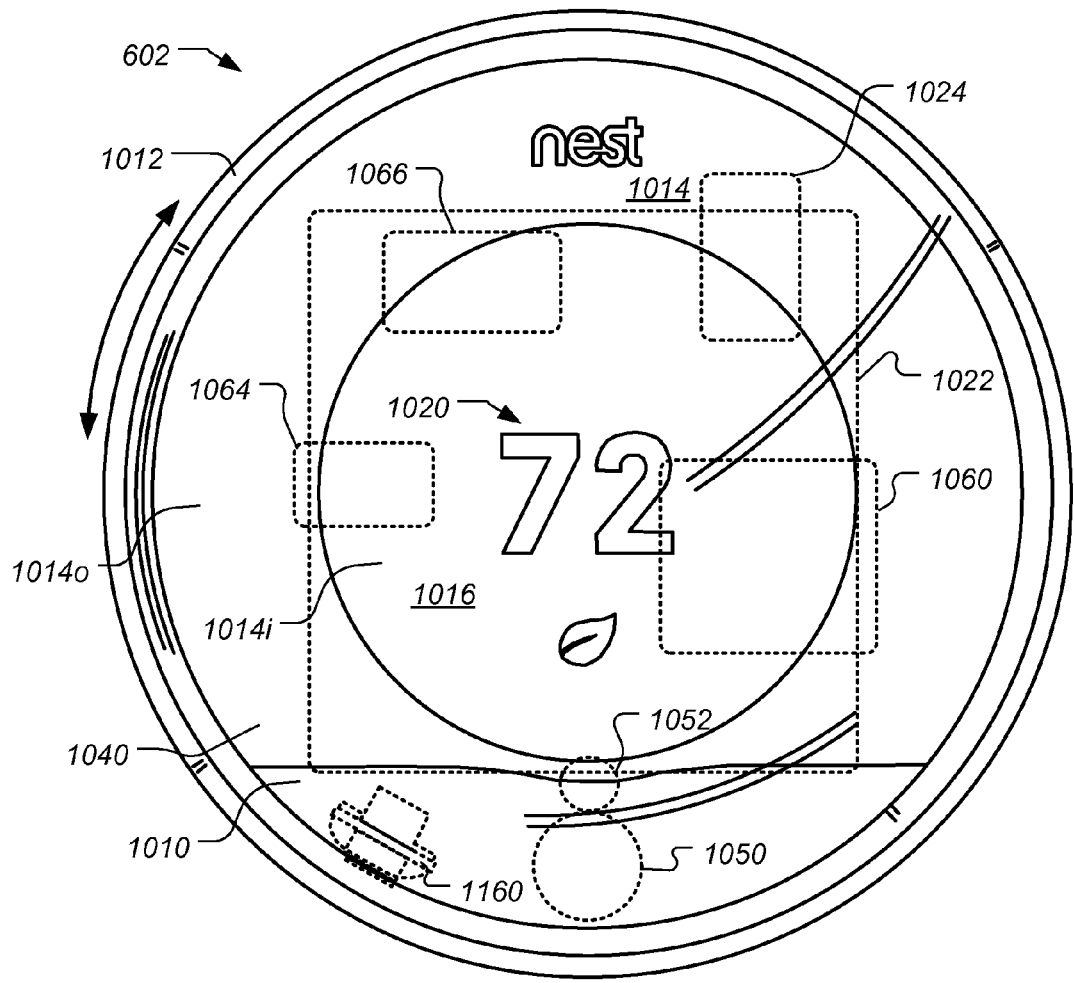
FIGS. 10A-10D illustrate a thermostat having a visually pleasing, smooth, sleek and rounded exterior appearance while at the same time including one or more sensors for detecting occupancy and/or users, according to some embodiments.
Figure 10B:
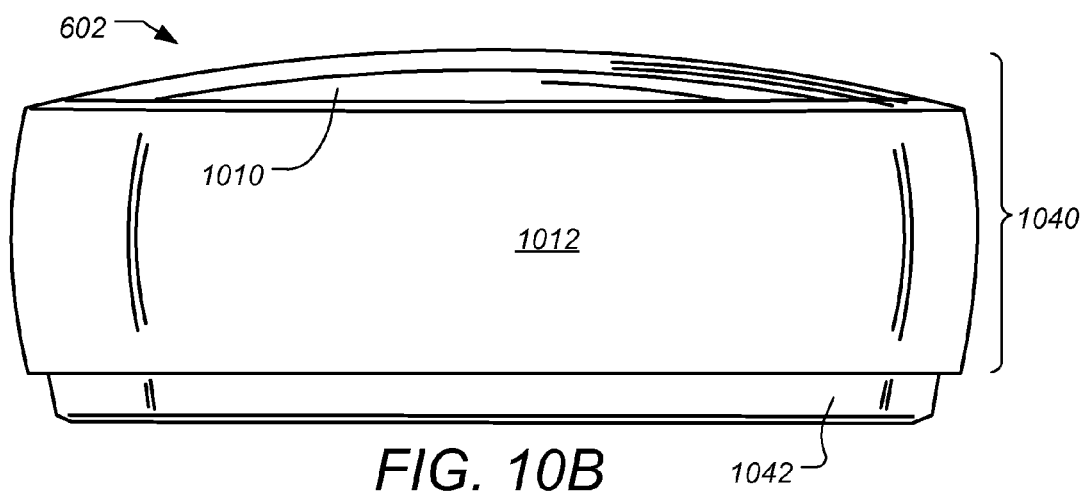
Figure 10C:
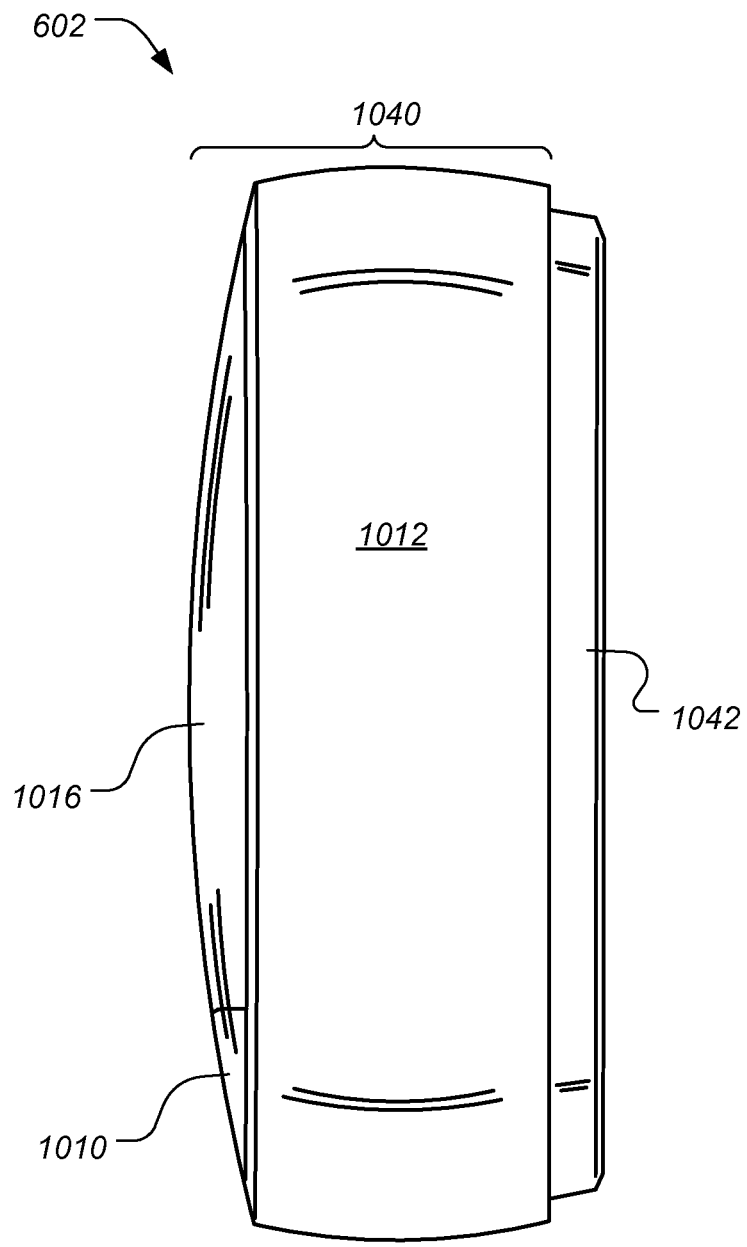
Figure 10D:
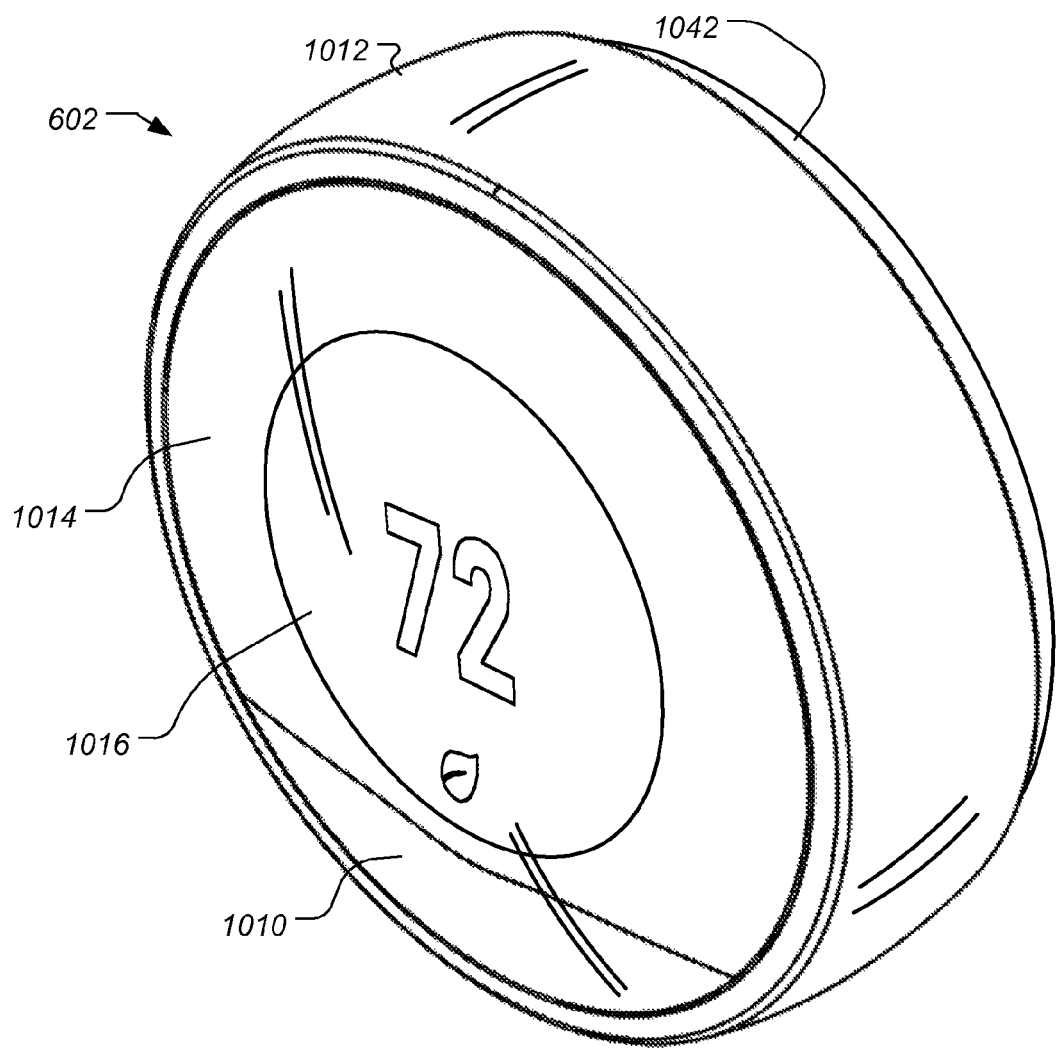

FIGS. 10A-10D illustrate a thermostat having a visually pleasing, smooth, sleek and rounded exterior appearance while at the same time including one or more sensors for detecting occupancy and/or users, according to some embodiments. FIG. 10A is front view, FIG. 10B is a bottom elevation, FIG. 10C is a right side elevation, and FIG. 10D is prospective view of thermostat 602. Unlike many prior art thermostats, thermostat 602 has a sleek, simple, uncluttered and elegant design that does not detract from home decoration, and indeed can serve as a visually pleasing centerpiece for the immediate location in which it is installed. Moreover, user interaction with thermostat 602 is facilitated and greatly enhanced over known conventional thermostats by the design of thermostat 602. The thermostat 602 includes control circuitry and is electrically connected to an HVAC system 603, such as is shown in FIGS. 6-9. Similarly to thermostat 100 shown and described herein, thermostat 602 is wall mountable, is circular in shape, and has an outer rotatable ring 1012 for receiving user input. Thermostat 602 is circular in shape in that it appears as a generally disk-like circular object when mounted on the wall. Thermostat 602 has a large convex rounded front face lying inside the outer ring 1012. According to some embodiments, thermostat 602 is approximately 80 mm in diameter and protrudes from the wall, when wall mounted, by 32 mm. The outer rotatable ring 1012 allows the user to make adjustments, such as selecting a new setpoint temperature. For example, by rotating the outer ring 1012 clockwise, the real time (i.e. currently active) setpoint temperature can be increased, and by rotating the outer ring 1012 counter-clockwise, the real time setpoint temperature can be decreased. The front face of the thermostat 602 comprises a clear cover 1014 that according to some embodiments is polycarbonate, and a Fresnel lens 1010 having an outer shape that matches the contours of the curved outer front face of the thermostat 602. According to some embodiments, the Fresnel lens elements are formed on the interior surface of the Fresnel lens piece 1010 such that they are not obviously visible by viewing the exterior of the thermostat 602. Behind the Fresnel lens is a passive infrared sensor 1050 for detecting occupancy, and the Fresnel lens piece 1010 is made from a high-density polyethylene (HDPE) that has an infrared transmission range appropriate for sensitivity to human bodies. As shown in FIGS. 10A-10D, the front edge of rotating ring 1012, front face 1014 and Fresnel lens 1010 are shaped such that they together form a, integrated convex rounded front face that has a common outward arc or spherical shape gently arcing outward.

Although being formed from a single lens-like piece of material such as polycarbonate, the cover 1014 has two different regions or portions including an outer portion 1014o and a central portion 1014i. According to some embodiments, the cover 1014 is painted or smoked around the outer portion 1014o, but leaves the central portion 1014i visibly clear so as to facilitate viewing of an electronic display 1016 disposed thereunderneath. According to some embodiments, the curved cover 1014 acts as a lens that tends to magnify the information being displayed in electronic display 1016 to users. According to some embodiments the central electronic display 1016 is a dot-matrix layout (i.e. individually addressable) such that arbitrary shapes can be generated, rather than being a segmented layout. According to some embodiments, a combination of dot-matrix layout and segmented layout is employed. According to some embodiments, central display 1016 is a backlit color liquid crystal display (LCD). An example of information displayed on the electronic display 1016 is illustrated in FIG. 10A, and includes central numerals 1020 that are representative of a current setpoint temperature. The thermostat 602 is preferably constructed such that the electronic display 1016 is at a fixed orientation and does not rotate with the outer ring 1012, so that the electronic display 1016 remains easily read by the user. For some embodiments, the cover 1014 and Fresnel lens 1010 also remain at a fixed orientation and do not rotate with the outer ring 1012. According to one embodiment in which the diameter of the thermostat 602 is about 80 mm, the diameter of the electronic display 1016 is about 410 mm. According to some embodiments the gently outwardly curved shape of the front surface of thermostat 602, which is made up of cover 1014, Fresnel lens 1010 and the front facing portion of ring 1012, is spherical, and matches a sphere having a radius of between 100 mm and 150 mm. According to some embodiments, the radius of the spherical shape of the thermostat front is about 136 mm.

Motion sensing with PIR sensor 1050 as well as other techniques can be used in the detection and/or predict of occupancy, as is described further in the commonly assigned U.S. Ser. No. 12/881,430, which is incorporated herein by reference. According to some embodiments, occupancy information is used in generating an effective and efficient scheduled program. A second downwardly-tilted PIR sensor 1052 is provided to detect an approaching user. The proximity sensor 1052 can be used to detect proximity in the range of about one meter so that the thermostat 602 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, similarly to thermostat 100 shown and described herein, for the combined purposes of inspiring user confidence and further promoting visual and functional elegance, the thermostat 602 is controlled by only two types of user input, the first being a rotation of the outer ring 1012 as shown in FIG. 10A (referenced hereafter as a "rotate ring" or "ring rotation" input), and the second being an inward push on head unit 1040 until an audible and/or tactile "click" occurs (referenced hereafter as an "inward click" or simply "click" input). For such embodiments, the head unit 1040 is an assembly that includes all of the outer ring 1012, cover 1014, electronic display 1016, and the Fresnel lens 1010. When pressed inwardly by the user, the head unit 1040 travels inwardly by a small amount, such as 0.5 mm, against an interior metallic dome switch (not shown), and then springably travels back outwardly by that same amount when the inward pressure is released, providing a satisfying tactile "click" sensation to the user's hand, along with a corresponding gentle audible clicking sound. Thus, for the embodiment of FIGS. 10A-10D, an inward click can be achieved by direct pressing on the outer ring 1012 itself, or by indirect pressing of the outer ring by virtue of providing inward pressure on the cover 1014, lens 1010, or by various combinations thereof. For other embodiments, the thermostat 602 can be mechanically configured such that only the outer ring 1012 travels inwardly for the inward click input, while the cover 1014 and lens 1010 remain motionless. It is to be appreciated that a variety of different selections and combinations of the particular mechanical elements that will travel inwardly to achieve the "inward click" input are within the scope of the present teachings, whether it be the outer ring 1012 itself, some part of the cover 1014, or some combination thereof. However, it has been found particularly advantageous to provide the user with an ability to quickly go back and forth between registering "ring rotations" and "inward clicks" with a single hand and with minimal amount of time and effort involved, and so the ability to provide an inward click directly by pressing the outer ring 1012 has been found particularly advantageous, since the user's fingers do not need to be lifted out of contact with the device, or slid along its surface, in order to go between ring rotations and inward clicks. Moreover, by virtue of the strategic placement of the electronic display 1016 centrally inside the rotatable ring 1012, a further advantage is provided in that the user can naturally focus their attention on the electronic display throughout the input process, right in the middle of where their hand is performing its functions. The combination of intuitive outer ring rotation, especially as applied to (but not limited to) the changing of a thermostat's setpoint temperature, conveniently folded together with the satisfying physical sensation of inward clicking, together with accommodating natural focus on the electronic display in the central midst of their fingers' activity, adds significantly to an intuitive, seamless, and downright fun user experience. Further descriptions of advantageous mechanical user-interfaces and related designs, which are employed according to some embodiments, can be found in U.S. Ser. No. 13/033,573, U.S. Ser. No. 29/386,021, and U.S. Ser. No. 13/199,108, all of which are incorporated herein by reference.

FIGS. 10B and 10C are bottom and right side elevation views of the thermostat 602, which has been found to provide a particularly pleasing and adaptable visual appearance when viewed against a variety of different wall colors and wall textures in a variety of different home environments and home settings. While the thermostat itself will functionally adapt to the user's schedule as described herein and in one or more of the commonly assigned incorporated applications, the outer shape is specially configured to convey a "chameleon" quality or characteristic such that the overall device appears to naturally blend in, in a visual and decorative sense, with many of the most common wall colors and wall textures found in home and business environments, at least in part because it will appear to assume the surrounding colors and even textures when viewed from many different angles.

According to some embodiments, the thermostat 602 includes a processing system 1060, display driver 1064 and a wireless communications system 1066. The processing system 1060 is adapted to cause the display driver 1064 and display 1016 to display information to the user, and to receiver user input via the rotatable ring 1012. The processing system 1060, according to some embodiments, is capable of carrying out the governance of the operation of thermostat 602 including various user interface features. The processing system 1060 is further programmed and configured to carry out other operations as described further hereinbelow and/or in other ones of the commonly assigned incorporated applications. For example, processing system 1060 is further programmed and configured to maintain and update a thermodynamic model for the enclosure in which the HVAC system is installed, such as described in U.S. Ser. No. 12/881,463, and in International Patent App. No. PCT/US11/51579, both of which are incorporated herein by reference. According to some embodiments, the wireless communications system 1066 is used to communicate with devices such as personal computers and/or other thermostats or HVAC system components, which can be peer-to-peer communications, communications through one or more servers located on a private network, or and/or communications through a cloud-based service.

According to some embodiments, for ease of installation, configuration and/or upgrading, especially by a non-expert installer such as a user, the thermostat 602 includes a head unit 1040 and a backplate (or wall dock) 1042. As is described hereinabove, thermostat 602 is wall mounted and has circular in shape and has an outer rotatable ring 1012 for receiving user input. Head unit 1040 of thermostat 602 is slidably mountable onto back plate 1042 and slidably detachable therefrom. According to some embodiments the connection of the head unit 1040 to backplate 1042 can be accomplished using magnets, bayonet, latches and catches, tabs or ribs with matching indentations, or simply friction on mating portions of the head unit 1040 and backplate 1042. Also shown in FIG. 10A is a rechargeable battery 1022 that is recharged using recharging circuitry 1024 that uses power from backplate that is either obtained via power harvesting (also referred to as power stealing and/or power sharing) from the HVAC system control circuit(s) or from a common wire, if available, as described in further detail in co-pending patent application U.S. Ser. Nos. 13/034,674, and 13/034,678, which are incorporated by reference herein. According to some embodiments, rechargeable battery 1022 is a single cell lithium-ion, or a lithium-polymer battery.

Figure 11A:
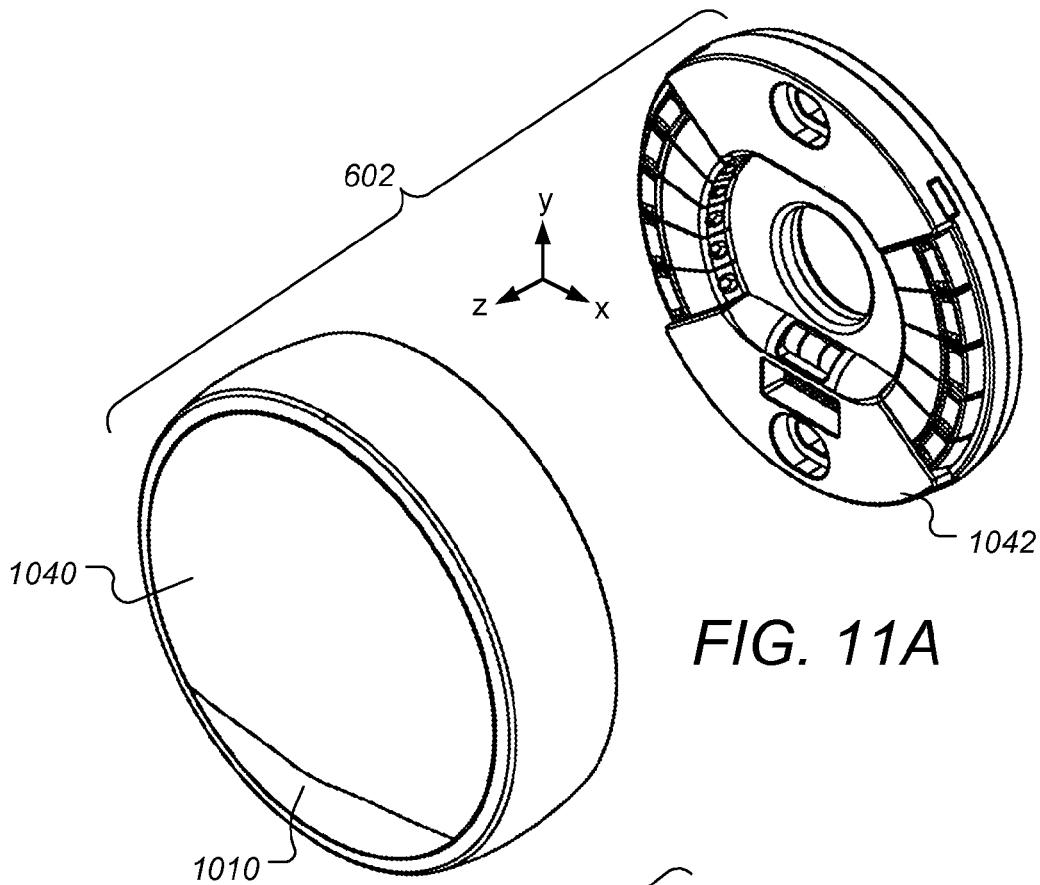
FIGS. 11A-11B illustrate exploded front and rear perspective views, respectively, of a thermostat with respect to its two main components, according to some embodiments.
Figure 11B:
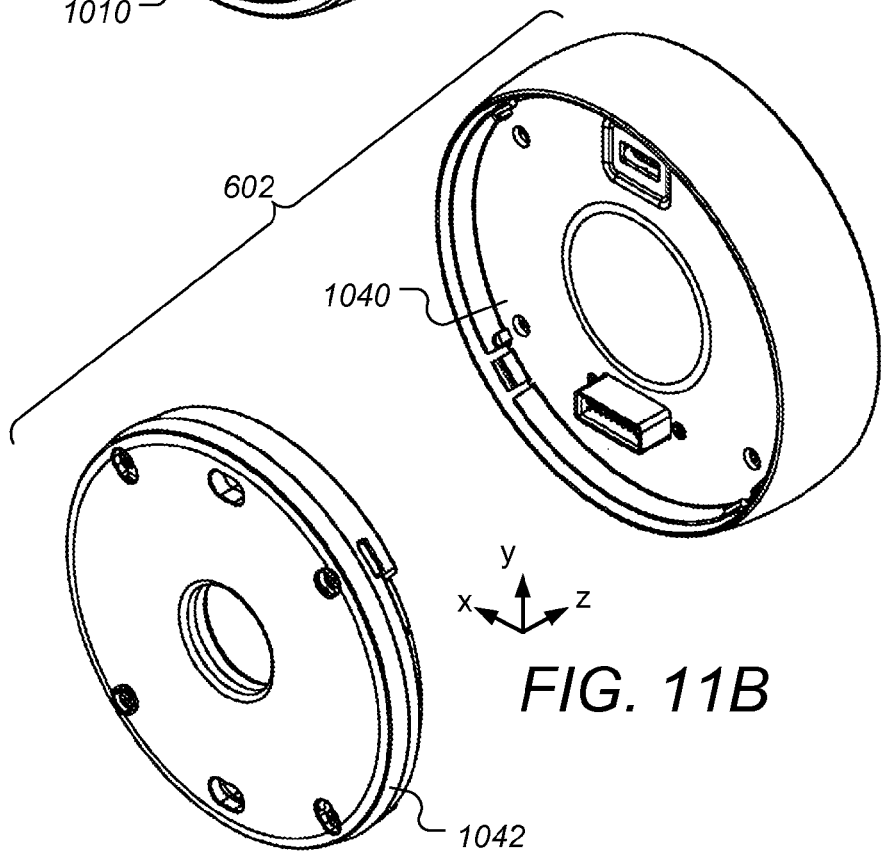

FIGS. 11A-11B illustrate exploded front and rear perspective views, respectively, of the thermostat 602 with respect to its two main components, which are the head unit 1040 and the backplate 1042. Further technical and/or functional descriptions of various ones of the electrical and mechanical components illustrated hereinbelow can be found in one or more of the commonly assigned applications, such as U.S. Ser. No. 13/199,108, incorporated herein by reference. In the drawings shown herein, the "z" direction is outward from the wall, the "y" direction is the toe-to-head direction relative to a walk-up user, and the "x" direction is the user's left-to-right direction.

Figure 11D:
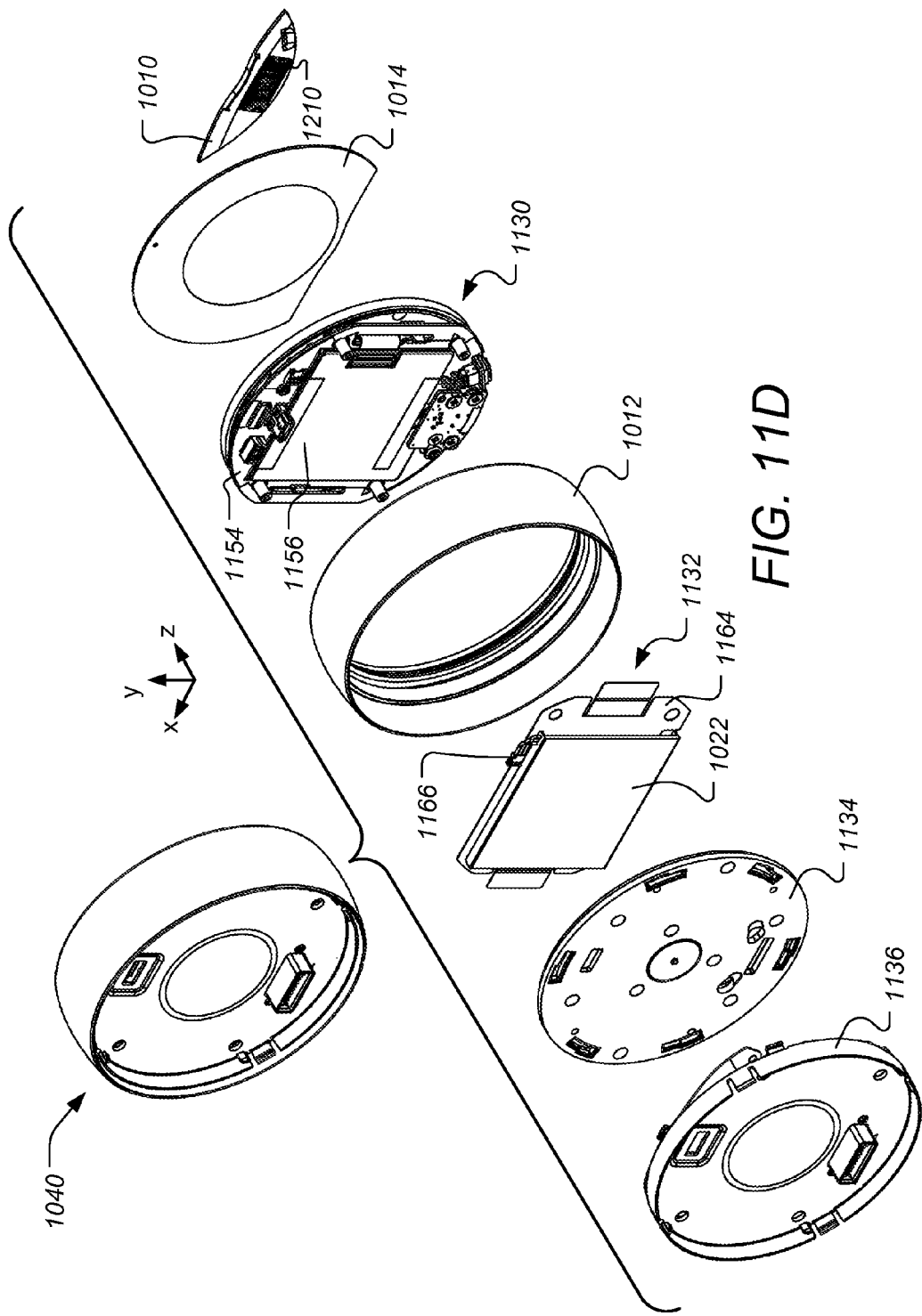

FIGS. 11C-11D illustrate exploded front and rear perspective views, respectively, of the head unit 1040 with respect to its primary components. Head unit 1040 includes, back cover 1136, bottom frame 1134, battery assembly 1132, the outer ring 1012 (which is manipulated for ring rotations), head unit frontal assembly 1130, front lens 1014, and Fresnel lens 1010. Electrical components on the head unit frontal assembly 1130 can connect to electrical components on the back plate 1042 by virtue of ribbon cables and/or other plug type electrical connectors on back cover 1136. Head unit frontal assembly 1130 is secured to head unit back cover 1136 and bottom frame 1134 via four bosses. The outer ring 1012 is thereby held between a bearing surface on the head unit top frame 1152 (shown in FIGS. 11E and 11F, infra) and bearing surfaces on the bottom frame 1134. In particular motion of the ring 1012 in z direction is constrained by flat bearing surfaces on the top frame 1152 and bottom frame 1134, while motion of the ring in x and y directions are constrained by circular rounded surfaces on the bottom frame 1134. According to some embodiments, the bearing surfaces of the bottom frame 1134 and/or the top frame 1152 are greased and/or otherwise lubricated to both smooth and dampen rotational movement for ring 1012. Attached to top frame 1152 is the head unit printed circuit board (PCB) 1154 on which much of the head unit circuitry is mounted including some or all of processing system 1060, display driver 1064, wireless communication system 1066 and battery recharging circuitry 1024 as shown and described with respect to FIG. 10A, as well as one or more additional memory storage components. According to some embodiments, circuitry and components are mounted on both sides of PCB 1154. A shielding can 1156 (visible in FIG. 11D) surrounds most or all of the head unit circuitry and components on PCB 1154 and serves to shield the circuitry and components from electromagnetic interference. Although not visible, according to some embodiments, shielding can 1156 surrounds circuitry and components on both sides of PCB 1154.

Battery assembly 1132 includes a rechargeable Lithium-Ion battery 1022, which for one preferred embodiment has a nominal voltage of 3.7 volts and a nominal capacity of 560 mAh. To extend battery life, however, the battery 1022 is normally not charged beyond 450 mAh by the thermostat battery charging circuitry. Moreover, although the battery 1022 is rated to be capable of being charged to 4.2 volts, the thermostat battery charging circuitry normally does not charge it beyond 3.95 volts. Battery assembly 1132 also includes connecting wires 1166, and a battery mounting film 1164 that is attached to battery 522 using a strong adhesive and to the rear shielding can 1156 of head unit PCB 1154 using a relatively weaker adhesive. By using a weaker adhesive to mount the film 1164 of battery assembly 1132 to shielding can 1156 of the PCB 1154, subsequent replacement of battery assembly 1132 (including battery 522) is facilitated. According to some embodiments, the battery assembly 1132 is user-replaceable.

Figure 11E:
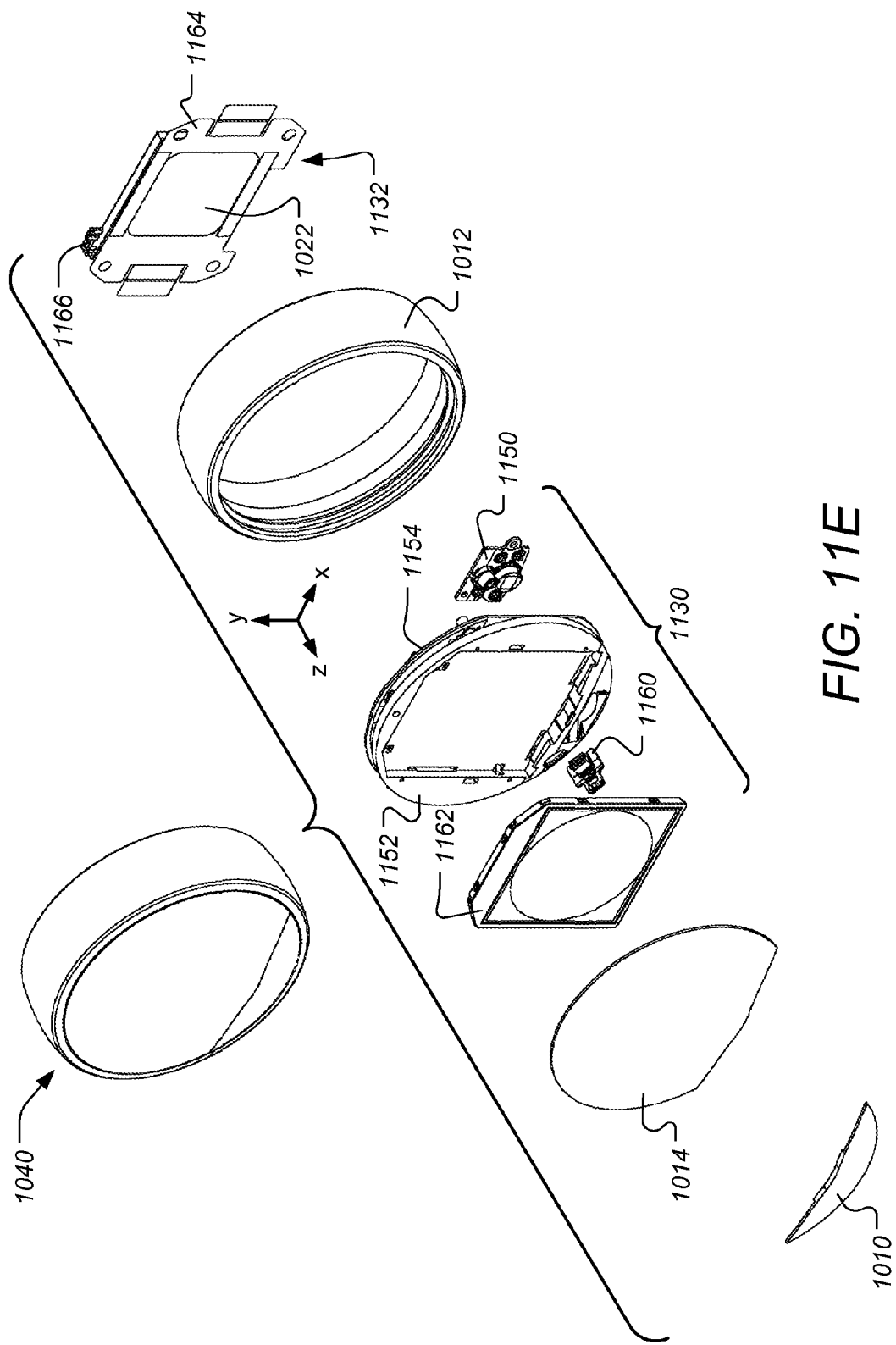
FIGS. 11E-11F illustrate exploded front and rear perspective views, respectively, of the head unit frontal assembly with respect to its primary components, according to some embodiments.
Figure 11F:
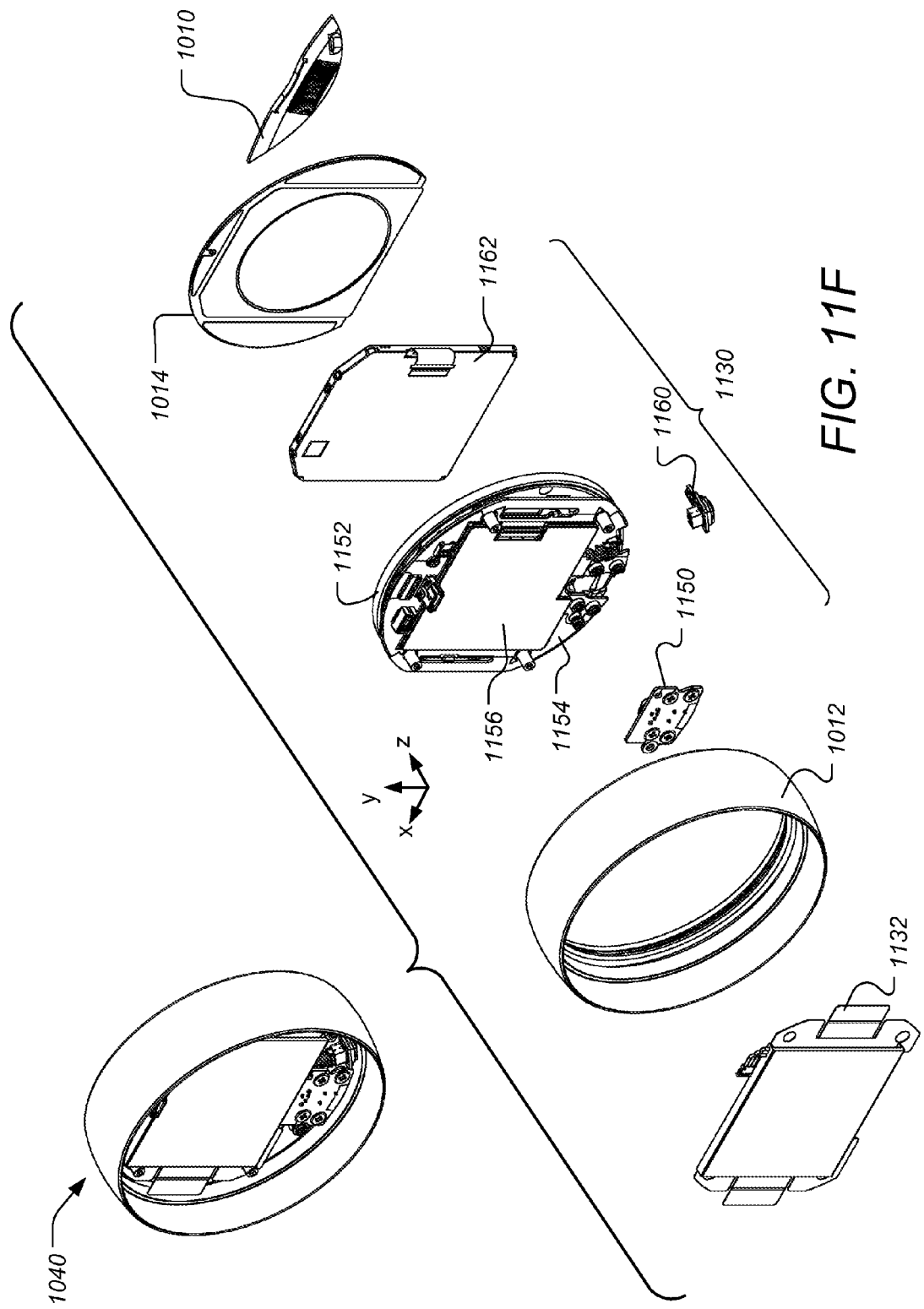

FIGS. 11E-11F illustrate exploded front and rear perspective views, respectively, of the head unit frontal assembly 1130 with respect to its primary components. Head unit frontal assembly 1130 comprises a head unit top frame 1152, head unit PCB 1154, and LCD module 1162. Daughter board 1160 connects to the head unit PCB 1154 and includes an optical finger navigation (OFN) module that is configured and positioned to sense rotation of the outer ring 1012. The OFN module is directed radially outwardly (that is, perpendicular to the z-axis and away from the center of the thermostat). The OFN module uses methods analogous to the operation of optical computer mice to sense the movement of a textured surface on an inner face of the outer ring 1012. Notably, the OFN module is one of the very few sensors that is controlled by the relatively power-intensive head unit microprocessor rather than the relatively low-power back plate microprocessor. This is achievable without excessive power drain implications because the head unit microprocessor will invariably be awake already when the user is manually turning the dial, so there is no excessive wake-up power drain anyway. Advantageously, very fast response can also be provided by the head unit microprocessor. Also visible in FIGS. 11E and 11F is Fresnel lens 1010 that operates in conjunction with two PIR motion sensors mounted on PIR board 1150. Two or more temperature sensors are also located in the head unit 1040 and cooperate to acquire reliable and accurate room temperature data. One of the temperature sensors is located on daughter board 1160 and the other is mounted on the head unit PCB 1154.

FIGS. 11G-11H illustrate exploded front and rear perspective views, respectively, of the back plate unit 1042 with respect to its primary components, according to some embodiments. Back plate unit 1042 comprises a back plate rear plate 1182, a back plate circuit board 1180, and a back plate cover 1170. Visible in FIG. 11G are the HVAC wire connectors 1184 that include integrated mechanical wire insertion sensing circuitry, and relatively large capacitors 1186 that are used by part of the power stealing circuitry that is mounted on the back plate circuit board 1180. According to some embodiments, backplate 1042 includes electronics and a temperature/humidity sensor in housing. Wire connectors 1184 are provided to allow for connection to HVAC system wires, which pass though the large central circular opening 1190, which is visible in each of the backplate primary components. Also visible in each of the backplate primary components are two mounting holes 1192 and 1194 for use in fixing the backplate to the wall. The single top wall-mounting hole 1192 on backplate has been found to allow for self-leveling during installation, thereby further enhancing the ease of a non-expert installation of the thermostat 602. Also visible in FIGS. 11G and 11H are bubble level 1172 and holder 1174 for further facilitating user-installability of the thermostat 602.

Figure 12A:
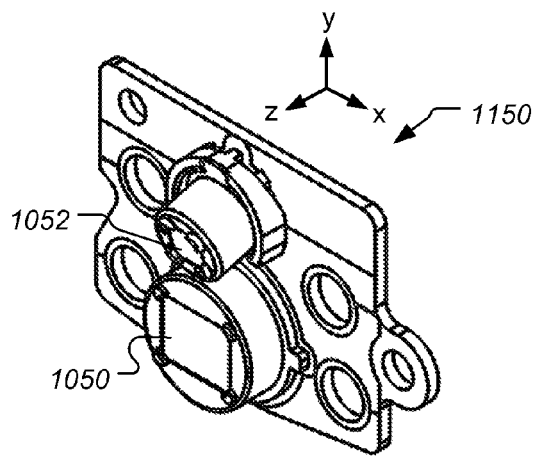
FIGS. 12A-12B show front and rear perspective views, respectively, of a passive infrared sensor board, according to some embodiments.
Figure 12B:
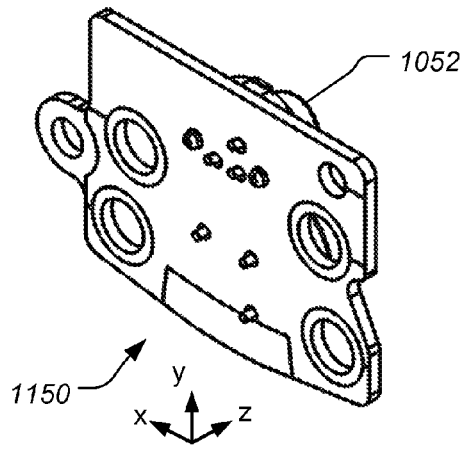
Figure 12C:
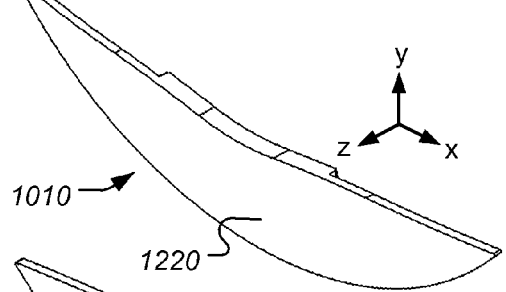
FIGS. 12C-12D show front and rear perspective views, respectively, of a Fresnel lens, according to some embodiments.
Figure 12D:
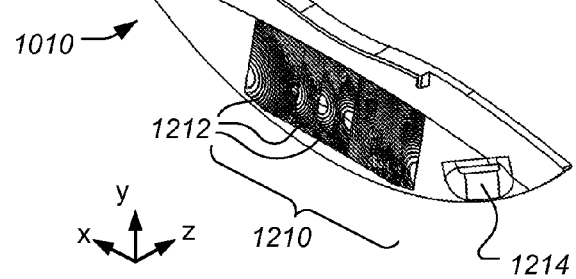

FIGS. 12A-12B show front and rear perspective views, respectively, of the PIR board 1150, according to some embodiments. The larger PIR sensor 1050 is mounted parallel to the wall (i.e. the sensor plane is perpendicular to the z-axis), and is used to detect motion associated with occupancy. The smaller PIR sensor 1052 is located above the larger PIR sensor 1050 and is angled slightly downwards, so as to improve detection of an approaching user. FIGS. 12C and 12D show front and rear perspective views, respectively, of the Fresnel lens 1010, according to some embodiments. As can be seen in FIG. 12C, the front exterior surface 1220 of Fresnel lens 1010 is smooth and curved so as to be integrated with the shape of rest of the outer surface of the thermostat 602, namely the outer surface of the cover 1014 and the front edge of outer ring 1012, as shown in FIGS. 10A-10D, supra. In addition to having the contour of the front surface 1220 of lens 1010 matched to rest of the front surface of thermostat 602, having a color match between the surface 1220 of lens 1010 and the outer portion 1014o of cover 1014 has also been found create a visually pleasing device as well as enhance the user interface by lessening any distraction to the user. According to some embodiments, the outer portion 1014o of cover 1014 is smoked or painted black, and the lens 1010 is made from a black color HDPE material that has an infrared transmission range appropriate for sensitivity to human bodies.

As can be see in FIG. 12D, on the inner, or rear surface of Fresnel lens 1010 the Fresnel lens elements 1210 are formed, including six separate lenslets 1212. Each of the 6 lenslets 1212, is a separate Fresnel lens. Each lenslet should be designed depending on the location and orientation in the system with respect to the PIR sensors, as well as depending on the monitoring area desired to be viewable by the PIR sensors. In selecting the number of lenslets, there is a tradeoff between light collection and size of each zone. It has been found the 6-element lens is suitable for a wide-range of applications, although other numbers and sizes of lenslets can be used. Also visible in FIG. 12D is carved out section 1214 for positioning of a temperature sensor that is mounted on the daughter board 1160 shown in FIGS. 11E and 11F.

Figure 12E:
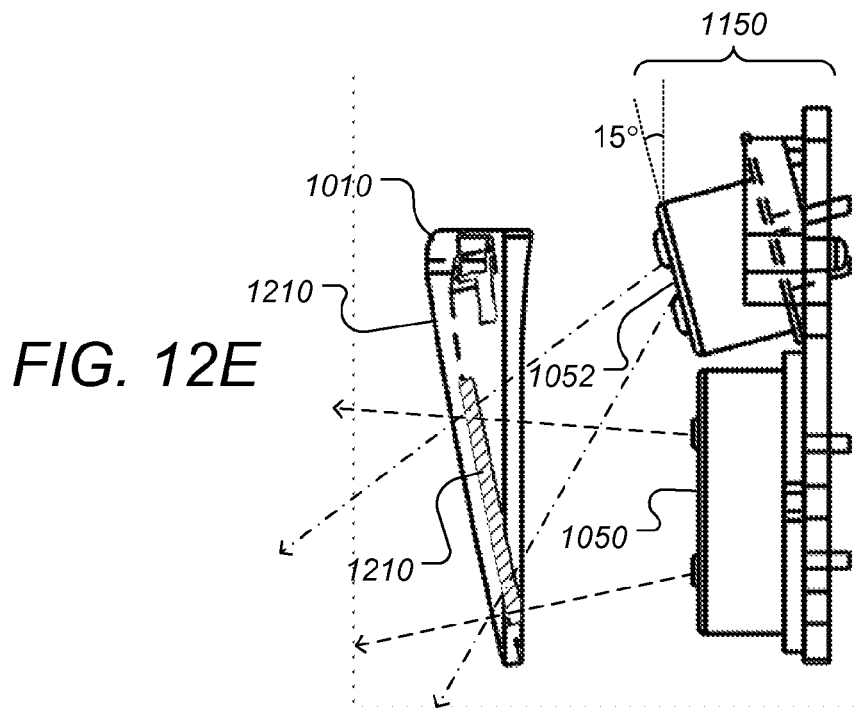
FIGS. 12E-12F are a side view and cross section view, respectively, showing the relative positioning of passive infrared sensors and a Fresnel lens, according to some embodiments.
Figure 12F:
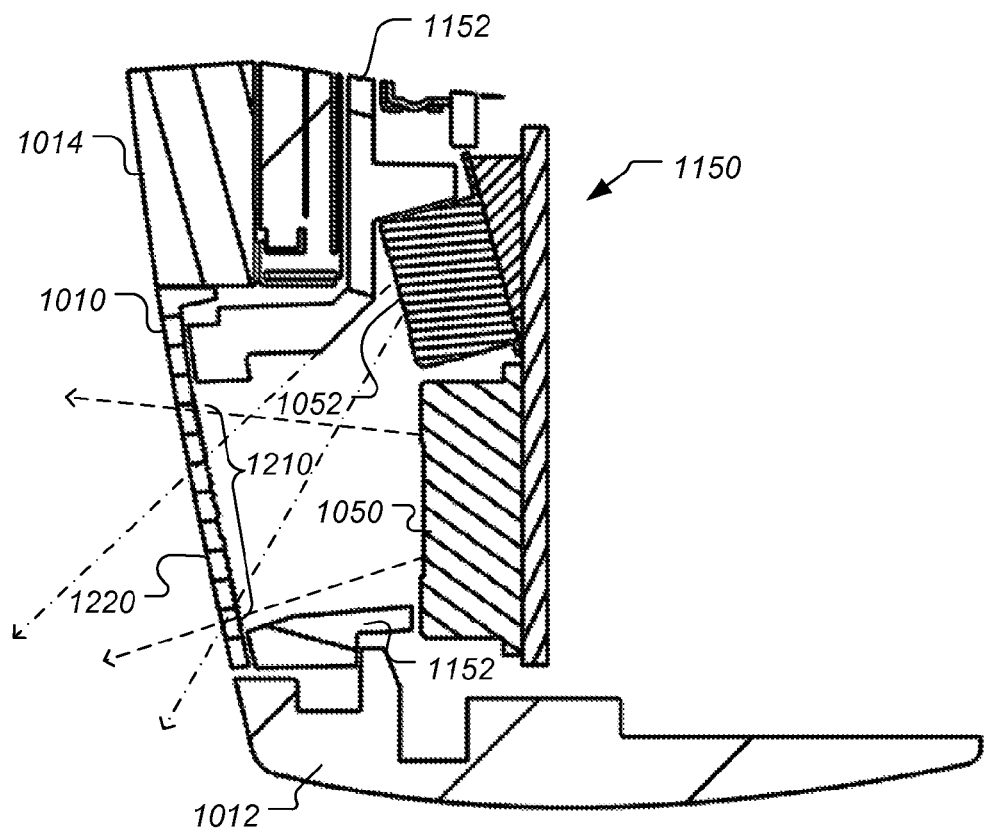

FIGS. 12E and 12F are a side view and cross section view, respectively, showing the relative positioning of the PIR sensors and the Fresnel lens, according to some embodiments. The approximate field of view of the larger PIR sensor 1050 is shown by the dashed arrows, and the approximate field of view of the smaller PIR sensor 1052 is shown by by the dashed-dotted arrows. As can be seen the larger PIR sensor 1050 used for occupancy has a primarily front-facing field of view while the smaller PIR sensor 1052 used for anticipating an user wishing to directly interact with the thermostat has a primarily downward-facing field of view. Note that in the embodiments shown, an internal surface of the top frame 1152 partially obscures the field of view of PIR sensor 1052 so as to further limit the sensor's sensitivity motion relatively close to the thermostat. Note that in the embodiments shown, the PIR sensor 1052 is directed through the same Fresnel lens 1010 as the forward facing PIR sensor 1050. According to some alternate embodiments separate lenslets can be used for the smaller PIR sensor 1052, or an entirely different lens piece could be used.

Thermostat Proximity Thresholds

In thermostats that require power management systems, such as the embodiments described above, it may be desirable to intelligently control the times when an electronic display on a user interface operates in an active display mode. Even in thermostats that have a "C" wire available or are otherwise provided with sufficient external power, it may be still be desirable to intelligently control the electronic display. Users may prefer a thermostat that "activates" when they approach, thus presenting a user interface that seems responsive to a user even before a manipulation event.

In power-conscious systems, advanced electronic displays may be used to give the thermostat a modern and advanced look and feel. Such advanced electronic displays may include backlighting, LCD displays, color displays, graphic and/or raster display capabilities, rapid frame or refresh rates, and/or the like. These features may cause the electronic display to use a substantial amount of power. Additionally, these features may require a microcontroller or microprocessor to be interfaced with the electronic display. Significant processing operations may be required to display graphics, menus, animations, and/or color changes that signify temperature changes. Prior to this disclosure, such advanced electronic displays required external power or a "C" wire connection to the thermostat. Therefore, homes or locations where external power and/or "C" wires were not available were unable to use advanced thermostats without requiring significant electrical upgrades to the home or location. They were instead limited to thermostats with electronic displays that could operate solely on power provided by the call relay wires of the HVAC system.

However, in the thermostat embodiments described herein, advanced electronic displays may be used in conjunction with a rechargeable battery. As previously described, power can be "stolen" from a selected call relay wire, either actively or inactively, and can be used to charge a rechargeable battery and power the thermostat. Many advanced electronic displays, and the microprocessors required to control them, may together require more power than can be instantaneously provided by power stealing. In other words, powering an advanced electronic display and a microprocessor together using power stealing exclusively would likely cause the call relay in the HVAC system to trip, or to interpret the power stealing as an HVAC function call, resulting in inadvertent heating, cooling, fan activation, and/or the like.

Therefore, in power stealing systems, the electronic display should operate in an inactive display mode during times when it can be reliably inferred that a user is not approaching the thermostat in order to interact with thermostat or otherwise view the electronic display. During the inactive display mode, power stealing can supply more power than is needed to operate the thermostat, and the excess power can be used to charge the rechargeable battery. During times when it can be reliably inferred that a user is approaching the thermostat in order to interact with the thermostat or view the electronic display, the electronic display can operate in an active display mode. Although power stealing cannot reliably provide enough average power to operate the electronic display while in an active display mode, the rechargeable battery can provide additional power such that the HVAC system is not tripped.

Using a rechargeable battery enables the use of an advanced electronic display in power stealing systems, but only for limited times. It should be clear that if the electronic display continuously operates in an active display mode, the rechargeable battery would eventually lose its charge and no longer be able to supply sufficient power. Without the rechargeable battery, power stealing could not supply enough power without tripping the HVAC system. Therefore, methods and systems described herein provide technologies that can be used to intelligently control when an electronic display on a user interface should operate in an inactive display mode and an active display mode.

Again, these methods and systems for intelligently controlling the electronic display are not limited to power stealing systems. Environmental control devices having plenty of power available may also benefit from these embodiments. For example, users may prefer an electronic display that activates in a welcoming fashion as they approach. It may be useful turn off the electronic display in an unoccupied room to prevent excess light from being generated and affecting a darker ambience. Generally, it may also be useful to save power, no matter how it is provided, in accordance with environmental and sustainability concerns.

For further details of power management in thermostats, including power stealing and battery re-charging and power conservation, please see U.S. patent application Ser. Nos. 13/034,678, 13/267,877 and 13/267,871, each of which is incorporated herein by reference.

In one embodiment, the thermostat may include a processing system disposed within the housing and communicatively coupled to the user interface. The processing system may include one or more processing functions, as defined above. The processing system may also be configured to communicate with one or more sensors. The one or more sensors may be used to determine ambient air temperature and other environmental conditions. At least one of the sensors may be configured to detect a physical closeness of a user to the user interface of the thermostat. One or more of the sensors can be in operative communication with the processing system, and can be used to determine when a closeness threshold has been exceeded or when a proximity profile is matched by an approaching user. In response, the processing system can cause the user interface to be in an active display mode.

Figure 13:
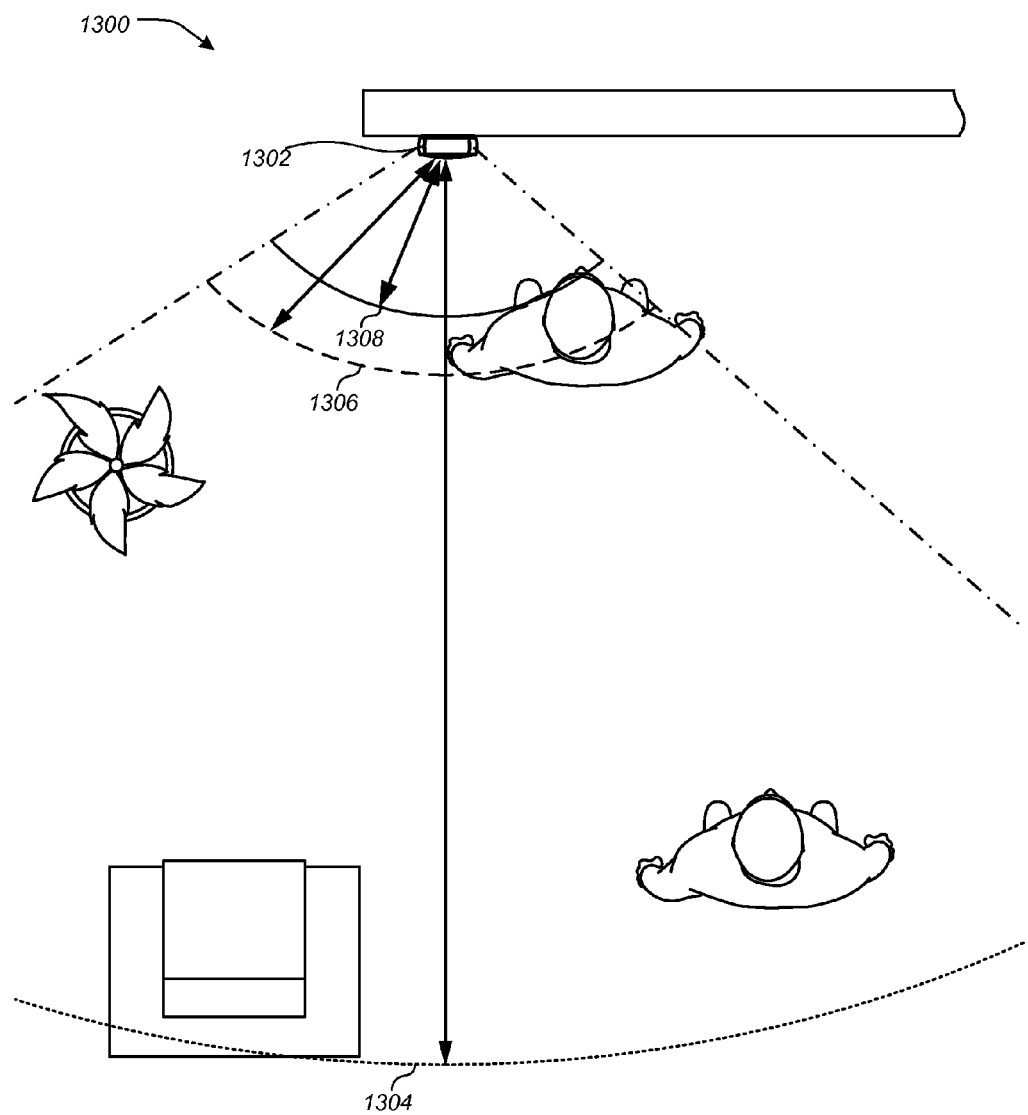
FIG. 13 illustrates an overhead view of an area monitored by a thermostat, according to one embodiment.

FIG. 13 illustrates an overhead view 1300 of an area monitored by a thermostat 1302, according to one embodiment. According to some embodiments, thermostat 1302 is a thermostat such thermostat 100 and/or thermostat 602 shown and described herein. The area monitored by the thermostat 1302 may comprise a room within a building, a hallway, an open living area, and/or the like. The temperature sensors of thermostat 1302 may be configured to detect the ambient temperature of the area being monitored. As illustrated by FIG. 13, various sensors of the thermostat 1302 may have different responsive areas. For example, one of the plurality of sensors may include a responsive area 1304 that has a maximum distance denoted by the dotted line. Similarly, another of the plurality of sensors may include a responsive area 1306 that has a maximum distance denoted by the dashed line. In this example case, the side boundaries of both areas 1304 and 1306 are denoted by the dash-dotted lines. As used herein, the term "responsive area" may include an area in which a phenomenon that a sensor is configured to detect will generate a response by the sensor. For example, a motion detector associated with responsive area 1304 could detect motion within the responsive area 1304 of an object meeting the specifications of the motion detector.

Merely generating a response from a sensor may not be sufficient to infer that a user is approaching the thermostat to view the electronic display. The actual response generated by a sensor when an event occurs within its associated responsive area will in many cases be dependent on the intensity of the event or the distance of the event to the thermostat. For example, if an event occurs along the periphery of the associated responsive area, the response of the sensor may be small. However, if an event occurs closer to the thermostat, the response of the sensor may be larger. Therefore, it is possible to determine a threshold for a sensor response in order to activate the electronic display.

For example, a sensor associated with responsive area 1306 may be used to set a threshold to activate the electronic display. Generally, a threshold can correspond to a voltage/current output, a digital readout, the frequency, or other similar electrical output of a sensor. The threshold may correspond to a certain distance, such as distance 1308, shown in the solid line, for an event having a known intensity. For example, a user approaching the thermostat 1302 with a PIR sensor associated with responsive area 1306 could trip a threshold when coming within distance 1308 of the thermostat 1302. Larger persons or persons moving rapidly may trip the threshold nearer or farther than distance 1308 at the same threshold.

In some embodiments, the threshold may be referred to as a "closeness threshold." When the closeness threshold is been violated, the processing system can be configured to cause the user interface and/or the electronic display to be in the active display mode. Violating the threshold may include a sensor response that is at or above the threshold value. In other embodiments, violating a threshold may include a sensor response that is at or above the threshold value for a predetermined time interval. In yet other embodiments, violating the threshold may require a sensor response to cross the threshold a predetermined number of times.

In embodiments similar to the thermostats described in FIGS. 4A-4B, two different processing functions may be used. The first processing function may include a first processor that is configured to detect when the closeness threshold has been exceeded. The first processing function may then wake the second processing function (which may include a second processor) from a low-power mode in response to the closeness threshold being exceeded. Generally, the second processor may then cause the electronic display to operate in the active mode. The first processing function may include a low-power microcontroller, such as an MSP430, or an STM32L 32-bit ultra-low power ARM-based microprocessor available from ST Microelectronics. The second processing function may include a higher power microprocessor. The second processing function may operate in a sleep mode, or low power mode, that requires less power than can be reliably supplied by power stealing. The first processing function may operate predominantly in a state that requires less average power than can be supplied by power stealing. When the second processing function is operating in the active mode and the electronic display is operating in the active display mode, these two operations together may require more average power than can be supplied by power stealing.

Although the discussion above concerning thresholds only uses single-value to thresholds, this is merely exemplary. Other embodiments may use multiple thresholds to form what may be called a "proximity profile." A proximity profile may include multiple sensor readings. In one embodiment, a proximity profile may be comprised of a single threshold from a single sensor, while in other embodiments, a proximity profile may be comprised of characteristic responses from multiple sensors. Multiple sensors may be used to further generate an approach signature for users in each particular environment. For example, motion sensors, heat sensors, sound sensors, and/or biometric sensors may all provide responses to the processing function. In turn, the processing function may analyze all of these responses to determine whether they sufficiently match an expected approach signature. If these responses sufficiently match, then the processing function may determine that a user is approaching the thermostat to view the electronic display. Matching the proximity profile may be approximate, and may depend on each particular environment. A proximity profile may be matched if sensors provide responses within a certain range and within a certain delay interval between other sensors providing responses in certain ranges.

Because every environment can be different, the processing system may be configured to intelligently define the proper threshold and possibly to continuously refine the threshold throughout the lifetime of the thermostat to adapt to changing user patterns, locations, and/or environmental conditions within the area being monitored. Turning back to FIG. 13, a proximity sensor associated with responsive area 1306 may be used to both detect threshold violations and to define and refine the threshold. As used herein, the term "proximity sensor" may be used to refer to any sensor configured to detect a physical closeness of a user to the user interface of the thermostat. A proximity sensor may include a PIR motion detector, a near field PIR motion detector, and other similar sensors. According to some embodiments, the proximity sensor is a downwardly directed PIR sensor such as sensor 1052 shown and described herein is used. According to one particular embodiment, a proximity sensor may be termed an "active proximity sensor" that can include sensors configured to emit electromagnetic radiation and to receive reflections of electromagnetic radiation from nearby objects. In one embodiment, a proximity sensor may include commercially available sensors such as the Si1142 from Silicon Labs, and/or the PYD1998, PYD5731, and/or PYD1794 from Excelitas.

In one embodiment, the processing system can be configured to automatically adjust the closeness threshold based at least in part on historical physical closeness events as detected by one or more proximity sensors. In one embodiment, a "physical closeness event" may include any response recorded by a proximity sensor that may be indicative of a user being within the responsive area of the proximity sensor. In another embodiment, a physical closeness event may include a series of responses from the proximity sensor no user is detected within the responsive area. This second embodiment defines physical closeness events in this manner because a threshold may be set slightly above an ambient noise level, as will be described further below.

In one exemplary situation, a proximity sensor having responsive area 1306 may periodically provide sensor readings to the processing system for storage and analysis. When users are not found within the responsive area 1306, an ambient noise level may be recorded. When users enter the responsive area 1306, a response level may be recorded. Using a history of physical closeness events, the processing system may set a threshold somewhere between the ambient noise level and the response level associated with a user.

In one embodiment, distinguishing between an ambient noise level and a user response level may be difficult using only a single sensor. In this embodiment, one or more additional sensors may be used to distinguish between noise responses and user-based responses in the proximity sensor. For example, a proximity sensor associated with responsive area 1306 may be used in conjunction with a physical manipulation sensor on the thermostat 1302 and/or a second sensor associated with responsive area 1304. Generally, each set of responses from the proximity sensor may be analyzed in conjunction with responses from the one or more additional sensors to determine whether the set of responses should be classified as noise or as a user-based response.

Figure 14:
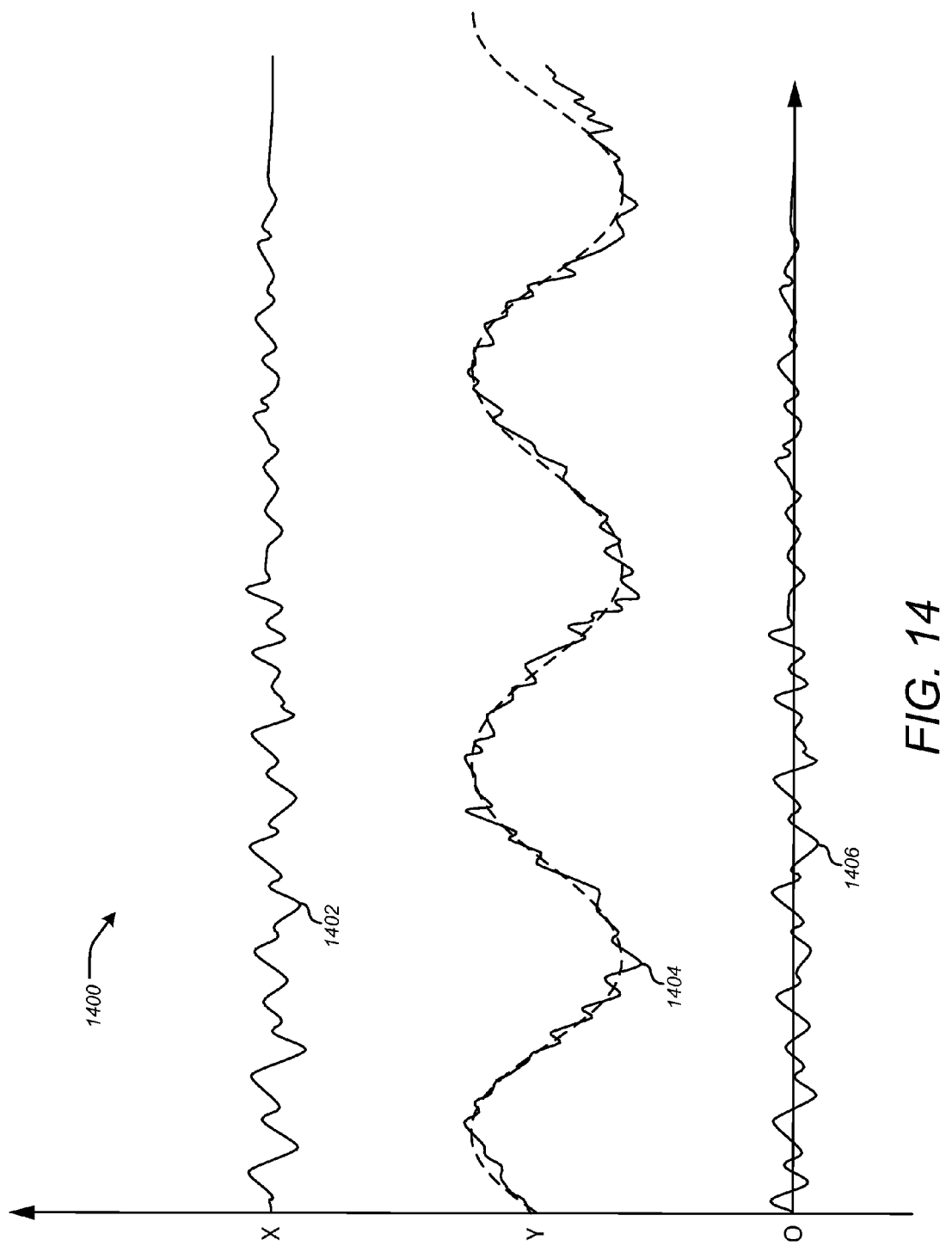
FIG. 14 illustrates a representation of various types of raw sensor responses over a time period, according to one embodiment.

FIG. 14 illustrates a representation 1400 of various types of raw sensor responses over a time period, according to one embodiment. A first type of sensor may provide a response 1402, while a second type of sensor may provide a response 1404. According to some embodiments the sensors having responses 1402 and 1404 are of the same type, such as both being PIR sensors, but they are dimensioned and/or positioned differently, such as in the case of PIR sensors 1050 and 1052 shown and described herein. The first response 1402 may be characterized as an ambient noise level centered around the value X. The second response 1404 may be characterized as an ambient noise level that varies sinusoidally over time with an average value of Y. In both of these situations, a baselining procedure may be helpful in the thresholding operations described above. In the case of response 1402, the average value can be subtracted from the actual sensor response to provide an ambient noise level response that is centered around zero. Similarly in the case of response 1404, a high pass filter may be utilized to filter out the sinusoidal drift, and the average value Y may be subtracted from the resulting response to provide an ambient noise level response that is centered around zero. Response 1406 may be the result of either one of these operations. It will be understood that other raw sensor responses may also require some sort of baselining procedure. In light of this disclosure, one having skill in the art could readily follow the example of these procedures described above and apply them to various other sensor types.

Figure 15:
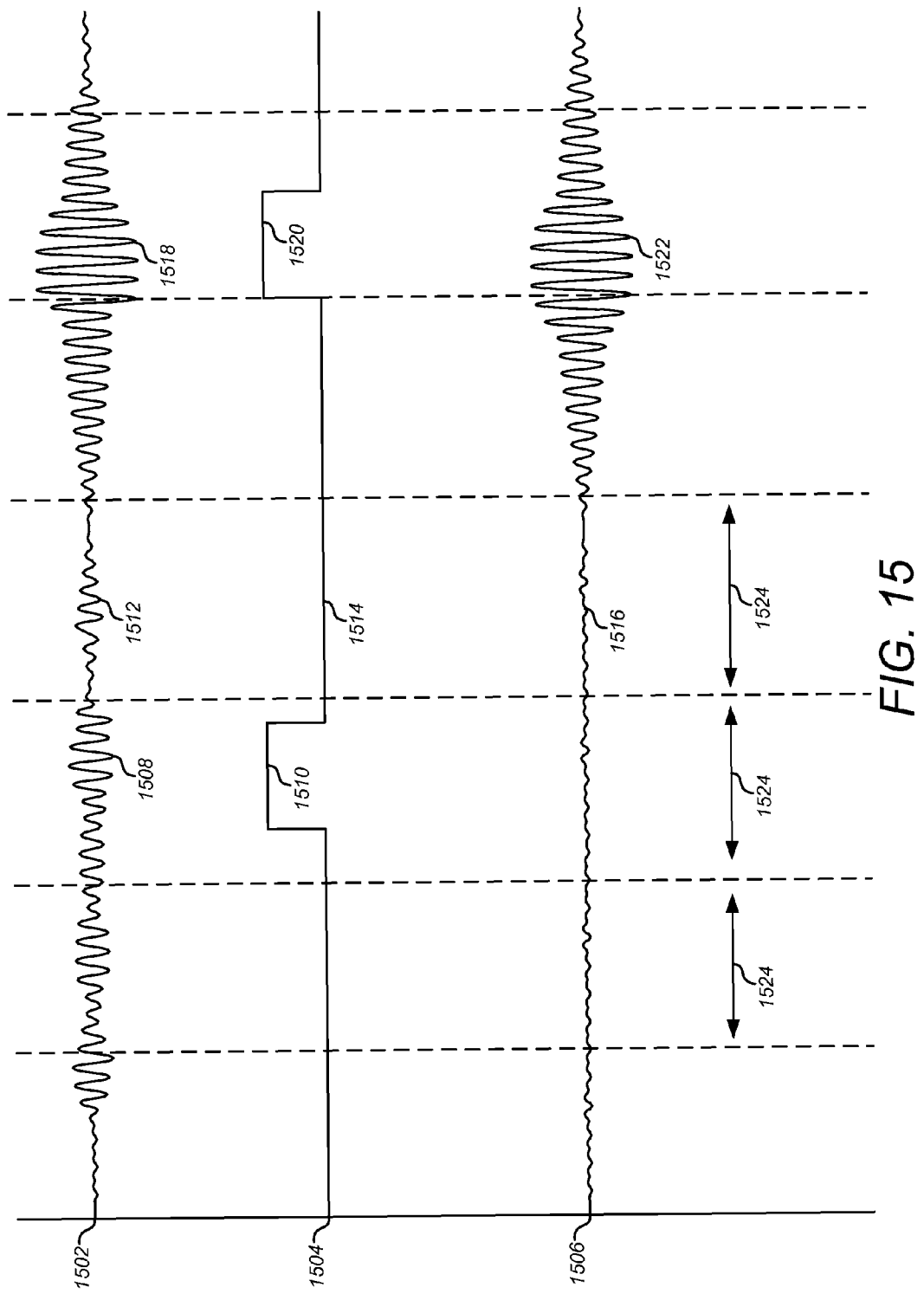
FIG. 15 illustrates a representation of the individual sensor responses for three distinct sensors over the same time interval, according to one embodiment.

FIG. 15 illustrates a representation 1500 of the individual sensor responses for three distinct sensors over the same time interval, according to one embodiment. Response 1502 may be associated with a first proximity sensor, while response 1506 may be associated with a second proximity sensor. In this embodiment, the first proximity sensor may be associated with a responsive area that is smaller than a responsive area associated with the second proximity sensor. The first proximity sensor may comprise a near-field PIR motion sensor, or an active sensor that is configured to emit electromagnetic radiation and receives reflections of the emitted electromagnetic radiation. The second proximity sensor may comprise a regular PIR motion sensor. According to some embodiments, the first and second proximity sensors are PIR sensors 1052 and 1050 that are dimensioned and/or positioned differently (as shown and described herein), such that sensor 1052 is associated with a smaller responsive area than that of sensor 1050. Response 1504 may be associated with a manipulation sensor coupled to a user input of the thermostat. In one embodiment, the manipulation sensor may comprise an optical sensor configured to detect rotation of a ring around the perimeter of the thermostat.

In this embodiment, the manipulation sensor and the second proximity sensor may be used to characterize the responses of the first proximity sensor. In one example, the proximity sensor may detect an event 1508 that would seem to indicate a user approaching the thermostat. Turning to the other sensors, the manipulation sensor may also detect an event 1510 that coincides with the event 1508 and indicates that a user has physically manipulated the user interface of the thermostat. Response 1506 associated with the second proximity sensor does not show an event during the same time interval, which would indicate that a user manipulated the thermostat outside of the range of the second proximity sensor. This situation may occur when the user is standing to the side of the thermostat or behind a wall to which the thermostat is mounted. In analyzing responses 1502, 1504, and 1506, the processing function may determine that event 1508 on the proximity sensor is associated with a physical closeness event and an actual manipulation of the thermostat, and is therefore not ambient-level noise.

In another example, response 1512 associated with the first proximity sensor may be difficult to classify as either a user-based response or an ambient noise response. By examining responses 1514 and 1516 associated with the other two sensors, the processing system may determine that event 1512 corresponds to ambient noise, because no user was detected by the other two sensors.

In yet another example, event 1518 associated with the first proximity sensor seems to indicate that a user has approached the thermostat. Similarly, event 1520 associated with the manipulation sensor and event 1522 associated with the second proximity sensor also seem to indicate that a user has approached the thermostat. Therefore, in this case, the processing system may readily determine that event 1518 corresponds to a user-based event rather than ambient noise.

In yet another example (not shown) an event similar to event 1508 could occur in response 1502 associated with the first proximity sensor. Around the same time, response 1506 of the second proximity sensor could also show event similar to event 1522. Both of these events would seem to indicate a user approaching the thermostat. However, response 1504 associated with the manipulation sensor could show event similar to event 1514 indicating that the user did not manipulate the thermostat. The processing function could then determine that the situation should not be interpreted as a user intending to view the thermostat. In another embodiment, the processing function could also determine that this situation indicates that the user intended to view the electronic display of the thermostat without intending to manipulate the user interface physically. The processing function could then distinguish between these two situations using historical data.

These examples illustrate various ways to determine whether responses of a proximity sensor should be classified as ambient noise or a user approach. These determinations can be used to set a closeness threshold, which when violated would cause the electronic display to operate in the active display mode. In one embodiment, the various sensor readings can be divided into time intervals 1524. Portions of response 1502 of the first proximity sensor could be excluded if they occur around the same time as responses from one or more of the other sensors. For example, the time intervals that include event 1508 and event 1518 could be removed from consideration, while leaving the time interval containing event 1512. An average value, maximum value, or other statistical characterization of the response within each remaining time interval could be used to set a threshold. In one embodiment, the threshold can be set at the maximum value from the remaining time intervals, signifying the maximum ambient noise level measured. In another embodiment, the threshold can be set at a predetermined level above the average value of the responses in the remaining time intervals. For example, a threshold could be set 20% above the average value of the remaining responses. In other embodiments, a closeness threshold could be set in relation to the responses in the remaining time intervals according to other known methods in light of this disclosure.

Figure 16:
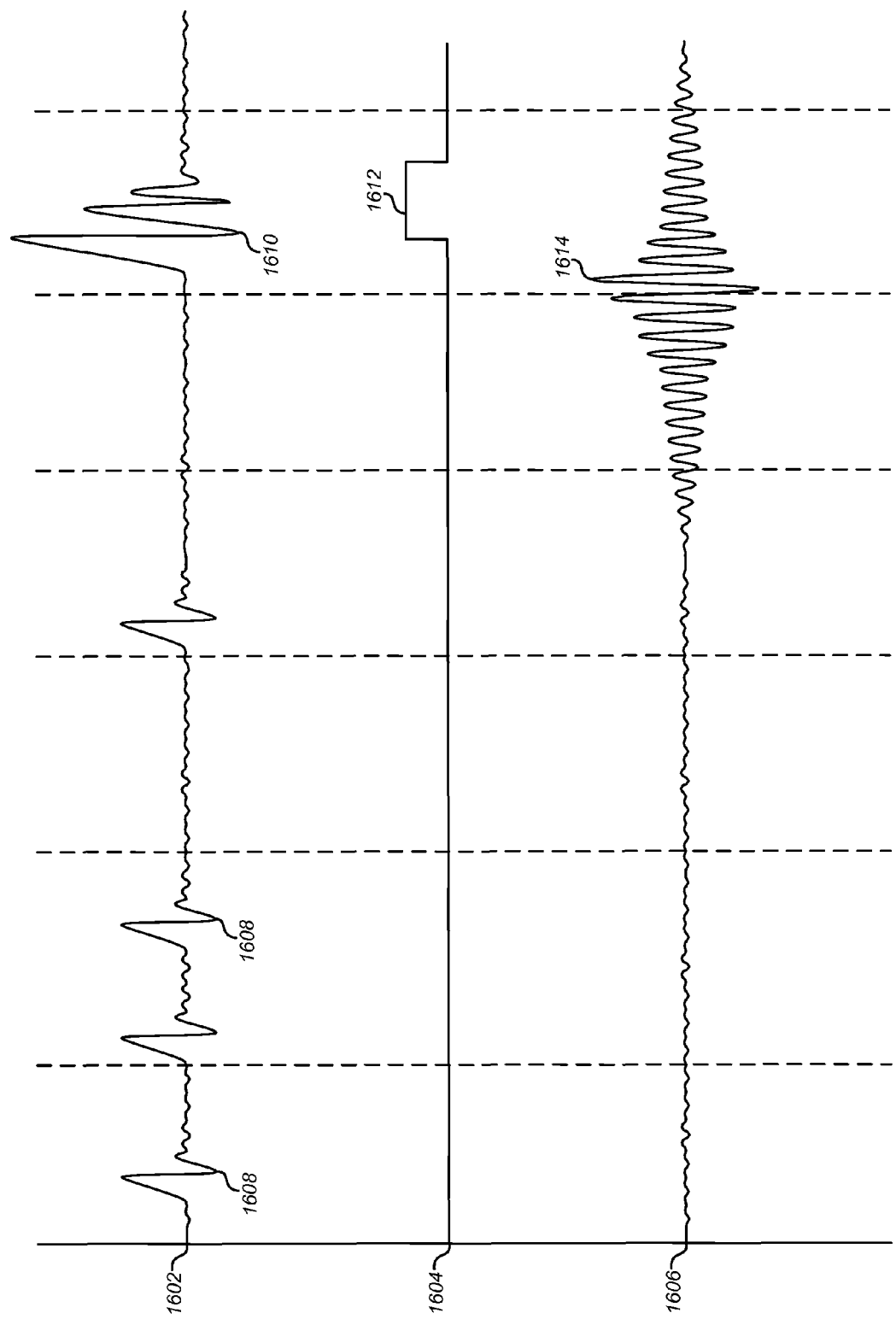
FIG. 16 illustrates a representation of the individual sensor responses from three distinct sensors, where the first proximity sensor includes abnormalities in the noise profile, according to one particular embodiment.

While FIG. 15 illustrated a first proximity sensor with an approximately Gaussian noise distribution centered around a baseline value, other noise profiles may exist in different sensors. FIG. 16 illustrates a representation 1600 of the individual sensor responses from three distinct sensors, where the first proximity sensor includes abnormalities in the noise profile, according to one particular embodiment. Response 1602 may be associated with the first proximity sensor, and may include events 1608 that correspond to noise abnormalities. Events 1608 may in some cases strongly resemble a user-based response that would seem to indicate an approaching user. In one particular embodiment, events 1608 may result when the first proximity sensor is not serviced at a predetermined time interval. In another embodiment, events 1608 may result from the periodic discharge of sample-and-hold circuits. In yet another embodiment, events 1608 may result from various other periodic sensor-based operations specific to each type of sensor.

As was the case in the discussion related to FIG. 15, events 1608 can be properly characterized as noise rather than user-based events by examining the responses 1604, 1606 from additional sensors. Again, response 1604 may be associated with a manipulation sensor, and response 1606 may be associated with a second proximity sensor. Events 1608 may be properly classified as noise rather than user-based events because responses 1604 and 1606 showed no corresponding activity. In contrast, events 1610 may be classified as a user-based event by examining events 1612 on response 1604 along with event 1614 on response 1606.

When using sensors with noise event similar to events 1608, other precautions may be taken, for example, an average value for each time interval may be used rather than a maximum value. The closeness threshold could then be set a predetermined percentage above the maximum noise event level. Alternatively, the closeness threshold could be set a predetermined percentage below the minimum or maximum user-based response level. Either of these types of responses can be referred to as a physical closeness event, depending on the particular embodiment.

In one embodiment where the thermostat comprises a backplate and a head unit and where the backplate includes a first processor and the head unit includes a second processor, the operations of determining, adjusting, and testing the closeness threshold may be divided between the two processors. In one embodiment, the backplate processor may collect data from each of the sensors and provide the data periodically to the head unit processor. The backplate processor may first baseline the sensor data to be centered around zero. The backplate processor may also process the sensor data such that only a maximum, average, median, etc. value is sent for each of a predetermined number of time intervals. The head unit processor may then analyze the sensor data—either raw or processed—and determine a closeness threshold. The closeness threshold may then be sent back to the backplate processor. The backplate processor may then monitor one or more of the sensors, such as a proximity sensor to determine when and if the threshold is violated. When the threshold is determined by the backplate processor to be violated, the backplate processor can wake the head unit processor from a low-power mode, and the head unit processor can instruct the electronic display to operate in an active display mode, if it is not already operating in an active display mode. This arrangement may be advantageous in power-stealing systems to save power.

Figure 17:
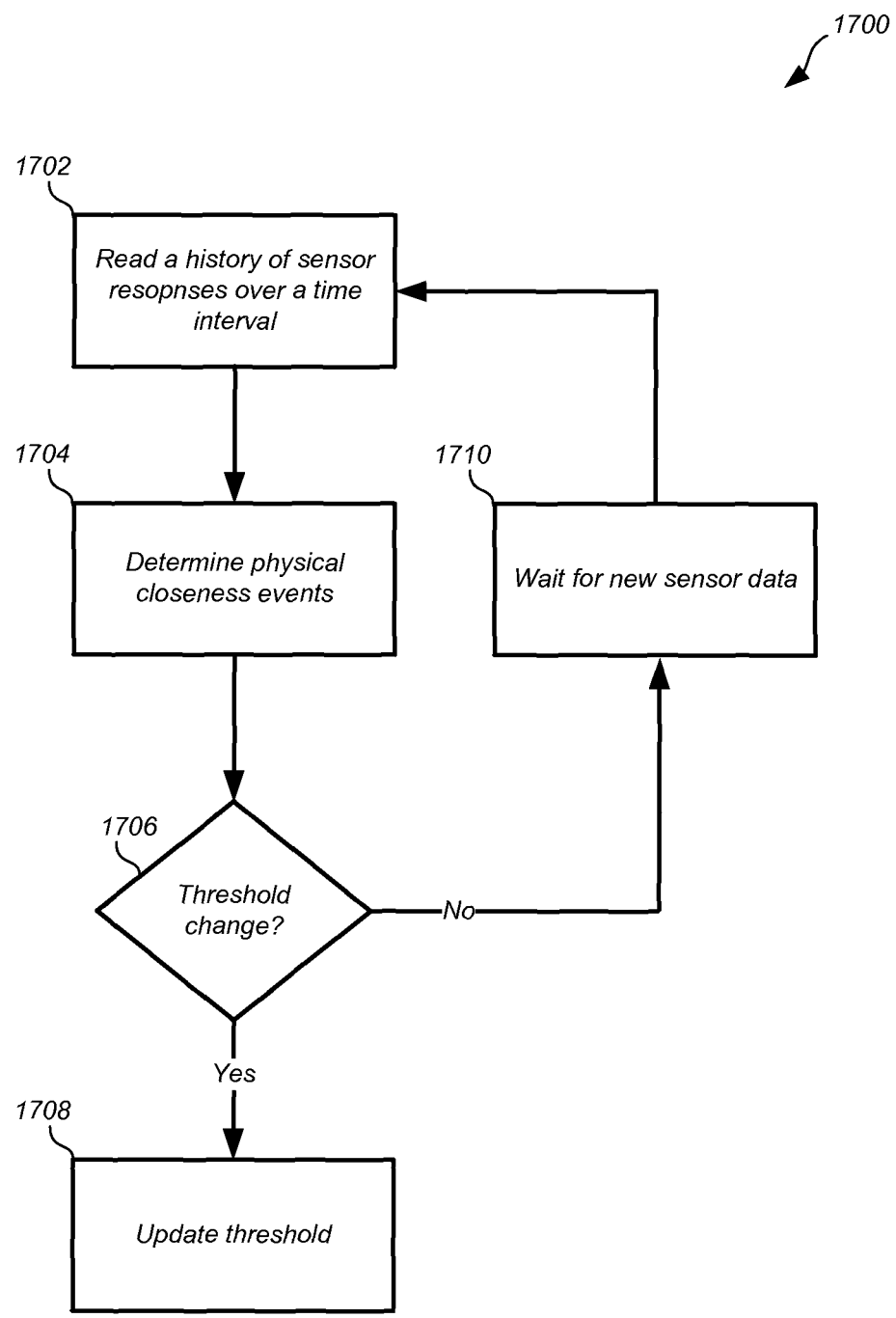
FIG. 17 illustrates a simplified flowchart of a method for optimizing the operation of a user interface of a thermostat by updating a closeness threshold, according to one embodiment.

FIG. 17 illustrates a simplified flowchart 1700 of a method for optimizing the operation of a user interface of a thermostat by updating a closeness threshold, according to one embodiment. The method may include reading a history of sensor measurements over a time interval (1702). In one embodiment, the time interval may be periodic, such that the head unit processor may wake up in response to periodic transmissions from the backplate processor. In another embodiment, the time interval may be based on transitions between a sleep state and an active state of the head unit processor. For example, the backplate processor may send data to the head unit processor each time the head unit processor wakes up, even though this may not be defined by a regular periodic interval, particularly when the head unit processor wakes up to service temperature events and/or user interface manipulation events.

The method may also include determining physical closeness events (1704). In one embodiment, physical closeness events may correspond to sensor responses corresponding to users approaching the thermostat to view the electronic interface. In another embodiment, physical closeness events may correspond to sensor responses corresponding to users actually manipulating the user interface. As described above, physical closeness events associated with a single selected sensor may be determined by examining the responses of other sensors during nearby time intervals. In one embodiment, physical closeness events may then be eliminated from the history of sensor measurements and the threshold may be calculated based on the ambient noise level. In another embodiment, physical closeness events may then be isolated from the history of sensor measurements, and the threshold may be calculated based on user-based response levels.

The method may additionally include determining whether the threshold should be changed (1706). In one embodiment, the threshold need only be changed if the new threshold calculated by the history of sensor measurements over the time interval varies by a certain percentage. For example, the threshold need not change if the new threshold is only 1% more or less than the existing threshold. In another embodiment, the threshold may be updated if there is any change. In yet another embodiment, the newly calculated threshold may be averaged with previous thresholds to lessen the effect of measurement abnormalities. In another embodiment, thresholds that vary by more than a predetermined percentage may be discarded. For example, if a newly calculated threshold is double the existing threshold, the newly calculated threshold may be discarded. The newly calculated threshold may be assigned a weighted value in relation to previous thresholds and the threshold may be updated accordingly. For example, threshold calculated at night may be weighted less than threshold calculated during the day when more activity is expected. In light of this disclosure, one having skill in the art could combine or alter these various methods of determining when and how a threshold should be updated in accordance with the spirit of these embodiments.

If it is determined that the threshold should change, the method may further include updating the threshold (1708). The updated threshold may simply overwrite the previous threshold and a memory location. Alternatively, the updated threshold may be stored in a vector of thresholds such that a history of thresholds is maintained. The history of thresholds may be used to calculate and/or test future calculated thresholds. On the other hand, if it is determined that the threshold should not change, the method may further include waiting for new sensor data (1710). In embodiments where the head unit processor computes new thresholds and determines whether a current threshold should be updated, the head unit processor may enter a sleep state at this point. The backplate processor may then monitor new sensor data and either wake the head unit processor at a regular time interval, or provide a new history of sensor measurements when the head unit processor wakes for other reasons.

In one embodiment, the closeness threshold may be automatically adjusted based at least in part on the joint processing of a number of different factors. One factor may include a historical plurality of closeness events as detected by at least one of the plurality of sensors. Another factor may include a historical plurality of user interface manipulation events, in which the user has actually manipulated the user interface. The closeness threshold can be made less restrictive if there is a higher correlation between physical closeness events and the manipulation events. In other words, a threshold may be lowered if the responses of a first proximity sensor correspond to users actually manipulating the thermostat's user interface. Likewise, the closeness threshold may be made more restrictive if there is a lesser correlation between the physical closeness events and the manipulation events. This may correspond to situations where users often pass by the thermostat without stopping to manipulate the user interface. In these cases, there may not be any reason to turn on the electronic display, and the threshold may be raised in order to require a user to come closer to the thermostat before it enters into the active display mode.

Although the above discussion focuses on a single threshold, it should again be understood that these operations may also apply to a proximity profile that is constructed from one or more sensor responses. In this case, the thresholds or intervals related to each sensor that make up a proximity profile may be updated and adjusted individually in the same manner as described above for single thresholds.

Figure 18:
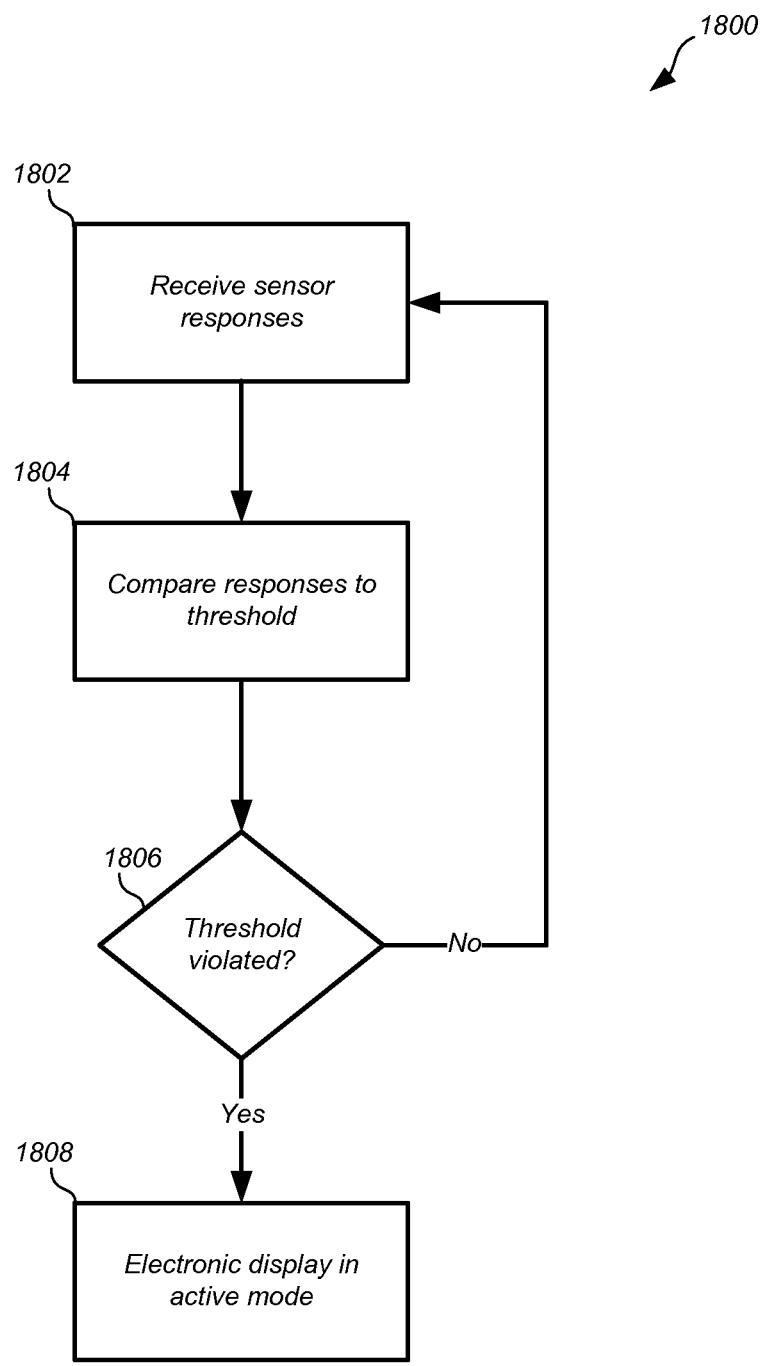
FIG. 18 illustrates a simplified flowchart of a method for determining whether a closeness threshold is violated, according to one embodiment.

FIG. 18 illustrates a simplified flowchart 1800 of a method for determining whether a closeness threshold is violated, according to one embodiment. The method may include receiving sensor responses (1802). The sensor responses may include proximity sensors and/or other sensors as described herein. The method may also include comparing inputs to a threshold (1804). This comparison may be made by a backplate processor without waking a head unit processor or turning on the electronic interface. This comparison may be made periodically for a set of sensor responses, or may be made every time sensor responses are provided to the processing system.

The method may further include determining whether the threshold is violated (1806). In one embodiment, the threshold may be violated if one or more of the sensor responses is greater than or equal to the closeness threshold. In another embodiment, the threshold may be violated if one or more of the sensor responses is less than or equal to the closeness threshold. In another embodiment, the threshold may be violated if a number of sensor responses exceed a number represented by the threshold. In yet another embodiment, the threshold may be violated when the frequency of sensor responses exceeds a threshold frequency, or the number of threshold responses within a time interval exceeds a threshold number. Other methods of violating a threshold are also contemplated by various embodiments, but are not explicitly disclosed here for brevity. However, these various embodiments would be clear to one having skill in the art in light of this disclosure.

If it is determined that a threshold is violated, the method may additionally include causing the electronic display to operate in an active display mode (1808). In one embodiment, if the electronic display is already operating in an active display mode, then no action need be taken. However, if the electronic display is not operating in an active display mode, then the processing system may cause the electronic display to transition into an active display mode. On the other hand, if the threshold is not violated, the processing system may wait for additional sensor responses to compare to the threshold.

Figure 19:
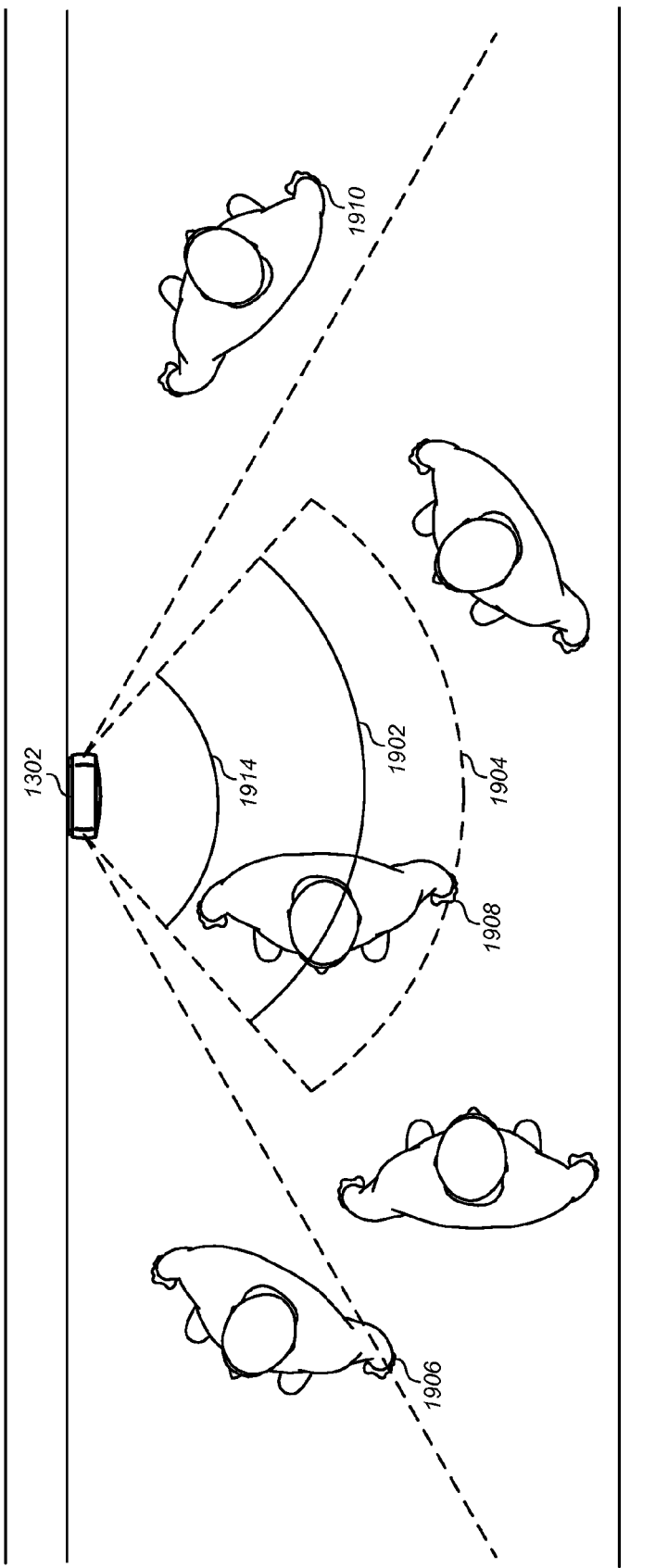
FIG. 19 illustrates an overhead view of a busy hallway problem.

FIG. 19 illustrates an overhead view 1900 of a special circumstance referred to herein as the "busy hallway problem." This problem may be characterized by a large number of physical closeness events within a predetermined time interval that do not correspond to a user wishing to view or manipulate the user interface of the thermostat. The situation may arise in a "busy hallway" or in any other area where people often walk by the thermostat without wanting to interact with the thermostat. As shown in FIG. 19, a threshold may be set corresponding to a distance for a first proximity sensor with responsive area 1904. Multiple persons, such as person 1906, person 1908, and or person 1910, may walk by the thermostat 1302 in the hallway without intending to view or interact with the user interface.

The problem with this situation is that the thermostat may be fooled into believing that each user approach should cause the electronic display to operate in the active display mode when they violate or exceed the closeness threshold of at least one proximity sensor. If the electronic display were to in fact transition to the active display mode each time the threshold was violated in this situation, the rechargeable battery could eventually drop below a predetermined level corresponding to reliable thermostat operations. In other words, if the electronic display turns on too often it will drain the rechargeable battery below reliable levels.

In order to solve this problem, a predetermined activity threshold may be set. The predetermined activity threshold may correspond to a maximum number of times within a predetermined time interval where the electronic display is allowed to transition into the active state without a corresponding manipulation event of the user interface. In other words, a limit may be set as to the number of times the electronic display can turn on over the course of, for example, 12 hours, without a user actually manipulating the user interface. When this activity threshold is violated, the processing system can require a manipulation event before causing the electronic display to operate in the active display mode.

Additionally, the closeness threshold can be altered such that it is more restrictive when this activity threshold is violated. Thus, the busy hallway situation of FIG. 19 will result in a more restrictive threshold than would normally be computed. For example, the normal closeness threshold calculated in absence of an activity threshold may correspond to distance 1902. In contrast, the closeness threshold may be restricted to distance 1914 when violations of the activity threshold are taken into consideration.

Therefore, in one embodiment the closeness threshold can be automatically adjusted based on a tracked number of times that the electronic display was caused to be in the active display mode in response to physical closeness events over a predetermined time interval. The closeness threshold can be made more restrictive if the tracked number of times was greater than a predetermined activity threshold. This may effectively reduce excessive entry of the electronic display into the active display mode responsive to physical closeness events.

Figure 20A:
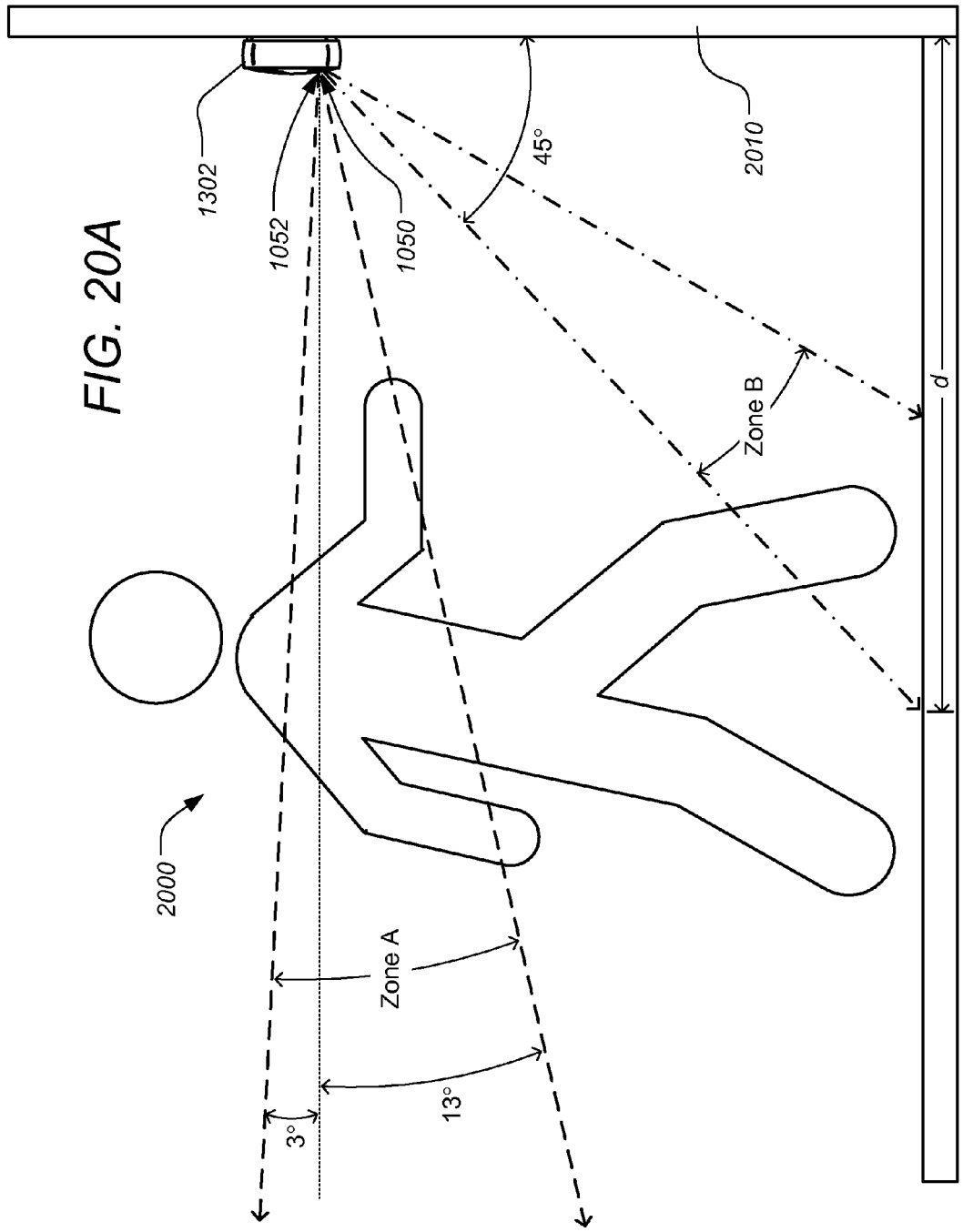
FIGS. 20A-20B are diagrams illustrating fields of view for a forward looking PIR sensor and a downward looking PIR sensor, according to some embodiments.
Figure 20B:
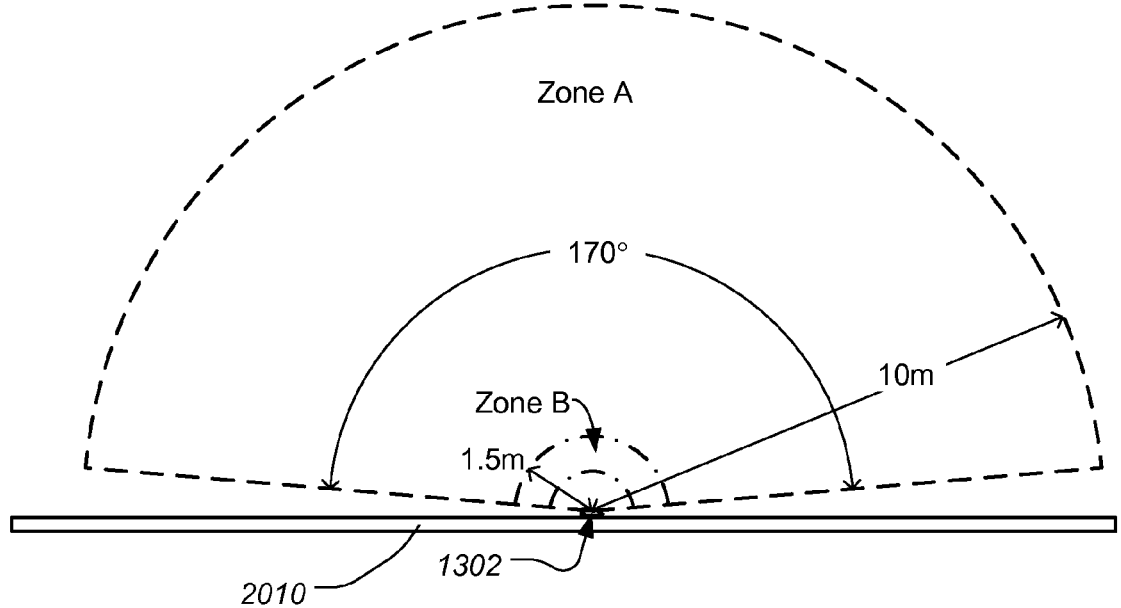

FIGS. 20A-20B are diagrams illustrating fields of view for a forward looking PIR sensor and a downward looking PIR sensor, according to some embodiments. Thermostat 1302 is shown mounted on a wall 2010. As mentioned, according to some embodiments, thermostat 1302 is a thermostat such as thermostat 602, shown and described herein. PIR sensor 1052 within the thermostat 1302 has a downwardly directed field of view as shown by the dashed-dotted arrows. An approaching user 2000 who may wish to imminently interact with the thermostat 1302 is also shown. In order to conserve power in its rechargeable battery, thermostat 1302 turns off or puts certain components to sleep, such as its head unit microprocessor, LCD display, etc. As described herein, it has been found that anticipating an approaching user greatly improves the user's interactive experience with the thermostat since the sleeping components can be woken up before the user actually touches the thermostat. In general, the longer it takes for the components to wake-up, the further away the distance d should be designed. However, there is a trade-off since having a larger distance d causes more "false alarms" in which the thermostat wakes when a user simply is walking past the thermostat. In designing the downward field of view of the second PIR sensor 1052, a cone or zone on the floor immediately in front of the wall-mounted thermostat should be considered. It has been found that downward tilting of the face of sensor 1052 by 15 degrees, as shown in FIG. 12E, is suitable given the internal structures and the view through the Fresnel lens 1010. Tilting the sensor 1052 has been found to reduce losses due to reflections (allowing more energy to reach the sensor 1052), as well as increase the amount of sensor area that can "see" through the Fresnel lens pattern 1210 on lens 1010. It has been found that the distance d should be about 1-2 meters, which typically allows for adequate time for the head unit microprocessor and LCD display to turn on (which takes less than 1 second) before the user touches the unit. A distance of between 1-2 meters has been found to provide suitable advanced warning for waking up the head unit, without causing too many false alarms (e.g. waking the head unit when someone just walks by). In particular, according to some embodiments a maximum view angle of 45 degrees for the sensor 1052 for an average wall mounting height of 1.5 meters has been found to be suitable for a distance d of 1.5 meters. Also shown in FIG. 20A is the vertical field of view of the larger PIR sensor 1050. It has been found for occupancy sensing purposes a vertical field of view from three degrees above horizontal to 13 degrees below horizontal (about 16 degrees total) is suitable. The field of view of sensor 1050 is shown as Zone A, and the field of view of the sensor 1052 is shown as Zone B.

In FIG. 20B is shown the horizontal fields of view of the PIR sensors, according to some embodiments. It has been found that horizontal field of view of about 170 degrees can be achieved and is suitable for these applications. A suitable range of the occupancy sensing PIR 1050 is about 10 meters, according to some embodiments, as shown in FIG. 20B.

Although the techniques for adjusting proximity thresholds have been thus far described with respect to a thermostat, according to some embodiments the described techniques can be used in a number of other devices, especially for devices that benefit from anticipating user interactions. Examples include: home alarm systems, hazard detection units; entryway interface devices, wall light switches, wall plug interfaces, appliances such as ovens, refrigerators, wall air conditioners, televisions, dishwashers, clothes washers and dryers, lights, stereos, some of which are shown in FIG. 1. According to some alternative embodiments, for example, one or more intelligent, multi-sensing, network-connected entryway interface devices 606 make use of the described techniques to adaptively distinguish a person who will ring the door bell or open the front door, from other sensor data such as people walking by the home (for example if the home is in a city, where the front door is close to the street). According to some other embodiments, the techniques described herein are used for adaptively distinguishing occupants who enter a particular room, hallway or garage, etc. who make use of a particular lighting fixture, from occupants who do not make use of a particular lighting fixture. For example a smart wall switch 608 may activate a reading light, and be "trained" via the techniques described herein, to automatically turn on when a user sits in a particular chair often used for reading. Other such examples include other types of lighting and entertainment equipment. According to another embodiment, a smart water heater can be activated when activity is detected that is associated with requiring hot water, such as showering, dishwashing and/or clothes washing.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A thermostat, comprising:
   a housing;
   a user interface including an electronic display having an active display mode and an inactive display mode, the active display mode generally requiring substantially more electrical power than said inactive display mode;
   a processing system disposed within the housing and coupled to the user interface, the processing system being configured to be in operative communication with one or more temperature sensors for determining an ambient air temperature, in operative communication with one or more input devices including said user interface for determining a setpoint temperature, and in still further operative communication with a heating, ventilation, and air conditioning (HVAC) system to control the HVAC system based at least in part on a comparison of the measured ambient temperature and the setpoint temperature value; and
   at least one sensor configured to detect a physical closeness of a user to the user interface of the thermostat, the at least one sensor being in operative communication with the processing system, the processing system being configured to cause the electronic display to be in the active display mode when a closeness threshold has been exceeded;

wherein said processing system is further configured to automatically adjust said closeness threshold based at least in part on a historical plurality of physical closeness events as detected by the at least one sensor.

2. The thermostat of claim 1, wherein said closeness threshold is automatically adjusted based on a tracked number of times that the electronic display was caused to be in the active display mode responsive to physical closeness events over a predetermined time interval, the closeness threshold being made more restrictive if said tracked number of times was greater than a predetermined activity threshold, whereby excessive entry of the electronic display into the active display mode responsive to sensed physical closeness events is reduced.

3. The thermostat of claim 1, wherein said closeness threshold is automatically adjusted based at least in part on a joint processing of (i) the historical plurality of physical closeness events as detected by the at least one sensor, and (ii) a historical plurality of user interface manipulation events in which the user has actually manipulated said user interface, wherein the closeness threshold is made less restrictive if there is a higher correlation between said physical closeness events and said manipulation events, and wherein the closeness threshold is made more restrictive if there is a lesser correlation between said physical closeness events and said manipulation events.

4. The thermostat of claim 1, wherein said at least one sensor comprises a first sensor and a second sensor, wherein the first sensor is configured to detect the physical closeness of the user to the user interface within a first distance, wherein the second sensor is configured to detect the physical closeness of the user to the user interface within a second distance, and wherein the first distance is greater than the second distance.

5. The thermostat of claim 4, wherein the first sensor comprises a Passive Infrared sensor (PIR) and the second sensor comprises an active proximity sensor that is configured to emit electromagnetic radiation and to receive reflections of said electromagnetic radiation.

6. The thermostat of claim 4, wherein the second sensor comprises a near-range PIR.

7. The thermostat of claim 1 wherein the processing system comprises a first processor and a second processor, wherein the first processor is configured to detect when the closeness threshold has been exceeded and to wake said second processor from a low-power mode in response to the closeness threshold being exceeded, wherein the second processor causes the electronic display to operate in the active mode.

8. A method for optimizing the operation of a user interface of a thermostat, the method comprising:

determining automatically, by a processing system, a closeness threshold based at least in part on a historical plurality of physical closeness events as detected by at least one sensor; the at least one sensor configured to detect a physical closeness of a user to a user interface of the thermostat, the at least one sensor being in operative communication with the processing system detecting a physical closeness of a user to a user interface of the thermostat using the at least one sensor;

determining, by the processing system, that the closeness threshold has been exceeded, the processing system being configured to be in operative communication with one or more temperature sensors for determining an ambient air temperature, in operative communication with one or more input devices including said user interface for determining a setpoint temperature, and in still further operative communication with a heating, ventilation, and air conditioning (HVAC) system to control the HVAC system based at least in part on a comparison of the measured ambient temperature and the setpoint temperature value;

causing, by the processing system, an electronic display to be in an active display mode when the closeness threshold has been exceeded, the user interface including the electronic display having the active display mode and an inactive display mode, the active display mode generally requiring substantially more electrical power than said inactive display mode.

9. The method of claim 8, wherein said closeness threshold is automatically adjusted based on a tracked number of times that the electronic display was caused to be in the active display mode responsive to physical closeness events over a predetermined time interval, the closeness threshold being made more restrictive if said tracked number of times was greater than a predetermined activity threshold, whereby excessive entry of the electronic display into the active display mode responsive to sensed physical closeness events is reduced.

10. The method of claim 8, wherein said closeness threshold is automatically adjusted based at least in part on a joint processing of (i) the historical plurality of physical closeness events as detected by the at least one sensor, and (ii) a historical plurality of user interface manipulation events in which the user has actually manipulated said user interface, wherein the closeness threshold is made less restrictive if there is a higher correlation between said physical closeness events and said manipulation events, and wherein the closeness threshold is made more restrictive if there is a lesser correlation between said physical closeness events and said manipulation events.

11. The method of claim 8, wherein said at least one sensor comprises a first sensor and a second sensor, wherein the first sensor is configured to detect the physical closeness of the user to the user interface within a first distance, wherein the second sensor is configured to detect the physical closeness of the user to the user interface within a second distance, and wherein the first distance is greater than the second distance.

12. The method of claim 11, wherein the first sensor comprises a Passive Infrared sensor (PIR) and the second sensor comprises an active proximity sensor that is configured to emit electromagnetic radiation and to receive reflections of said electromagnetic radiation.

13. The method of claim 11, wherein the second sensor comprises a near-range PIR.

14. The method of claim 8 wherein the processing system comprises a first processor and a second processor, wherein the first processor is configured to detect when the closeness threshold has been exceeded and to wake said second processor from a low-power mode in response to the closeness threshold being exceeded, wherein the second processor causes the electronic display to operate in the active mode.

15. A thermostat, comprising:
a user interface that is configured to operate in at least two different modes comprising:
a first mode, and
a second mode, wherein the user interface requires more power when operating in the first mode than in the second mode;

a plurality of sensors, including at least one sensor configured to detect a presence of a user within a proximity of the thermostat; and a first processing function that is configured to determine a proximity profile and to cause the user interface to be in the first mode when one or more of the plurality of sensors provides one or more responses to the first processing function that matches the proximity profile, wherein:

the proximity profile is determined using at least a history of responses from the plurality of sensors that are likely to coincide with times where one or more users intend to view the user interface.

16. The thermostat of claim 15 further comprising a power stealing circuit configured to supply a first power level, wherein the user interface requires a second power level when operating in the first mode, and wherein the second power level is greater than the first power level.

17. The thermostat of claim 15 wherein the proximity profile is adjusted based on a power level currently being supplied by a rechargeable battery, whereby the user interface is less likely to be caused to operate in the first mode in response to a physical closeness event.

18. The thermostat of claim 15 wherein the at least one sensor comprises a first sensor and a second sensor, wherein the first sensor is configured to detect a presence of a user within a first proximity comprising first distance, wherein the second sensor is configured to detect a presence of a user within a second proximity comprising a second distance, and wherein the first distance is greater than the second distance.

19. The thermostat of claim 15 wherein the processing function comprises a first processor and a second processor, wherein the first processor is configured to determine whether the one or more responses matches the proximity profile, and wherein the second processor is configured to cause the user interface to operate in the first mode.

20. The thermostat of claim 15 wherein the processing function is further configured to detect when a number of physical closeness events within a predetermined time interval exceed a predetermined activity threshold and adjust the proximity profile in response.

* * * * *